(12) United States Patent
Chung et al.

(10) Patent No.: US 10,868,210 B2
(45) Date of Patent: Dec. 15, 2020

(54) SOLAR CELL AND METHOD OF MANUFACTURING THE SAME

(71) Applicant: LG ELECTRONICS INC., Seoul (KR)

(72) Inventors: Indo Chung, Seoul (KR); Mihee Heo, Seoul (KR); Juhong Yang, Seoul (KR); Eunjoo Lee, Seoul (KR); Jeongbeom Nam, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 102 days.

(21) Appl. No.: 15/385,316

(22) Filed: Dec. 20, 2016

(65) Prior Publication Data

US 2017/0179325 A1      Jun. 22, 2017

(30) Foreign Application Priority Data

Dec. 21, 2015  (KR) .................. 10-2015-0183118
Feb. 3, 2016   (KR) .................. 10-2016-0013337
Nov. 16, 2016  (KR) .................. 10-2016-0152869

(51) Int. Cl.
*H01L 31/0368*     (2006.01)
*H01L 31/18*       (2006.01)
(Continued)

(52) U.S. Cl.
CPC .... *H01L 31/1872* (2013.01); *H01L 31/02167* (2013.01); *H01L 31/02363* (2013.01);
(Continued)

(58) Field of Classification Search
CPC ............... H01L 31/036; H01L 31/0368; H01L 31/03682; H01L 31/03685; H01L 31/0682
See application file for complete search history.

(56) References Cited

U.S. PATENT DOCUMENTS 5,397,400 A * 3/1995 Matsuno ........... H01L 31/02168
                                                136/256
5,403,771 A * 4/1995 Nishida ............... H01L 31/0745
                                                117/923

(Continued)

FOREIGN PATENT DOCUMENTS

CN         102239572 A       11/2011
CN         202307920 U        7/2012
(Continued)

*Primary Examiner* — Edward J. Schmiedel
(74) *Attorney, Agent, or Firm* — Birch, Stewart, Kolasch & Birch, LLP

(57) ABSTRACT

Disclosed is a solar cell including a semiconductor substrate, a protective-film layer on a surface of the semiconductor substrate, a polycrystalline semiconductor layer over the protective-film layer, a first conductive area formed by selectively doping the semiconductor layer with a first conductive dopant, a second conductive area doped with a second conductive dopant and located between neighboring portions of the first conductive area, an undoped barrier area located between the first conductive area and the second conductive area, a first electrode connected to the first conductive area, and a second electrode connected to the second conductive area. Each of the first conductive area and the second conductive area includes a second crystalline area having a crystalline structure different from that of the barrier area, and the second crystalline areas of the first and second conductive areas include a second polycrystalline area and a fourth crystalline area having different depths.

17 Claims, 44 Drawing Sheets

(51) Int. Cl.
*H01L 31/0216* (2014.01)
*H01L 31/0224* (2006.01)
*H01L 31/0236* (2006.01)
*H01L 31/068* (2012.01)

(52) U.S. Cl.
CPC .. *H01L 31/022441* (2013.01); *H01L 31/0368* (2013.01); *H01L 31/0682* (2013.01); *Y02E 10/547* (2013.01); *Y02P 70/521* (2015.11)

(56) References Cited

U.S. PATENT DOCUMENTS

| | | | | |
|---|---|---|---|---|
| 6,043,427 | A | * | 3/2000 | Nishimoto ........ H01L 31/03685 136/258 |
| 2001/0035206 | A1 | * | 11/2001 | Inamasu ............. H01L 31/0392 136/255 |
| 2001/0051388 | A1 | * | 12/2001 | Shiozaki ............. H01L 21/0237 438/57 |
| 2003/0127127 | A1 | * | 7/2003 | Inamasu ............. H01L 31/0392 136/255 |
| 2006/0024870 | A1 | * | 2/2006 | Wang ................ H01L 31/03682 438/166 |
| 2008/0107799 | A1 | * | 5/2008 | Lu ................... H01L 31/022425 427/74 |
| 2012/0167966 | A1 | * | 7/2012 | Hu .................... H01L 31/03685 136/255 |
| 2015/0287849 | A1 | | 10/2015 | Kim et al. |

FOREIGN PATENT DOCUMENTS

| | | |
|---|---|---|
| CN | 102640300 A | 8/2012 |
| EP | 2 922 098 A1 | 9/2015 |
| JP | 2008-21993 A | 1/2008 |
| JP | 2012-511258 A | 5/2012 |
| JP | 2013-512582 A | 4/2013 |
| JP | 2015-142139 A | 8/2015 |
| KR | 10-2010-0057424 A | 5/2010 |
| KR | 10-2015-0084305 A | 7/2015 |

* cited by examiner (a)　　　　　　　　　　　　　　(b)

(a)

(b)

(c)

(d)

(a)

(b)

SOLAR CELL AND METHOD OF MANUFACTURING THE SAME

CROSS-REFERENCE TO RELATED APPLICATION

This application claims the priority benefit of Korean Patent Applications No. 10-2015-0183118, filed on Dec. 21, 2015, No. 10-2016-0013337, filed on Feb. 3, 2016, and No. 10-2016-0152869, filed on Nov. 16, 2016 in the Korean Intellectual Property Office, the disclosures of which are all incorporated herein by reference.

BACKGROUND OF THE INVENTION

Field of the Invention

The present invention relates to a back-surface electrode type solar cell in which all electrodes are provided on the back surface, and a method of manufacturing the same.

Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy. Solar cells may be manufactured by forming various layers and electrodes based on some design. The efficiency of solar cells may be determined by the design of the various layers and electrodes. In order for solar cells to be commercialized, the problem of low efficiency and low productivity needs to be overcome, and thus, there is a demand for a solar cell and a method of manufacturing the same, which may maximize the efficiency and productivity of the solar cell.

SUMMARY OF THE INVENTION

According to an aspect of the present invention, a solar cell includes a semiconductor substrate, a protective-film layer formed on a surface of the semiconductor substrate, a polycrystalline semiconductor layer formed over the protective-film layer, a first conductive area formed by selectively doping the semiconductor layer with a first conductive dopant, a second conductive area doped with a second conductive dopant and located between neighboring portions of the first conductive area, a barrier area located between the first conductive area and the second conductive area and doped with no dopant, a first electrode connected to the first conductive area, and a second electrode connected to the second conductive area. Each of the first conductive area and the second conductive area includes a second crystalline area having a crystalline structure different from that of the barrier area, and the second crystalline areas of the first conductive area and the second conductive area include a second polycrystalline area and a fourth crystalline area having different depths.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
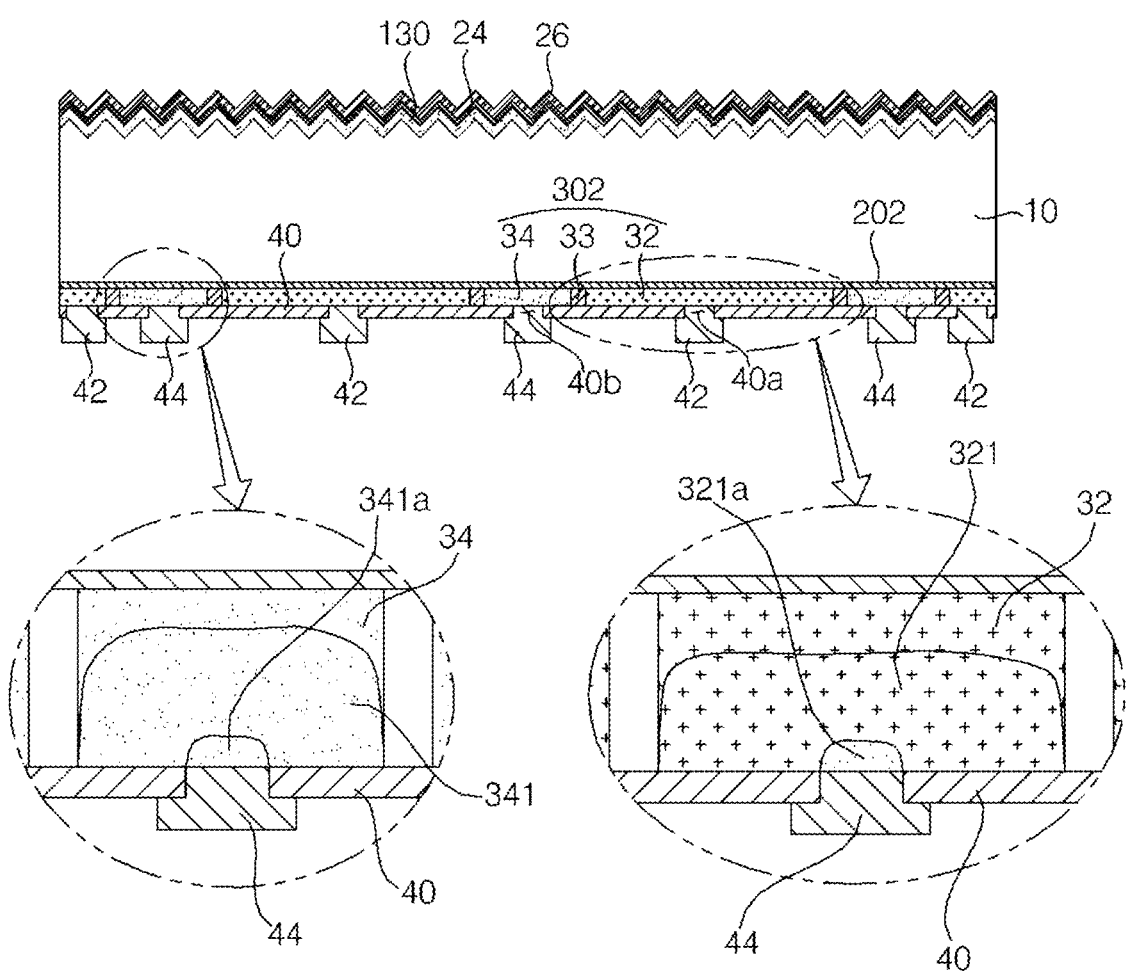
FIG. 1 is a cross-sectional view illustrating a solar cell according to an embodiment of the present invention.

Reference will now be made in detail to the embodiments of the present invention, examples of which are illustrated in the accompanying drawings. However, it will be understood that the present invention should not be limited to the embodiments and may be modified in various ways.

In the drawings, to clearly and briefly explain the present invention, illustration of elements having no connection with the description is omitted, and the same or extremely similar elements are designated by the same reference numerals throughout the specification. In addition, in the drawings, for more clear explanation, the configuration, thickness, width, and the like of layers are exaggerated, reduced, or omitted, and the thickness, width, and the like of the present invention are not limited to the illustration of the drawings.

Hereinafter, a method of manufacturing a solar cell and a solar cell, which may be formed by the method, according to an embodiment of the present invention will be described in detail with reference to the accompanying drawings. An example of the solar cell, which is manufactured by the method of manufacturing the solar cell according to the embodiment of the present invention, will first be described, and thereafter, the method of manufacturing the solar cell according to the embodiment of the present invention will be described.

Figure 2:
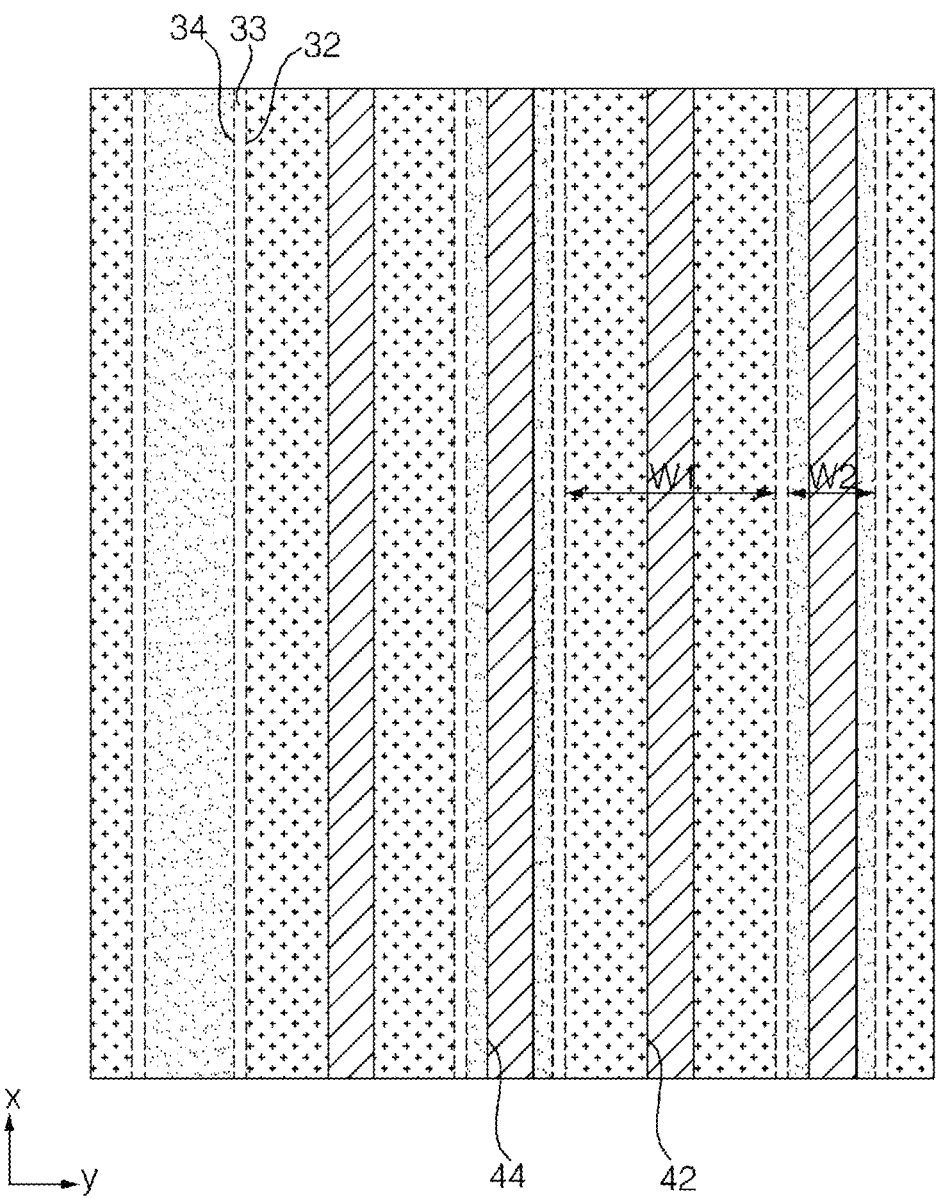
FIG. 2 is a plan view illustrating the back surface of the solar cell illustrated in FIG. 1.

FIG. 1 is a cross-sectional view illustrating an example of the solar cell according to some embodiments of the present invention, and FIG. 2 is a partial rear plan view of the solar cell illustrated in FIG. 1.

Referring to FIGS. 1 and 2, the solar cell 100 according to the present embodiment includes a semiconductor substrate 10, a protective-film layer 20, which is formed on the surface of the semiconductor substrate 10, a first conductive area 32 and a second conductive area 34, which are located over the protective-film layer 20, are formed of a polycrystalline semiconductor, and form a pn junction with the semiconductor substrate 10, and a first electrode 42 and a second electrode 44, which are respectively in contact with the first conductive area 32 and the second conductive area 34.

In addition, the first conductive area 32 includes a second polycrystalline area 321, which has a crystalline structure different from that of the remaining area of the first conductive area 32, and the second conductive area 34 includes a fourth polycrystalline area 341, which has substantially the same crystalline structure as the second polycrystalline area 321. In addition, each of the second polycrystalline area 321 and the fourth polycrystalline area 341 further includes a third crystalline area 321a or 341a, which is in contact with the first electrode 42 or the second electrode 44.

In addition, the solar cell 100 may further include a front-surface field area 130, an insulation film 24, and an anti-reflection film 26, which are provided on the front surface of the semiconductor substrate 10.

The semiconductor substrate 10 is formed of a crystalline semiconductor that is doped with a first conductive dopant at a low concentration. In one example, the semiconductor substrate 10 is formed of a monocrystalline or polycrystalline semiconductor. A monocrystalline semiconductor has high crystallinity and thus few defects, and the electrical properties thereof are superior to those of a polycrystalline semiconductor.

A first conductive type is any one of a p-type and an n-type. In an example form, when the semiconductor substrate 10 is of an n-type, the first conductive area 32, which is of a p-type and forms a pn junction for forming carriers via photoelectric conversion, may be widely formed in order to increase a photoelectric conversion area. In addition, in this instance, the first conductive area 32 having a wide area may effectively collect holes, which move relatively slowly, thereby contributing to an increase in photoelectric conversion efficiency.

In addition, the semiconductor substrate 10 includes the front-surface field area 130 located on the front surface (i.e. light incident surface) of the semiconductor substrate 10. The front-surface field area 130 is of the same conductive type as the semiconductor substrate 10 and has a higher doping concentration than the semiconductor substrate 10.

In an example form, the front-surface field area 130 is a doped area formed by doping the semiconductor substrate 10 with the first conductive dopant at a higher doping concentration than that of the semiconductor substrate 10, and the doping concentration of the front-surface field area 130 is lower than the doping concentration of the second conductive area 34, which is of the same conductive type as the front-surface field area 130.

Because the front-surface field area 130 functions to prevent carriers from moving to the front surface of the semiconductor substrate 10, the doping concentration of the front-surface field area 130 may be lower than the doping concentration of the second conductive area 34. In one example, the doping concentration of the front-surface field area 130 may range from $1 \times 10^{17}/cm^3$ to $1 \times 10^{20}/cm^3$, and the doping concentration of the second conductive area 34 may range from $1 \times 10^{20}/cm^3$ to $1 \times 10^{22}/cm^3$.

In addition, a dopant included in the second conductive area 34 is of the first conductive type, which is the same as that of the first conductive dopant included in the front-surface field area 130. In an example form, the first conductive dopant included in the second conductive area 34 and the first conductive dopant included in the front-surface field area 130 are the same material.

The front surface of the semiconductor substrate 10 is provided with a textured structure in the form of, for example, pyramids, which increases the penetration of light into the semiconductor substrate 10. The form of the textured structure varies based on the crystalline structure of the semiconductor substrate 10. A monocrystalline structure has a consistent crystalline direction, and thus has even convex-concave portions, whereas a polycrystalline structure has an inconsistent crystalline direction, and thus has uneven convex-concave portions.

In addition, the back surface of the semiconductor substrate 10 may be formed via, for example, mirror surface grinding, and thus may be a relatively smooth flat surface, which has smaller surface roughness than the front surface. In the instance where the first and second conductive areas 32 and 34 are formed together on the back surface of the semiconductor substrate 10 as in the present embodiment, the properties of the back surface of the semiconductor substrate 10 may have a great effect on the properties of the solar cell 100. Therefore, the back surface of the semiconductor substrate 10 may have no convex-concave portions formed via texturing, in order to achieve an improved passivation property.

The protective-film layer 20 is formed on the surface of the semiconductor substrate 10. The protective-film layer 20 may be formed to be brought into contact with the surface of the semiconductor substrate 10, and thus may exhibit a simplified structure and improved tunneling effects.

The protective-film layer 20 may serve as a barrier for electrons and holes so as to prevent minority carriers from passing therethrough and to allow only majority carriers, which accumulate at a portion adjacent to the protective-film layer 20 and thus have a given amount of energy or more, to pass therethrough. At this time, the majority carriers, which have the given amount of energy or more, may easily pass through the protective-film layer 20 owing to tunneling effects.

In addition, the protective-film layer 20 may serve as a diffusion barrier for preventing the dopants of the conductive areas 32 and 34 from diffusing into the semiconductor substrate 10. The protective-film layer 20 may be formed of any of various materials to enable the tunneling of the majority carriers. In one example, the protective-film layer 20 may be formed of an oxide, a nitride, a semiconductor, or a conductive polymer. For example, the protective-film layer 20 may be formed of a silicon oxide, a silicon nitride, a silicon oxide nitride, intrinsic amorphous silicon, or intrinsic polycrystalline silicon. In an example form, the protective-film layer 20 may be formed of a silicon oxide. A silicon oxide has an excellent passivation property and ensures easy tunneling of carriers.

The thickness of the protective-film layer 20 may be 5 nm or less, and more specifically, may range from 0.5 nm to 2 nm. When the thickness of the protective-film layer 20 exceeds 5 nm, smooth tunneling does not occur, and consequently, the solar cell 100 may not operate. When the thickness of the protective-film layer 20 is below 0.5 nm, it may be difficult to form the protective-film layer 20 having a desired quality. In order to further improve tunneling effects, the thickness of the protective-film layer 20 may range from 0.5 nm to 2 nm.

A polycrystalline semiconductor layer 30, which has a crystalline structure different from that of the semiconductor substrate 10, is formed over the protective-film layer 20. The semiconductor layer 30 includes the first conductive area 32 and the second conductive area 34 in the same layer. The first conductive area 32 is doped with the second conductive dopant at a high concentration, and the second conductive area 34 is doped with the first conductive dopant, which is of the same conductive type as that of the dopant included in the semiconductor substrate 10, at a high concentration. In this instance, when the first conductive dopant is of a p-type, it may be a group-III element, such as boron (B), aluminum (Al), gallium (Ga), or indium (In). When the first conductive dopant is of an n-type, it may be a group-V element, such as phosphorus (P), arsenic (As), bismuth (Bi), or antimony (Sb). In addition, the second conductive dopant and the first conductive dopant are of opposite conductive types.

That is, the first conductive area 32 may be a p-type conductive area and the second conductive area may be an n-type conductive area. In contrast, the first conductive area 32 may be an n-type conductive area and the second conductive area may be a p-type conductive area.

The first conductive area 32 configures an emitter area, which forms a pn junction with the semiconductor substrate 10 with the protective-film layer 20 interposed therebetween so as to produce carriers via photoelectric conversion. The second conductive area 34 configures a back-surface field area, which forms a back-surface field so as to prevent the loss of carriers due to recombination on the surface of the semiconductor substrate 10.

In addition, a barrier area 33 may be located between the first conductive area 32 and the second conductive area 34 so that the first conductive area 32 and the second conductive area 34 are spaced apart from each other. When the first conductive area 32 and the second conductive area 34 are in contact with each other, shunts may occur, undesirably causing deterioration in the performance of the solar cell 100. Therefore, unnecessary or undesired shunts may be prevented when the barrier area 33 is located between the first conductive area 32 and the second conductive area 34.

The barrier area 33 may be formed of any of various materials, which may substantially insulate the first conductive area 32 and the second conductive area 34 from each other. In an example form, the barrier area 33 may be formed of an undoped insulation material, and more specifically, an intrinsic semiconductor that is not doped with a foreign substance (i.e. a dopant).

In addition, when the semiconductor substrate 10 is of an n-type, it forms a pn junction with the first conductive area 32, and the first conductive area 32 forms an emitter. In this instance, the area of the first conductive area 32 may be greater than the area of the second conductive area 34.

When the semiconductor substrate 10 and the second conductive area 34 are of an n-type conductive type and the first conductive area 32 is of a p-type conductive type, the wide first conductive area 32 may serve to collect holes. Because holes have longer lifetimes than electrons, the first conductive area 32 may effectively collect holes.

In an example form, the first conductive area 32 and the second conductive area 34 may have different thicknesses. Because the first conductive area 32 and the second conductive area 34 are formed using different methods in different operations as will be described below, the first conductive area 32 and the second conductive area 34 may have different heights.

The first conductive area 32 may include the second polycrystalline area 321. The second polycrystalline area 321 has a crystalline structure different from that of the remaining area of the first conductive area 32. In the process of forming the first conductive area 32, a semiconductor layer 302 is melted and re-crystallized, thereby forming the second polycrystalline area 321.

Specifically, the first conductive area 32 may include a first polycrystalline area and the second polycrystalline area 321. The first polycrystalline area has a first grain size and is formed between the protective-film layer 20 and the second polycrystalline area 321 so as to be brought into contact with the protective-film layer 20. The second polycrystalline area 321 is formed on the first polycrystalline area and has a second grain size greater than the first grain size.

In the present embodiment, the first polycrystalline area may be an area of the first conductive area 32 in which no re-crystallization occurs, and the first grain size may be the same as the grain size of the semiconductor layer 302.

That is, the grains in the second polycrystalline area 321 are larger than the grains in the semiconductor layer 302, and have a denser arrangement. In addition, the ratio of the cross-sectional area of the second polycrystalline area 321 to the cross-sectional area of the first conductive area 32 may be 0.5:1 or more, and the ratio of the depth of the second polycrystalline area 321 to the thickness of the semiconductor layer 302 may be greater than 0.5:1, but less than 1:1.

The second conductive area 34 may include the fourth polycrystalline area 341. The fourth polycrystalline area 341 has a crystalline structure different from that of the remaining area of the second conductive area 34. In the process of forming the second conductive area 34, the semiconductor layer 302 is melted and re-crystallized, thereby forming the fourth polycrystalline area 341.

Specifically, the second conductive area 34 may include a third polycrystalline area and the fourth polycrystalline area 341. The third polycrystalline area has the first grain size and is formed between the protective-film layer 20 and the fourth polycrystalline area 341 so as to be brought into contact with the protective-film layer 20. The fourth polycrystalline area 341 is formed on the third polycrystalline area and has the second grain size greater than the first grain size.

In the present embodiment, the third polycrystalline area may be an area of the second conductive area 34 in which no re-crystallization occurs, and the first grain size may be the same as the grain size of the semiconductor layer 302.

In addition, in the present embodiment, the first polycrystalline area and the third polycrystalline area, which have the same first grain size, may respectively or collectively be referred to as a first crystalline area, and the second polycrystalline area 321 and the fourth polycrystalline area 341, which have the same second grain size, may respectively or collectively be referred to as a second crystalline area 321 or 341. A fifth polycrystalline area 321a and a sixth polycrystalline area 341a, which have the same third grain size as will be described below, may respectively or collectively be referred to as the third crystalline area 321a or 341a.

The grains in the fourth polycrystalline area 341 are substantially the same as the grains in the second polycrystalline area 321. The ratio of the cross-sectional area of the fourth polycrystalline area 341 to the cross-sectional area of the second conductive area 34 may be greater than the ratio of the cross-sectional area of the second polycrystalline area 321 to that of the first conductive area 32.

In addition, the second crystalline areas 321 and 341 may respectively include the third crystalline areas 321a and 341a. The crystalline structure of the third crystalline areas 321a and 341a may differ from the crystalline structure of the second crystalline areas 321 and 341.

The third crystalline areas 321a and 341a are formed in the process of bringing the first electrode 42 and the second electrode 44 into contact with the first conductive area 32 and the second conductive area 34. Specifically, the third crystalline areas 321a and 341a may be formed when the interfaces of the second crystalline areas 321 and 341, which are in contact with the first electrode 42 and the second electrode 44, are re-crystallized. The third crystalline areas 321a and 341a have the third grain size, which is smaller than the first grain size and the second grain size. This will be described below in detail.

An insulation film 40 is formed over the semiconductor layer 30. The insulation film 40 has a first opening 40a for connection between the first conductive area 32 and the first electrode 42, and a second opening 40b for connection between the second conductive area 34 and the second electrode 44. The insulation film 40 functions to passivate the semiconductor layer 30.

The insulation film 40 may be formed of a single film or multiple films in the form of a combination of two or more films selected from the group consisting of a silicon nitride film, a silicon nitride film containing hydrogen, a silicon oxide film, a silicon oxide nitride film, a silicon carbide film, and $Al_2O_3$, $MgF_2$, ZnS, $TiO_2$, and $CeO_2$ films.

The electrodes 42 and 44, disposed on the back surface of the semiconductor substrate 10, include the first electrode 42, which is in contact with the first conductive area 32, and the second electrode 44, which is in contact with the second conductive area 34.

The first electrode 42 is brought into contact with the first conductive area 32 through the first opening 40a, and the second electrode 44 is brought into contact with the second conductive area 34 through the second opening 40b. The first and second electrodes 42 and 44 may be formed of any of various metal materials, and may have a multilayered structure including two or more layers. In addition, the first and second electrodes 42 and 44 may have any of various plan shapes in order to collect and outwardly transfer carriers by being connected respectively to the first conductive area 32 and the second conductive area 34 while not being electrically connected to each other. Moreover, each of the first and second electrodes 42 and 44 may have a protrusion configured to protrude into the first opening 40a or the second opening 40b.

In addition, the front insulation film 24 and the anti-reflection film 26 are selectively disposed over the front-surface field area 130 on the front surface of the semiconductor substrate 10. That is, in some embodiments, only the front insulation film 24 may be formed over the semiconductor substrate 10, only the anti-reflection film 26 may be formed over the semiconductor substrate 10, or the front insulation film 24 and the anti-reflection film 26 may be sequentially disposed over the semiconductor substrate 10.

The front insulation film 24 and the anti-reflection film 26 may substantially be formed on the entire front surface of the semiconductor substrate 10.

The front insulation film 24 is formed so as to be brought into contact with the surface of the semiconductor substrate 10 for the passivation of defects, which exist in the surface or the bulk of the semiconductor substrate 10. As such, the front insulation film 24 may increase the open-circuit voltage of the solar cell 150 by removing recombination sites of the minority carriers. The anti-reflection film 26 reduces the reflectance of light introduced into the front surface of the semiconductor substrate 10. Thus, the anti-reflection film 26 may increase the quantity of light, which reaches a pn junction formed at the interface of the semiconductor substrate 10 and the first conductive area 32. Thereby, the anti-reflection film 26 may increase the short-circuit current Isc of the solar cell 100. Thereby, the front insulation film 24 and the anti-reflection film 26 may increase the open-circuit voltage and the short-circuit current of the solar cell 100, thereby improving the efficiency of the solar cell 100.

Each of the front insulation film 24 and the anti-reflection film 26 may include a single film or multiple films in the form of a combination of two or more films selected from the group consisting of a silicon nitride film, a silicon nitride film containing hydrogen, a silicon oxide film, a silicon oxide nitride film, an aluminum oxide film, a silicon carbide film, and $MgF_2$, ZnS, $TiO_2$, and $CeO_2$ films.

When light is introduced into the solar cell 100 having the above-described structure according to the present embodiment, electrons and holes are produced via photoelectric conversion at a pn junction formed between the semiconductor substrate 10 and the first conductive area 32, and the produced electrons and holes move to the first conductive area 32 and the second conductive area 34 via tunneling through the protective-film layer 20, and thereafter move to the first and second electrodes 42 and 44. Thereby, electricity is generated.

In the solar cell 100 having a back-surface electrode structure in which the electrodes 42 and 44 are formed on the back surface of the semiconductor substrate 10 and no electrode is formed on the front surface of the semiconductor substrate 10, shading loss may be minimized on the front surface of the semiconductor substrate 10. Thus, the efficiency of the solar cell 100 may be improved.

The first and second conductive areas 32 and 34 are formed over the semiconductor substrate 10 with the protective-film layer 20 interposed therebetween, and thus are formed separately from the semiconductor substrate 10. As such, loss due to recombination may be less than that when a doped area formed by doping an area of the semiconductor substrate 10 with a dopant is used as a conductive area.

Meanwhile, as illustrated in FIG. 2, a plurality of first conductive areas 32 and a plurality of second conductive areas 34 are formed to extend a long length in a given direction, and are arranged side by side. In addition, the first conductive areas 32 and the second conductive areas 34 are alternately arranged. The barrier area 33 may be located between the first conductive area 32 and the second conductive area 34 so that the first conductive area 32 and the second conductive area 34 are spaced apart from each other by the barrier area 33.

In an example form, the area of the first conductive area 32 may be greater than the area of the second conductive area 34, as illustrated in FIG. 2. In one example, the areas of the first conductive area 32 and the second conductive area 34 may be adjusted by providing the first conductive area 32 and the second conductive area 34 with different widths. In this instance, the width W1 of the first conductive area 32 is greater than the width W2 of the second conductive area 34.

In addition, the first electrode 42 is formed in a stripe shape over the first conductive area 32, and the second electrode 44 is formed in a stripe shape over the second conductive area 34.

Hereinafter, a method of manufacturing the solar cell having the above-described configuration will be described in detail with reference to the accompanying drawings.

Figure 3:
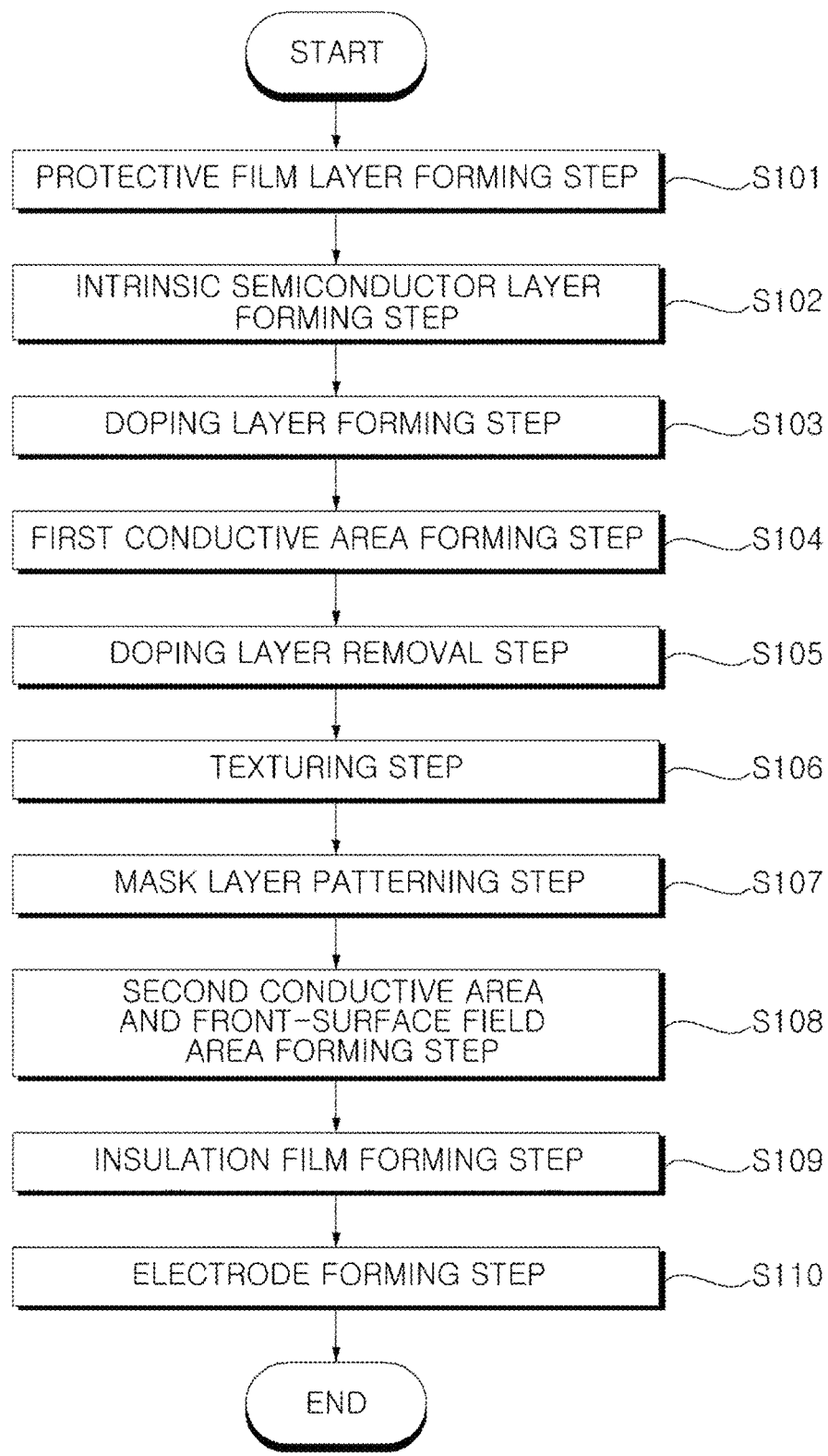
FIG. 3 is a flowchart illustrating a method of manufacturing a solar cell according to an embodiment of the present invention.

First, FIG. 3 is a flowchart illustrating the method of manufacturing the solar cell according to an embodiment of the present invention.

The method of manufacturing the solar cell according to the embodiment includes, in temporal sequence, a protective-film layer forming operation S101, an intrinsic semiconductor layer forming operation S102, a doping layer forming operation S103, a first conductive area forming operation S104, a doping layer removal operation S105, a texturing operation S106, a mask layer patterning operation S107, a second conductive area/front-surface field area forming operation S108, an insulation film forming operation S109, and an electrode forming operation S110.

The respective operations of FIG. 3 will be described below in detail with reference to FIGS. 4A to 4M. FIGS. 4A to 4M are views diagrammatically illustrating the respective operations of FIG. 3. The second crystalline area and the third crystalline area are illustrated only in the drawings of the corresponding description, and are omitted in the other drawings.

Figure 4A:
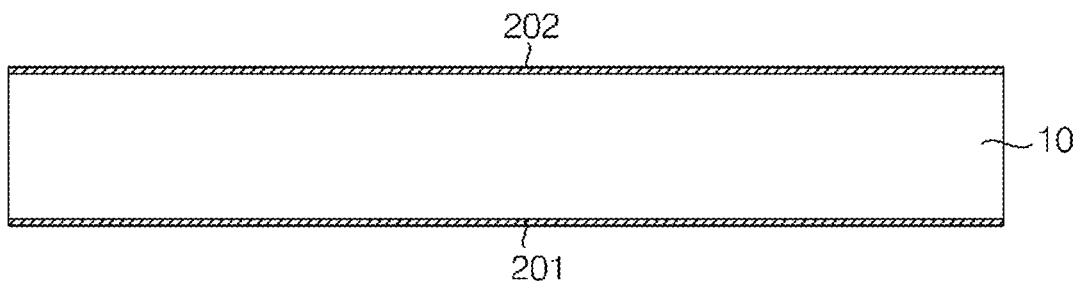
FIGS. 4A to 4M are views diagrammatically illustrating respective operations of FIG. 3.

First, in the protective-film layer forming operation S101, protective-film layers 201 and 202 are formed respectively on both surfaces, i.e. the front surface and the back surface, of the semiconductor substrate 10. The protective-film layers include a front protective-film layer 201 disposed on the front surface of the semiconductor substrate 10, and a back protective-film layer 202 disposed on the back surface of the semiconductor substrate 10. FIG. 4A diagrammatically illustrates the protective-film layer forming operation S101. For reference, for convenience of description, in FIGS. 4A to 4M, the front surface of the semiconductor substrate 10 is illustrated as facing downward.

The semiconductor substrate 10 is formed of a silicon crystal growth semiconductor having a monocrystalline or polycrystalline structure, and contains any one of the first conductive dopant and the second conductive dopant, which are of opposite conductive types. In one example, the first conductive dopant is an n-type dopant, for example, a group-V element, such as phosphorus (P), arsenic (As), bismuth (Bi), or antimony (Sb), and the second conductive dopant is a p-type dopant, for example, a group-III element, such as boron (B), aluminum (Al), gallium (Ga), or indium (In).

In an example form, the semiconductor substrate 10 has a monocrystalline structure in which grains are grown only in a given direction, and contains an n-type dopant. As such, in the semiconductor substrate 10, holes, which have longer lifetimes than electrons, form majority carriers to facilitate photoelectric conversion at a pn junction surface.

In an example form, the protective-film layers 201 and 202 are configured as oxide layers including a thermal oxide and a silicon oxide, and have a thickness of 5 nm or less, more specifically, a thickness within a range from 0.5 nm to 2 nm. The protective-film layers 201 and 202 reduce recombination sites corresponding to a pn junction surface, and therefore function to enable effective passivation.

When the thickness of the protective-film layers 201 and 202 exceeds 5 nm, the probability of tunneling of carriers is reduced, causing a reduction in the efficiency of the solar cell 100. When the thickness of the protective-film layers 201 and 202 is below 0.5 nm, the protective-film layers 201 and 202 may not perform a passivation function, causing a reduction in the efficiency of the solar cell 100.

In an example form, the protective-film layers 201 and 202 may be formed via a Chemical Vapor Deposition (CVD) method, and source gas may include only oxygen gas, or may include oxygen gas and silane gas ($SiH_4$).

When the source gas includes only oxygen gas, the protective-film layers 201 and 202 are formed of a thermal oxide SiOx, which is made via a chemical reaction between oxygen ions decomposed from the source gas and the surface of the semiconductor substrate 10.

Differently, when the source gas includes oxygen gas and silane gas ($SiH_4$), the protective-film layers 201 and 202 are formed of an oxide (e.g. a silicon oxide (SiOx)), which is made via a chemical reaction between oxygen ions decomposed from the source gas and silicon ions decomposed from the silane gas and the surface of the semiconductor substrate 10.

The source gas may further include nitrogen gas and chlorine gas, in addition to oxygen gas and silane gas. Among these, chlorine gas enables adjustment in the purity of the protective-film layers 201 and 202, and nitrogen gas enables adjustment in the film growth rate and uniformity of the protective-film layers 201 and 202.

Because chlorine gas may increase the growth rate of the protective-film layers 201 and 202, the amount of chlorine gas may be less than the amount of oxygen gas. In one example, the volume ratio of oxygen gas to chlorine gas may range from 1:0.05 to 1:0.1.

When the ratio is below 1:0.05, the increase in purity attributable to chlorine gas may be insufficient. When the ratio exceeds 1:0.1, a greater amount of chlorine gas than a required amount may be included, which may deteriorate the purity of the protective-film layers 201 and 202 and may increase the growth rate of the protective-film layers 201 and 202, resulting in an increase in the thickness of the protective-film layers 201 and 202.

The amount of nitrogen gas is adjusted in consideration of the size of a chamber in which the protective-film layers 201 and 202 are formed, and the total amount of oxygen gas, chlorine gas and nitrogen gas is adjusted to achieve a required pressure in consideration of processing conditions.

Meanwhile, when the protective-film layers 201 and 202 are formed at a high temperature through a thermal oxidation process, rapid growth of an oxide may make it difficult for the protective-film layers 201 and 202 to be formed to a desired thickness.

Therefore, in an example form, in the protective-film layer forming operation S101, the protective-film layers 201 and 202 are formed at a temperature lower than room temperature. As such, the growth rate of the protective-film layers 201 and 202 may be controlled so that the protective-film layers 201 and 202 are formed to a small thickness.

In an example form, the protective-film layers 201 and 202 may be formed at a temperature of 600° C. or more and at a pressure of 2 Torr or less. In this instance, "pressure" is the actual pressure inside the chamber.

When the protective-film layers 201 and 202 are formed at a temperature of 600° C. or more, the protective-film layers 201 and 202 may have an increased density and a reduced interface trap density Dit, which may improve a passivation property of the protective-film layers 201 and 202. In addition, the protective-film layers 201 and 202 may be formed at a temperature similar to that of the semiconductor layer 30, which will be formed after the formation of the protective-film layers 201 and 202. Thus, the protective-film layers 201 and 202 and semiconductor layers 301 and 302 may be formed in successive processes.

When the pressure is maintained at 2 Torr or less, the protective-film layers 201 and 202 may maintain a low growth rate due to the low pressure, and thus may be easily formed to a desired thickness, even if the protective-film layers 201 and 202 are formed at a high temperature through a thermal oxidation process.

In an example form, the protective-film layers 201 and 202 may be formed at a temperature within a range from 600° C. to 800° C. and at a pressure within a range from 0.01 Torr to 2 Torr. When the protective-film layers 201 and 202 are formed at a temperature above 800° C., it is difficult to control the growth rate of an oxide even when the pressure is reduced, and change in the thickness of the oxide may increase.

In order to more effectively control the thickness of the protective-film layers 201 and 202, the protective-film layers 201 and 202 may be formed at a temperature within a range from 600° C. to 700° C.

In addition, when the protective-film layers 201 and 202 are formed at a pressure below 0.1 Torr, cost and the like may increase, and load may be applied to an apparatus for manufacturing the protective-film layers 201 and 202. Thus, the pressure may range from 0.5 Torr to 2 Torr.

In an example form, the thickness of the protective-film layers 201 and 202 may range from 0.5 nm to 2 nm. In order to uniformly form the protective-film layers 201 and 202 to this thickness, the process of forming the protective-film layers 201 and 202 may be performed for a time within a range from 10 minutes to 20 minutes.

Meanwhile, in the related art, to date, a film has been formed to a thickness above 2 nm in order to prevent tunneling. However, in the present invention, an oxide layer is formed, between pn junction surfaces, to a thickness at which tunneling occurs.

In addition, in the related art, to date, forming a thin protective-film layer by adjusting the temperature and the pressure when the protective-film layer is formed via a deposition method has not been known. Therefore, such a protective-film layer has been formed via a method that has generally been used in, for example, the semiconductor field, such as, for example, wet oxidation, or thermal oxidation in an atmospheric furnace. As such, it has been impossible to uniformly form a thin protective-film layer so as to achieve efficient tunneling.

On the other hand, as described above, in the present invention, the protective-film layers 201 and 202 are formed through a thermal oxidation process that is performed at a high temperature, and the rate of thermal oxidation is adjusted at a pressure lower than atmospheric pressure, unlike in the related art. Thus, the protective-film layers 201 and 202 may be uniformly formed to a small thickness at which efficient tunneling may be achieved.

In this operation S101, because the protective-film layers 201 and 202 are formed at a low pressure, the protective-film layers 201 and 202 may be formed via a Low Pressure Chemical Vapor Deposition (LPCVD) method.

In the LPCVD method, protective films are formed respectively on both surfaces, i.e. the front surface and the back surface, of the semiconductor substrate 10. Thus, the first protective-film layer 201 disposed on the front surface of the semiconductor substrate 10 and the second protective-film layer 202 disposed on the back surface of the semiconductor substrate 10 are formed in operation S101.

Meanwhile, in a subsequent process, semiconductor layers are formed over the protective-film layers 201 and 202. Because the semiconductor layers may also be formed via an LPCVD method, two layers may be successively formed using the same deposition facility, which enables an in-situ process. When the protective-film layers 201 and 202 and the semiconductor layers 301 and 302 are formed in an in-situ process, the manufacturing process may be greatly simplified, which may greatly reduce, for example, manufacturing costs and manufacturing time.

In addition, when all of the protective-film layers 201 and 202 and the semiconductor layers 301 and 302 are formed via an LPCVD method, the difference in temperature between the two processes may be adjusted to 100° C. or less. When temperatures, the adjustment of which is relatively difficult, are maintained without great variation as described above, the in-situ process of successively forming the protective-film layers 201 and 202 and the semiconductor layers 301 and 302 may be facilitated.

Figure 4B:
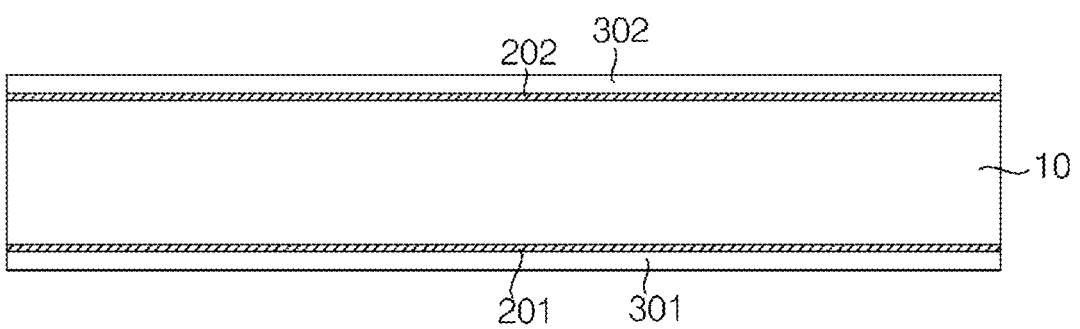

Subsequently, in the intrinsic semiconductor layer forming operation S102 following the protective-film layer forming operation S101, the intrinsic semiconductor layers 301 and 302, which are of a crystalline type and are not doped with a dopant, are formed respectively over the first protective-film layer 201 and the second protective-film layer 202. FIG. 4B diagrammatically illustrates the intrinsic semiconductor layer forming operation S102.

As such, the intrinsic semiconductor layers include a first intrinsic semiconductor layer 301 disposed over the first protective-film layer 201, and a second intrinsic semiconductor layer 302 disposed over the second protective-film layer 202. The thickness of each of the semiconductor layers may range from 300 nm to 400 nm. When the thickness is below 300 nm, a foreign substance may be doped to the second protective-film layer 202 in the subsequent first conductive area forming operation S104. When the thickness is above 400 nm, a foreign substance may be doped on only a portion of the second intrinsic semiconductor layer 302 in a thickness direction, rather than being doped on the entire second intrinsic semiconductor layer 302.

In an example form, in operation S102, the intrinsic semiconductor layers 301 and 302 are formed via an LPCVD method, in order to enable an in-situ process in connection with the previous operation S101.

When operation S101 and operation S102 are performed via the same LPCVD method, the processes of the two operations may be performed using the same equipment. Thus, because the semiconductor substrate does not need to be exposed to the exterior environment, contamination of the protective-film layer by a foreign substance, or an increase in the thickness of the protective-film layer by additional oxidation, which is caused when the semiconductor substrate, on which the protective-film layer has been formed, must be removed from the equipment, may be prevented, unlike the related art.

In this operation S102, source gas includes only gas containing a semiconductor material, for example, silane gas ($SiH_4$), because the semiconductor layers 301 and 302 are intrinsic. Selectively, the source gas may also contain nitrogen dioxide ($N_2O$) gas and/or oxygen ($O_2$) gas so as to adjust, for example, the size and crystallinity of crystal grains.

In an example form, each of the semiconductor layers 301 and 302 is configured as a crystalline semiconductor layer in which a polycrystalline portion in an amount of 80% to 95% and an amorphous portion in an amount of 5% to 20% are mixed with each other.

The deposition temperature in this process is equal to or less than the temperature at which the protective-film layers 201 and 202 are formed. When the deposition temperature of the semiconductor layers 301 and 302 is lower than the temperature at which the protective-film layers 201 and 202 are formed, the properties of the semiconductor layers 301 and 302, which directly participate in photo-electric conversion, may be consistent.

Meanwhile, because the semiconductor layers 301 and 302 have a crystalline structure different from that of the semiconductor substrate 10 and are not doped with a foreign substance, the semiconductor layers 301 and 302 have a lower reaction rate than when doped. Thus, the deposition temperature of the semiconductor layers 301 and 302 may range from 600° C. to 700° C. As such, the difference between the deposition temperature of the semiconductor layers 301 and 302 and the temperature at which the protective-film layers 201 and 202 are formed may be reduced.

When the temperature at which the protective-film layers 201 and 202 are formed is the same as or similar to the deposition temperature of the semiconductor layers 301 and 302 as described above, for example, the time taken to adjust the temperatures of the two processes and the time taken to stabilize the temperatures may be reduced, which may simplify processing.

In addition, the deposition pressure in operation S102 ranges from 0.01 Torr to 0.5 Torr. When the deposition pressure is below 0.01 Torr, the implementation of the process may be limited and the processing time of the semiconductor layers 301 and 302 may excessively increase. In addition, when the deposition pressure is above 0.5 Torr, the uniformity of the semiconductor layers 301 and 302 is reduced.

In operation S102, the semiconductor layers 301 and 302 are processed at a low deposition pressure, in order to improve the properties of the semiconductor layers 301 and 302 as described above. More specifically, the semiconductor layers 301 and 302 are formed as the source gas including silane gas is thermally decomposed so that a semiconductor material is deposited over the protective-film layers 201 and 202. Although the deposition temperature and/or the deposition pressure may be increased in order to increase the deposition rate, this may increase the difference in crystallinity inside the semiconductor layers 301 and 302. Meanwhile, the mobility of carriers greatly depends on the grain size of the semiconductor layer, and the increased difference in crystallinity means that the semiconductor layers 301 and 302 have inconsistent properties. In operation S102, because the deposition pressure ranges from 0.01 Torr to 0.5 Torr, the difference in crystallinity may be effectively reduced.

Figure 4C:
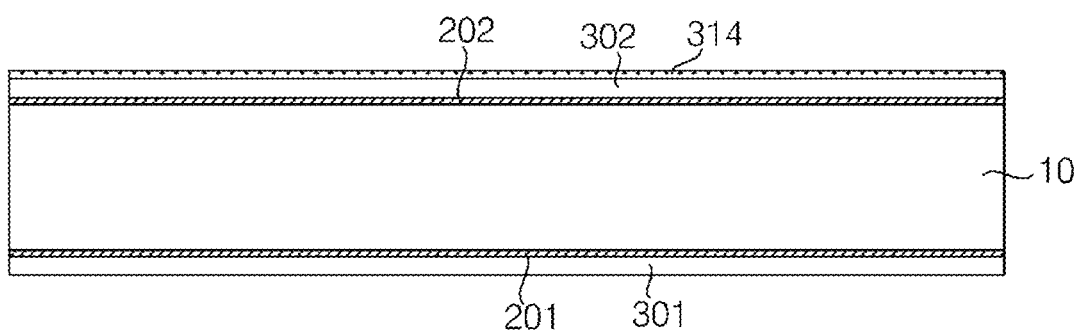

Subsequently, in the doping layer forming operation S103, a doping layer 314 containing a dopant is formed over the second semiconductor layer 302, which is disposed on the back surface of the semiconductor substrate 10. FIG. 4C diagrammatically illustrates the doping layer forming operation S103.

The doping layer 314 is disposed only over the second semiconductor layer 302, and is not present over the first semiconductor layer 301.

The dopant contained in the doping layer 314 may be the second conductive dopant, which is of an opposite conductive type of that of the dopant in the semiconductor substrate 10. In one example, when the semiconductor substrate 10 is doped with an n-type dopant, the dopant in the doping layer 314 is a p-type dopant. Thus, a group-III element, such as boron (B), aluminum (Al), gallium (Ga), or indium (In), is used as the dopant in the doping layer 314. When the semiconductor substrate 10 is doped with a p-type dopant, the dopant in the doping layer 314 is an n-type dopant. Thus, a group-V element, such as phosphorus (P), arsenic (As), bismuth (Bi), or antimony (Sb), is used as the dopant in the doping layer 314.

The dopant included in the doping layer 314 is introduced into the second semiconductor layer 302 in the subsequent operation S104, causing the second semiconductor layer 302 to form a pn junction with the semiconductor substrate 10 with the second protective-film layer 202 interposed therebetween.

The concentration of the dopant included in the doping layer 314 ranges from $1\times10^{20}/cm^3$ to $1\times10^{22}/cm^3$, and is greater than the concentration of a dopant in a first conductive area, which will be described in the subsequent step.

In an example form, the doping layer 314 having the above concentration of dopant is configured as a semiconductor layer formed of amorphous silicon, and has a thickness within a range from 30 nm to 50 nm.

When the thickness is below 30 nm, while the doping layer 314 is irradiated with a laser, the doping layer 314 may fail to effectively absorb the laser, which causes damage to the second protective-film layer 202, which is thin. On the other hand, when the thickness is above 50 nm, the doping layer 314 may excessively absorb the laser, and thus the dopant may not be effectively introduced into the second semiconductor layer 302.

Meanwhile, amorphous silicon has a high coefficient of absorption of light, as is well known, and thus is capable of reducing the strength of light by absorbing light penetrating the layer. As will be described below, the dopant included in the doping layer 314 is selectively introduced into the second semiconductor layer 302 by the laser. At this time, because the doping layer 314 configured as an amorphous semiconductor layer is irradiated with the laser, damage to the second protective-film layer 202, which is present beneath the second semiconductor layer 302 and is thin, may be prevented.

The doping layer 314 may be formed via a deposition method that enables cross-sectional deposition, such as Plasma Enhanced Chemical Vapor Deposition (PECVD), because the doping layer 314 is an amorphous semiconductor layer containing the dopant and is formed only on the back surface of the semiconductor substrate 10.

A mixture of silane gas, $B_2H_6$ gas containing the dopant, or BCl3 is used as source gas, the processing temperature is maintained within a range from 200° C. to 300° C., and the processing pressure is maintained within a range from 1 Torr to 4 Torr.

Meanwhile, although the doping layer 314 has been described above as being configured as an amorphous semiconductor layer, the doping layer 314 may be an oxide film containing the dopant, which is selectively formed of boron silicate glass (BSG) or phosphor silicate glass (PSG).

The oxide film may also be formed over the second semiconductor layer 302 via a PECVD method, a mixture of oxygen gas, silane gas, $B_2H_6$ gas containing the dopant, or BCl3 gas may be used as source gas, the processing temperature is maintained within a range from 200° C. to 300° C., and the processing pressure is maintained within a range from 1 Torr to 4 Torr.

Because the oxide film has a lower coefficient of absorption of light than the amorphous semiconductor layer, a laser scanning method may also be adjusted based on the properties of the film by reducing the energy of a laser compared to the instance where the amorphous semiconductor layer is used as the doping layer, or by adjusting the pulse width of the laser.

Figure 4D:
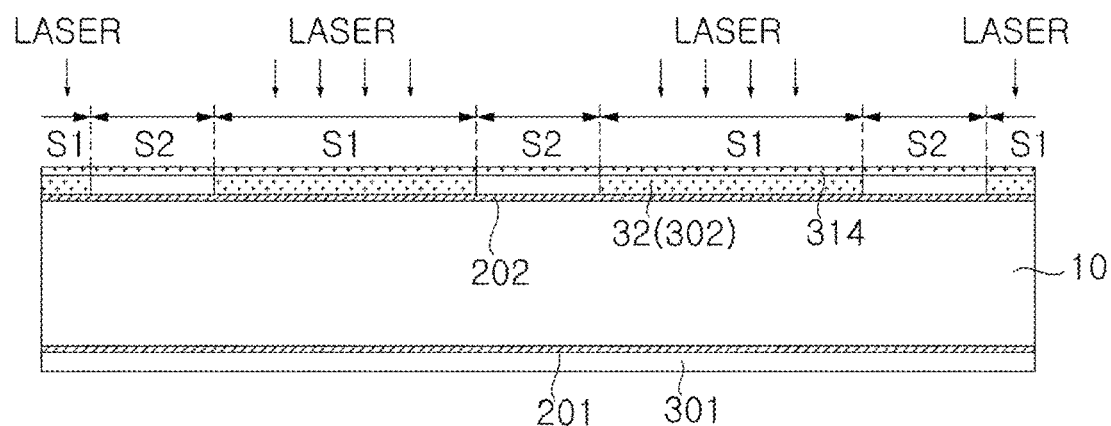

Subsequently, in the first conductive area forming operation S104, the dopant included in the doping layer 314 is selectively introduced into the intrinsic second semiconductor layer 302 so as to locally form the first conductive area 32. FIG. 4D diagrammatically illustrates the first conductive area forming operation S104.

In an example form, the first conductive area 32 is formed by selectively irradiating the doping layer 314 with a laser. As illustrated in FIG. 4D, the entire doping layer 314 is not irradiated with the laser, but only a portion of the doping layer 314, which has a first width S1 corresponding to the first conductive area 32, is selectively irradiated with the laser so that the remaining portion of the doping layer 314, which has a second width S2, is not irradiated with the laser. In the doping layer 314 irradiated with the laser, the dopant included in the doping layer 314 thermally diffuses into the second semiconductor layer 302, whereby the first conductive area 32 is formed. Then, the doping layer 314 irradiated with the laser is removed.

When the first conductive area 32 is formed using the laser as described above, for example, a process of masking the doping layer 314 in order to selectively introduce the dopant included in the doping layer 314 into the second semiconductor layer 302 may be omitted, which may simplify the manufacturing process and may reduce manufacturing costs.

Thereby, the semiconductor substrate 10 forms a pn junction with the first conductive area 32 with the second protective-film layer 202 interposed therebetween.

The concentration of the dopant in the first conductive area 32 ranges from $1 \times 10^{20}/cm^3$ to $1 \times 10^{22}/cm^3$, and is substantially the same as the concentration of the dopant in the doping layer 314.

Hereinafter, a laser scanning method for forming the first conductive area 32 by irradiating the doping layer 314 with a laser will be described in detail with reference to the accompanying drawings.

Figure 5:
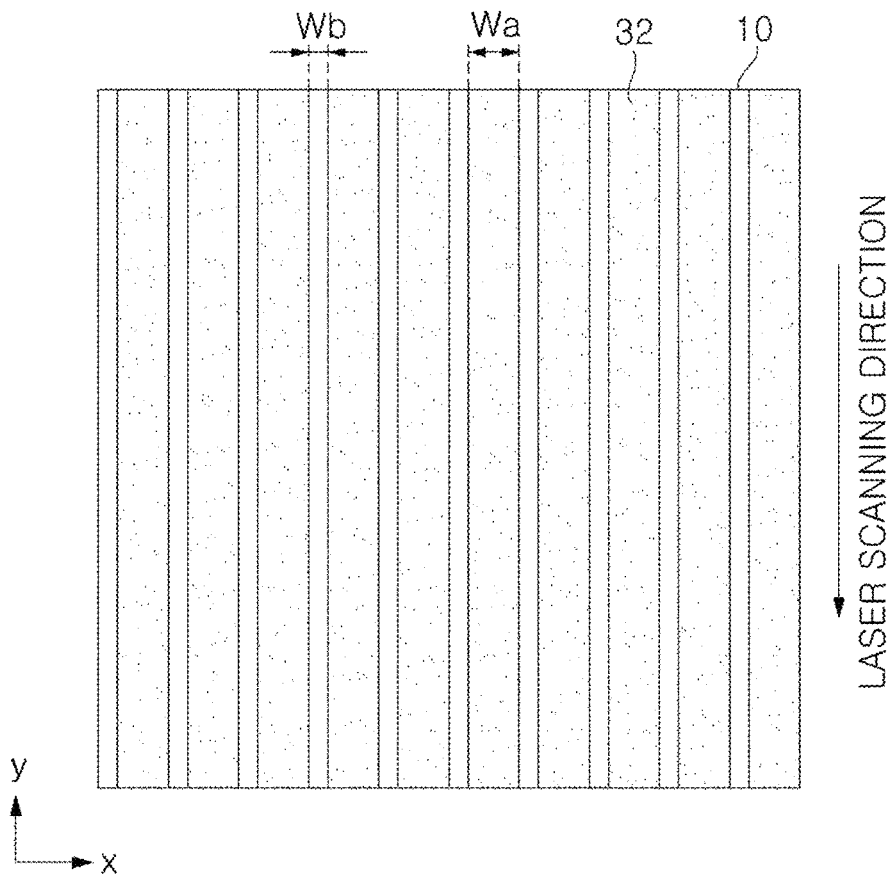
FIGS. 5 to 12 are views related a method of scanning a doping layer using a laser.

First, FIG. 5 illustrates the first conductive areas 32 formed on the semiconductor substrate 10.

As illustrated in FIG. 5, with respect to a sheet of a semiconductor substrate 10, the first conductive areas 32 have a line width Wa within a range from 500 μm to 700 μm.

The first conductive areas 32 extend a long length along the y-axis of FIG. 5, and the respective neighboring first conductive areas 32 are spaced apart from each other by a constant distance Wb. As such, the first conductive areas 32 generally form a striped arrangement.

The first conductive areas 32 having the form of stripes, as illustrated in FIG. 5, may be formed one by one by directly irradiating the doping layer 314 with a laser in a laser progress direction, i.e. along the y-axis of FIG. 5, which is the longitudinal direction of the first conductive areas 32. Alternatively, the first conductive areas 32 may be formed at the same time by irradiating the entire doping layer 314 with a laser.

Figure 6:
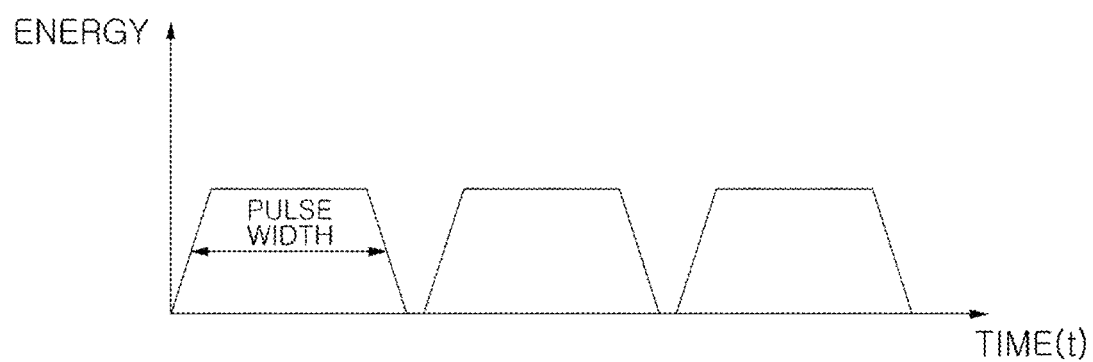

In an example form, the laser may use a pulse-type laser illustrated in FIG. 6, and may have an energy of 0.5 J/cm² to 2.5 J/cm², a frequency of 10 KHz to 100 KHz, a pulse width of 80 ns to 100 ns (nanoseconds), and a wavelength of 350 nm to 600 nm.

FIG. 6 illustrates the oscillation of a pulse-type laser with respect to a time axis. As illustrated in FIG. 6, the pulse-type laser is discontinuously emitted with respect to the time axis, and the pulse width for each laser shot ranges from 80 ns to 100 ns.

The distribution of energy for each laser shot has the shape of a top hat so that it forms steep slopes at the beginning and the end of the shot and is constant throughout the remaining portion.

Figure 7:
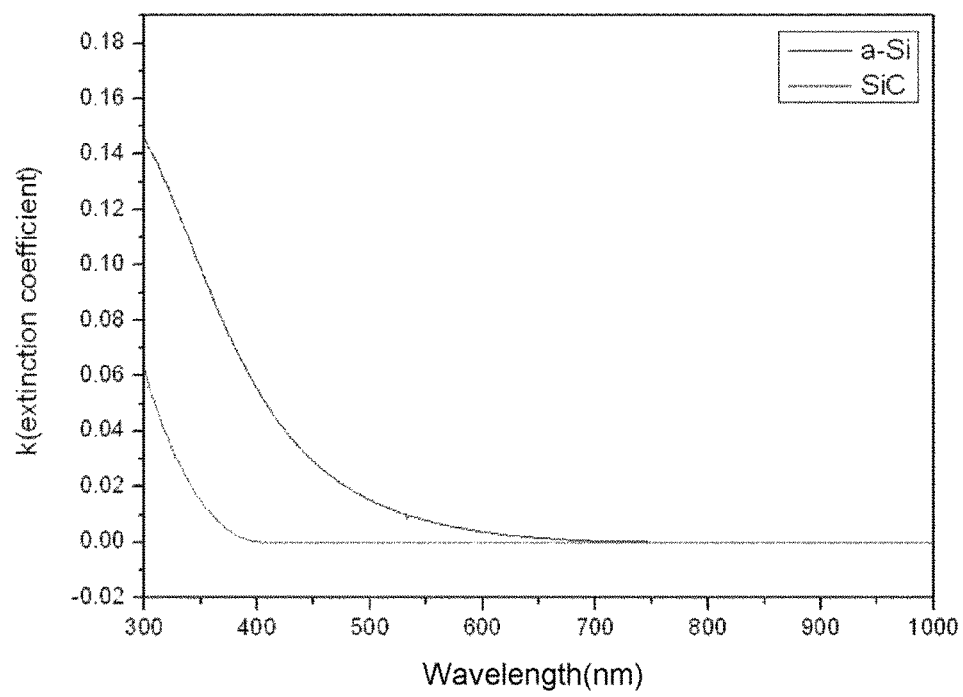

FIG. 7 illustrates the coefficient of absorption depending on the wavelength of a laser. The x-axis of the graph represents the wavelength of a laser, and the y-axis represents the coefficient of absorption of a laser. It can be seen that a laser is absorbed by amorphous silicon and a great amount of laser is absorbed near wavelengths from 350 nm to 600 nm, which are used in this step.

In addition, the power of the laser may be calculated by multiplying the value of energy for each unit of time by the pulse width of the laser. Thus, even if the laser has constant energy, the power of the laser may be adjusted by adjusting its pulse width.

In this embodiment, based on the above description, the doping layer 314 formed of amorphous silicon is irradiated with a laser having an adjusted pulse width, in order to uniformly thermally diffuse the dopant included in the doping layer 314 into the semiconductor layer 302 and to prevent the protective-film layer, which is thin, from being damaged by the laser.

Meanwhile, an area scanned by a single laser oscillation (hereinafter referred to as a shot) may be defined as a spot. In an example form, the spot of the pulse-type laser has a square shape.

Figure 8:
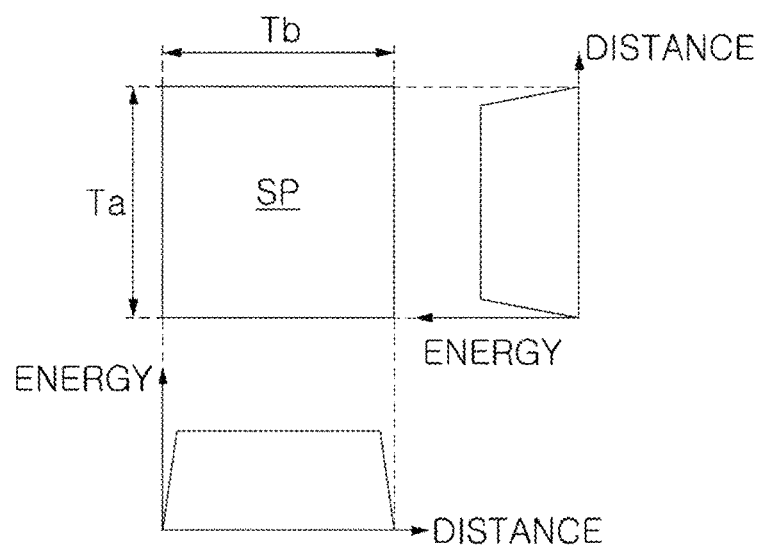

FIG. 8 illustrates the distribution of energy in the spot with respect to the horizontal axis and the vertical axis. As illustrated, the distribution of energy of a laser has the shape of a top hat with respect to each of the horizontal axis and the vertical axis. The top hat is laterally symmetrical and forms steep slopes at opposite ends thereof, thereby generally showing a trapezoidal distribution, as illustrated.

Figure 9:
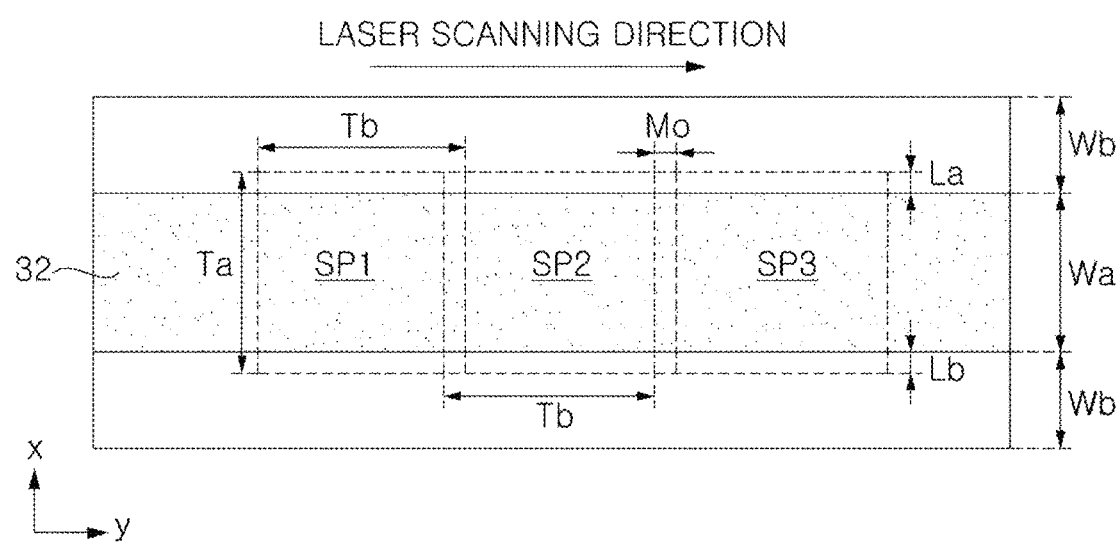

FIG. 9 is a view illustrating a method for scanning the first conductive area using the spot that has the distribution of energy described above. In FIG. 9, although only a portion of the first conductive area 32 formed into a stripe shape is illustrated and, for convenience of description, only first to third spots SP1 to SP3 are exemplified, a greater number of spots may be used in practice in order to form the first conductive area 32 having a stripe shape. For example, the first conductive area 32 may be longitudinally scanned using a laser, which has a greater spot size than the first conductive area 32, so that spots partially overlap each other.

As illustrated in FIG. 9, the first spot SP1 to the third spot SP3 have a substantially square shape, which has a first width Tb corresponding to a horizontal width and a second width Ta corresponding to a vertical width. In this instance, the first to third spots SP1 to SP3 are named using ordinal numbers based on the temporal sequence of laser oscillations. The first spot SP1 is made by a laser oscillation that precedes the second and third spots SP2 and SP3, and then the second spot SP2 and the third spot SP3 are made in this sequence by laser oscillations.

The first spot SP1 to the third spot SP3 have a substantially square shape and have a length Ta along the vertical axis and a length Tb along the horizontal axis.

In this instance, laser scanning is performed in the same direction as the longitudinal direction of the first conductive area 32 (along the y-axis of FIG. 9), and the first spot SP1 to the third spot SP3 are formed along the longitudinal direction of the second conductive area 32 so as to correspond to the scan direction.

In the horizontal direction (i.e. the scanning direction along the y-axis of FIG. 9), the first spot SP1 and the second spot SP2 partially overlap each other to form an overlapping area Mo, and the second spot SP2 and the third spot SP3 partially overlap each other to form another overlapping area Mo.

The width of the overlapping area Mo may range from 5 μm to 15 μm in consideration of the distribution of energy having steep slopes at opposite ends thereof. In consideration of a spot having a substantially square shape, of which horizontal and vertical lengths range from 550 μm to 910 μm, the ratio of the horizontal width of the overlapping area Mo to the horizontal width Tb ranges from 1/182 to 1/110.

Figure 10:
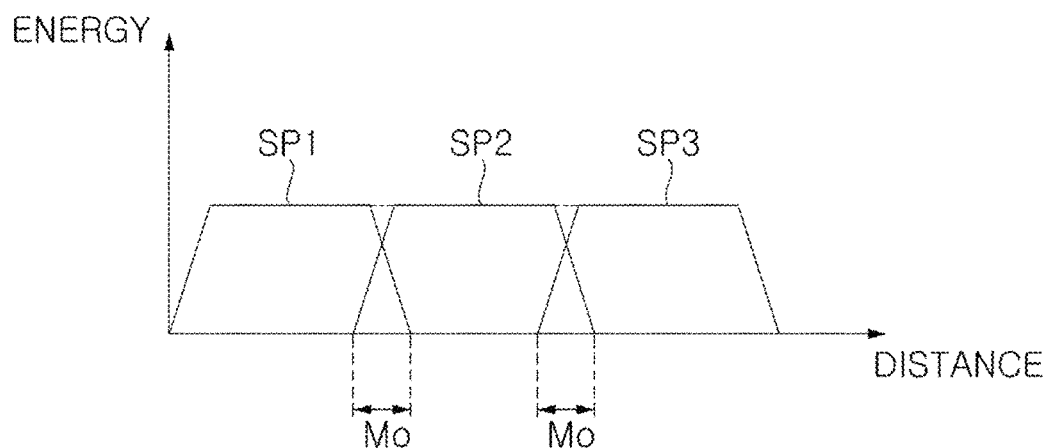

FIG. 10 illustrates the distribution of energy in the first spot SP1 to the third spot SP3 with respect to the horizontal axis.

In the overlapping area Mo, the sloping portion of the first spot SP1 and the sloping portion of the second spot SP2 overlap each other, and the sloping portion of the second spot SP2 and the sloping portion of the third spot SP3 overlap each other. Thus, in the overlapping area Mo, the energy of a laser corresponds to the integral value of the two overlapped spots, which may be the same as the energy of the remaining area. Accordingly, these spots may generally have constant energy.

In consideration of this distribution of energy, when the ratio of the horizontal width of the overlapping area Mo to the horizontal width Tb of the spot is below 1/182, variation in energy occurs because the integral sum of energy is reduced compared to the remaining area. On the other hand, when the ratio of the horizontal width of the overlapping area Mo to the horizontal width Tb of the spot is above 1/110, damage to the second protective-film layer 202 occurs because the integral sum of energy is increased compared to the remaining area.

Referring again to FIG. 9, in the vertical direction (along the x-axis of FIG. 9), because the width Ta of each of the spots SP1 to SP3 is greater than the width Wa of the first conductive area 32, each spot does not overlap the first conductive area 32 on opposite portions thereof in the width direction by lengths La and Lb. In this instance, "La" and "Lb" have the same value, and the relationship Wa=Ta−(La+Lb) is established.

Meanwhile, as illustrated in FIG. 8, because the distribution of energy of the spot also has the shape of a top hat in the vertical direction, when the vertical width Ta of the spot SP matches the width Wa of the first conductive area 32 with a ratio of 1:1, variation in energy occurs due to the sloping portions at opposite edges of the spot. When laser irradiation is performed in the state in which variation in energy is present, the concentration of the dopant may vary depending on variation in energy. Therefore, it is necessary to correct such variation in energy.

For this reason, as illustrated in FIG. 9, the vertical width Ta of the first to third spots SP1 to SP3 is greater than 1.1 times, but is less than 1.3 times the first width Wa of the first conductive area 32, in consideration of the distribution of energy. Because the width Wa of the first conductive area 32 ranges from 500 μm to 700 μm, the vertical width Ta of the spot SP ranges from 550 μm to 910 μm.

When the vertical width Ta of the spot SP is less than 1.1 times that of the first conductive area 32, variation in energy occurs due to the sloping portion of the spot. When the vertical width Ta of the spot SP is greater than 1.3 times that of the first conductive area 32, the width Wa of the first conductive area 32 is excessively increased, thus causing shunts between the first conductive area 32 and a second conductive area, which will be formed in the later operation S108.

Figure 11:
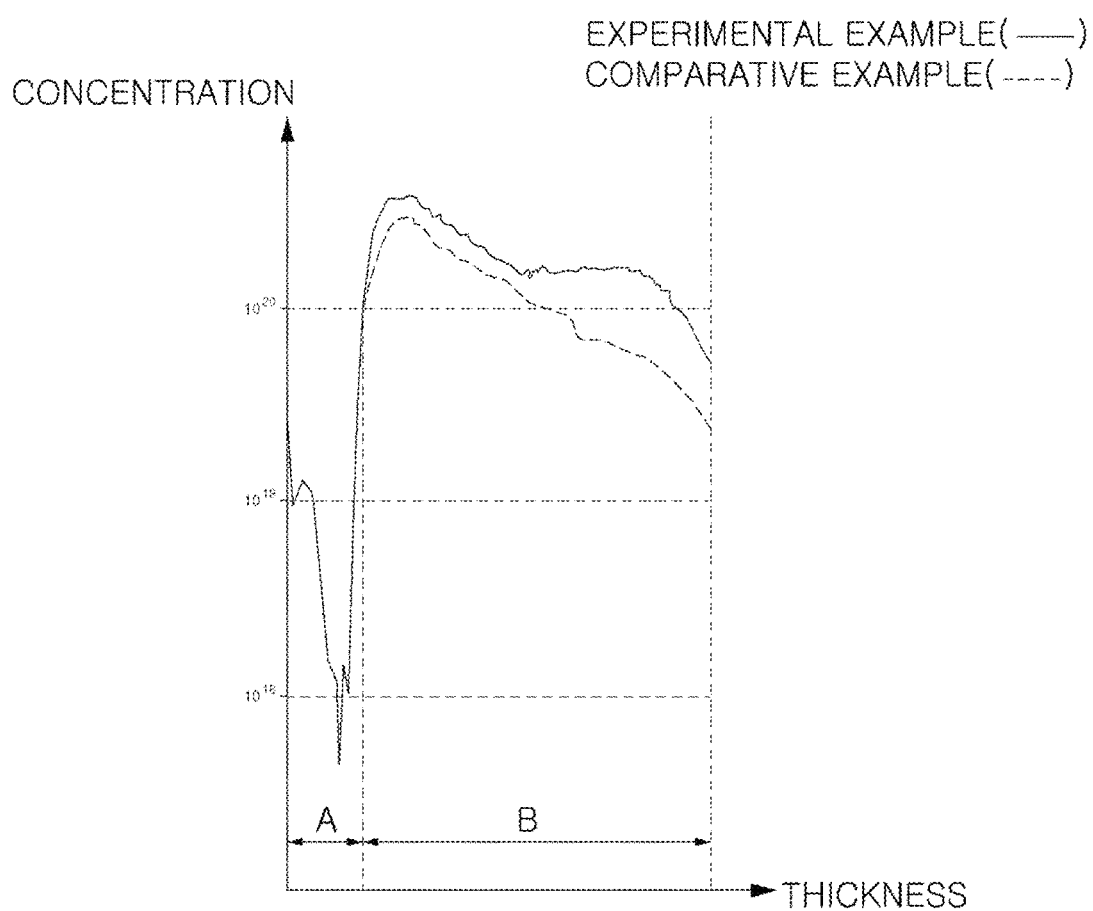

FIG. 11 illustrates a dopant concentration profile depending on a thickness when the semiconductor layer 302 is doped with a dopant via the method described above. In FIG. 11, the thickness is described as increasing closer to the second protective-film layer.

In the graph of FIG. 11, the solid line represents the instance where laser scanning is performed via the above-described method (Experimental Example), and the dotted line represents the instance where the first conductive area is formed via thermal diffusion as in the related art (Comparative Example). Boron (B) was used as the dopant, and the dopant was introduced so as to increase the thickness.

The graph may be divided into a section A and a section B depending on variation in concentration profile. During the section A, both Experimental Example and Comparative Example have a shape in which the doping concentration of the dopant descends to the lowest point and then ascends. That is, both Experimental Example and Comparative Example have the same concentration profile during the section A.

During the section B, both Experimental Example and Comparative Example have a shape in which, as the thickness increases, the doping concentration of the dopant gradually descends after reaching the highest point.

However, as illustrated in FIG. 11, the highest point of Experimental Example is higher than the highest point of Comparative Example, and the gradient of descent of Experimental Example is more gentle than the gradient of descent of Comparative Example. In other words, because variation in the concentration of the dopant depending on variation in thickness is smaller in Experimental Example than in Comparative Example during the section B, it can be seen that the dopant is doped at a higher concentration in Experimental Example than in Comparative Example, and is more uniformly doped in Experimental Example than in Comparative Example.

Figure 12:
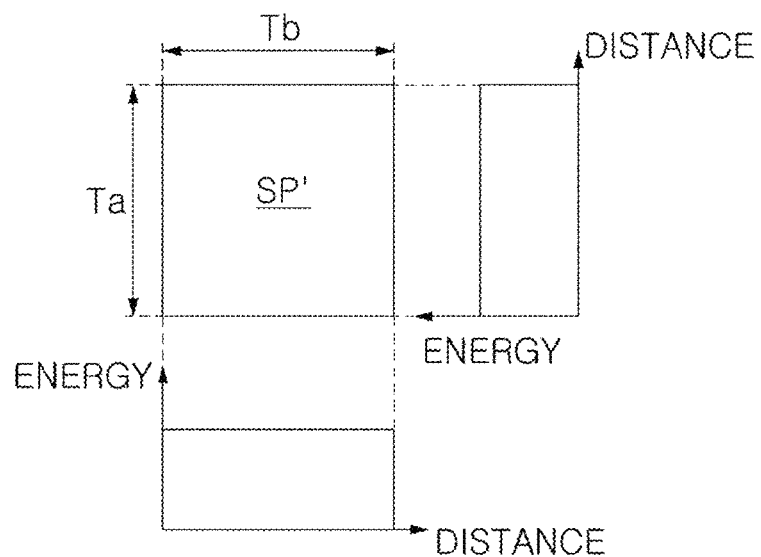

FIG. 12 illustrates the instance where the distribution of energy in the spot has substantially the shape of a complete rectangle, unlike the above description.

As illustrated in FIG. 12, a spot SP' has the shape of a square, of which the vertical width Ta has a first length and the horizontal width Tb has a second length, in the same manner as the above description.

The distribution of energy of a laser has the shape of a complete square having the same length along the vertical axis and the horizontal axis, and thus the value of energy in the spot is constant regardless of a distance.

Accordingly, because it is unnecessary to compensate for the sloping portions of the spot when performing laser scanning using a spot having the distribution of energy described above, the vertical width Ta of the spot SP' is the same as the width Wa of the first conductive area 32, and neighboring spots SP' are close to each other, but do not overlap each other in the horizontal direction.

Figure 13:
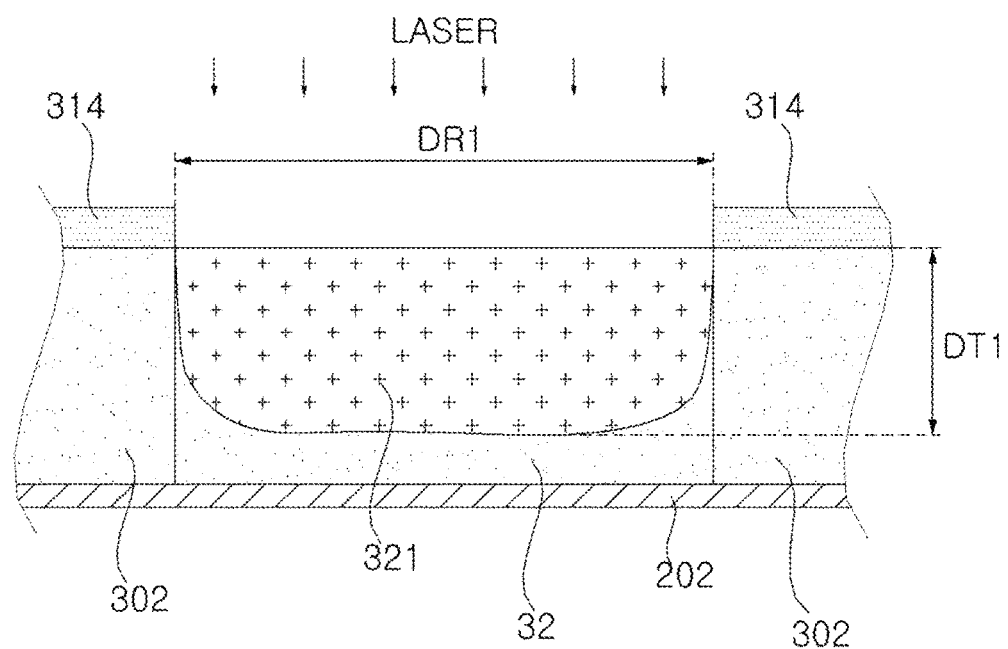
FIG. 13 is a view illustrating the crystalline structure of a second polycrystalline area.
Figure 14:
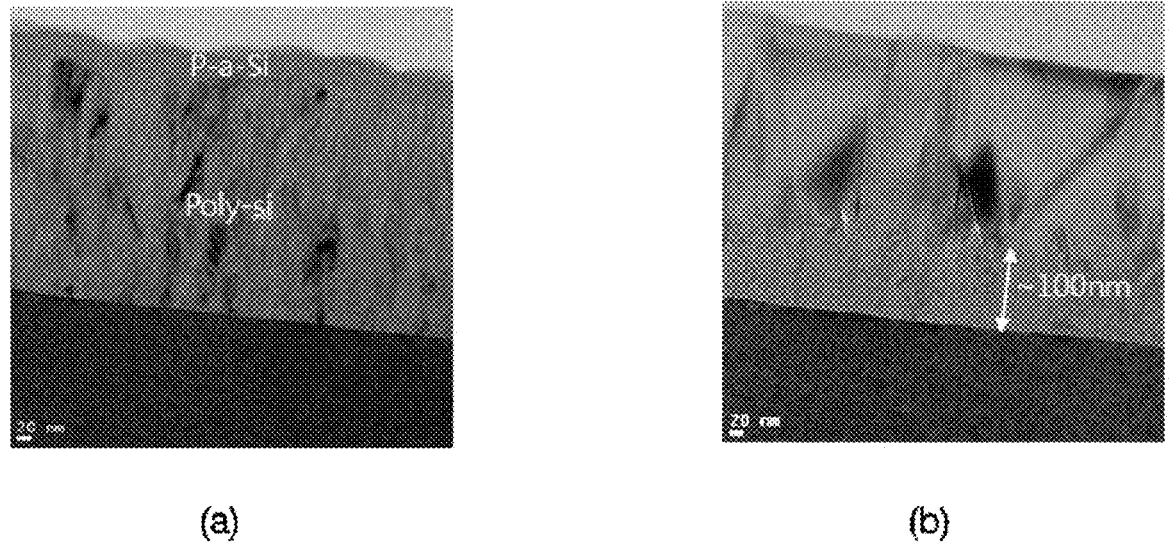
FIG. 14 is a TEM photograph illustrating re-crystallization occurring in a semiconductor layer.

FIG. 13 is a view illustrating the crystalline structure of the first conductive area 32 after operation S104 ends, and FIG. 14 is a TEM photograph illustrating re-crystallization occurring in the semiconductor layer.

In FIG. 14, (a) illustrates the cross section of a crystalline semiconductor layer and a doping layer formed of amorphous silicon on the crystalline semiconductor layer before laser irradiation, and (b) illustrates the cross section of the semiconductor layer that has undergone re-crystallization. In the TEM photograph of FIG. 14, the black layer beneath the semiconductor layer is the semiconductor substrate.

The first conductive area 32 includes the second polycrystalline area 321, which has a crystalline structure different from the crystalline structure of the semiconductor layer 302.

The second polycrystalline area 321 is formed as the semiconductor layer 302 is melted and re-crystallized by laser ablation when the doping layer 314 is irradiated with the laser. The second polycrystalline area 321 has a crystalline structure different from the crystalline structure of the semiconductor layer 302.

The grains in the second polycrystalline area 321 have better crystallinity than the crystalline semiconductor layer 302. "Crystallinity" is a concept including the size of grains and defects, and may be said to be good when the size of grains increases and the number of defects decreases.

When the semiconductor layer 302 is irradiated with a laser, ablation occurs. In this process, because defects included in the grains are removed and the density of grains increases as the size of grains increases during re-crystallization, the crystallinity of the second polycrystalline area 321 becomes better than that of the semiconductor layer 302.

When the first conductive area 32 includes the second polycrystalline area 321 as described above, resistance against the movement of carriers through the first conductive area 32 is reduced, which may increase the efficiency of collection of carriers, and consequently the efficiency of the solar cell 100.

The second polycrystalline area 321 is formed in the depth direction from the surface of the semiconductor layer 302 toward the protective-film layer 20.

Meanwhile, the laser introduced into the doping layer 314 is not so strong that it melts the entire first conductive area 32 because some of the laser is absorbed by the semiconductor layer 302 and the pulse width of the laser has been adjusted.

Therefore, the depth DT1 of the second polycrystalline area 321 is smaller than the thickness of the semiconductor layer 302. The depth DT1 may be greater than half, but less than the thickness of the semiconductor layer 302. When the depth DT1 of the second polycrystalline area 321 is less than half the thickness of the semiconductor layer 302, the power of the laser is insufficient for thermally diffusing the dopant in the first conductive area 32, whereas when the depth DT1 of the second polycrystalline area 321 is equal to the thickness of the semiconductor layer 302, the power of the laser is excessively large, causing damage to the second protective-film layer 202.

In addition, the cross-sectional area of the second polycrystalline area 321 is half or more of the cross-sectional area of the first conductive area 32. The second polycrystalline area 321 has a substantially U-shaped cross-section, and the depth DT1 thereof is greater than half the thickness of the semiconductor layer 302. Thus, the cross-sectional area of the second polycrystalline area 321 may be half or more of the cross-sectional area of the first conductive area 32. When the second polycrystalline area 321, which has better crystallinity than the semiconductor layer 302, has a greater cross-sectional area, the efficiency with which the solar cell 100 generates electricity may be further increased.

Meanwhile, because the width DR1 of the second polycrystalline area 321 corresponds to the width of a laser irradiation area, i.e. the first conductive area 32, the width DR1 is substantially the same as the width of the first conductive area 32 within a range from 500 µm to 700 µm.

Subsequently, in the doping layer removal operation S105 following the first conductive area forming operation S104, a residual doping layer 314a over the second semiconductor layer 302 is removed. The residual doping layer 314a may have a shape in which openings are formed in local portions of the doping layer 314. In this step, a portion of the first protective-film layer 201 and the first semiconductor layer 301 thereon, which are sequentially formed on the front surface of the semiconductor substrate 10, may be selectively removed.

In an example form, the residual doping layer 314a may be removed via wet etching by dipping the semiconductor substrate 10 in an etchant, which is $KOH:H_2O_2=2(L):0.8(L)$, for 10 minutes to 20 minutes, or may be removed via dry etching, such as Reactive Ion Etching (RIE), by colliding plasma ions with the residual doping layer 314a to remove the residual doping layer 314a.

"Dipping" is an etching method of immersing the entire semiconductor substrate 10 in a tub in which an etchant is stored. When removing the residual doping layer 314a by dipping the same in the etchant, a portion of the semiconductor layer 301 formed on the front surface of the semiconductor substrate 10 may be removed at the same time, and the semiconductor layer 302 may also be etched by over-etching, attributable to the reactivity of the etchant.

Figure 4E:
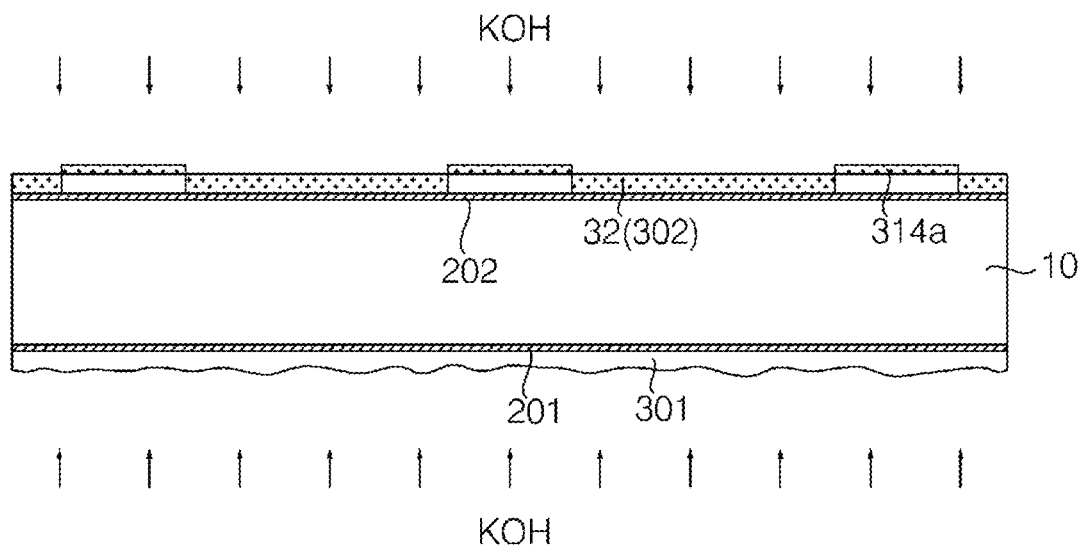

Therefore, the front surface of the semiconductor substrate 10 may be effectively textured in the subsequent texturing operation S106. FIG. 4E diagrammatically illustrates wet etching in which the residual doping layer 314a is removed by dipping.

The thickness of the residual doping layer 314a ranges from 30 nm to 50 nm, whereas the thickness of the first semiconductor layer 301 formed on the front surface of the semiconductor substrate 10 ranges from 300 nm to 400 nm.

Therefore, even if the etching rates of the residual doping layer 314a and the first semiconductor layer 301 differ from each other, the first semiconductor layer 301 is not completely removed, and thus a portion of the first semiconductor layer 301 remains while the residual doping layer 314a is completely removed.

In addition, when the semiconductor substrate 10 is dipped into the etchant, the residual doping layer 314a and the first conductive area 32 therebetween are exposed to the etchant. Thus, although the first conductive area 32 is also exposed to the etchant while the residual doping layer 314a is completely removed, the first conductive area 32, into which the dopant has been introduced, is in a stably coupled state, and thus serves as an etch stopper.

Figure 15:
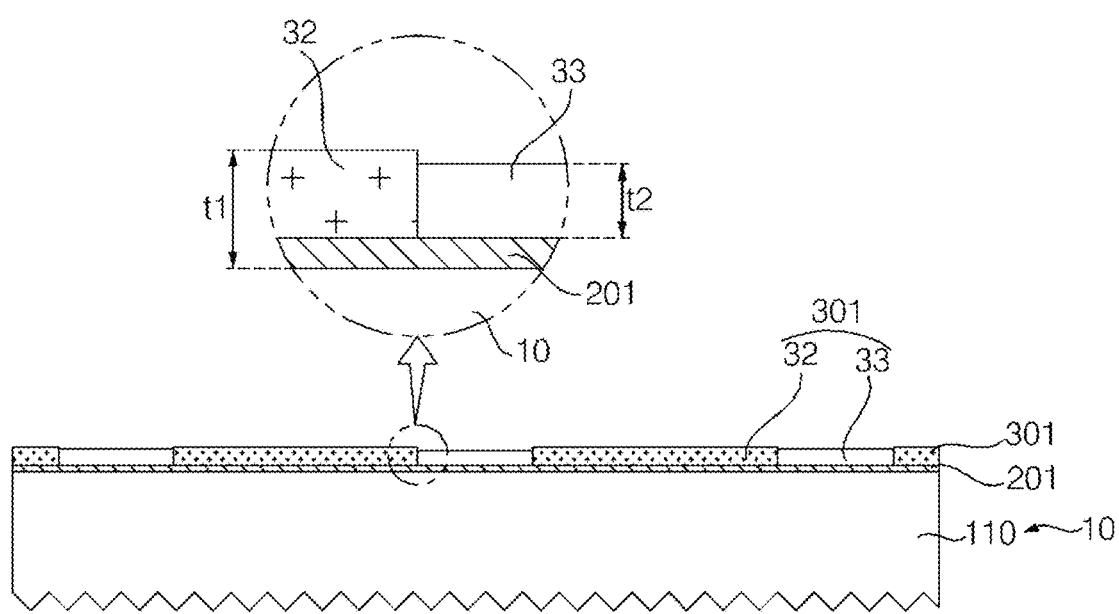
FIG. 15 is a view illustrating change in the thickness of the semiconductor layer when a residual doping layer is removed via wet etching.

Therefore, once the dipping has been completed, as illustrated in FIG. 15, the first conductive area 32 has a first thickness t1, whereas an undoped area 33, from which the residual doping layer 314a has been removed, has a second thickness t2, which is smaller than the first thickness t1 due to over-etching.

Figure 16:
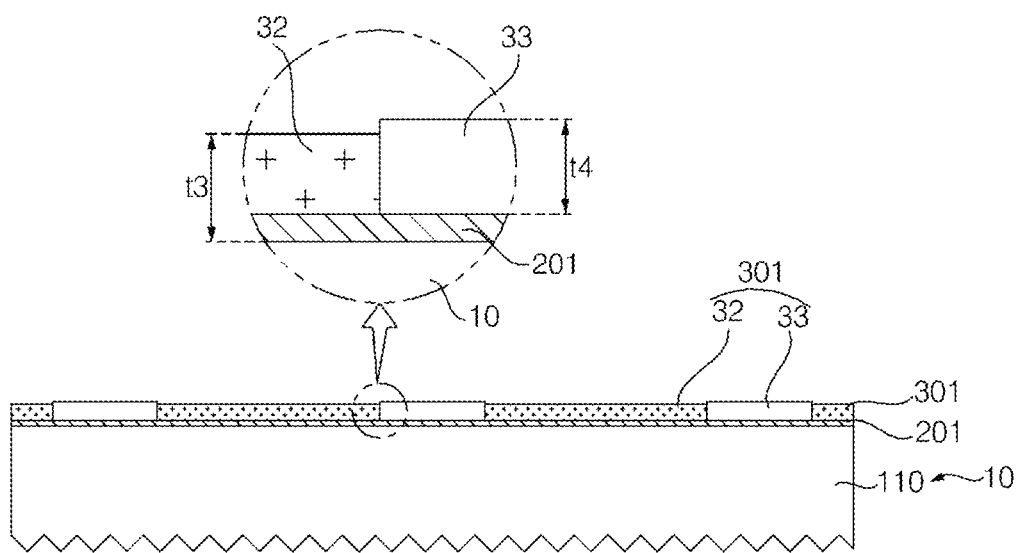
FIG. 16 is a view illustrating change in the thickness of the semiconductor layer when a residual doping layer is removed via dry etching.

FIG. 16 illustrates a difference in thickness between the first conductive area 32 and the area 33, from which the residual doping layer 314a has been removed, after the residual doping layer 314a is removed via dry etching.

When the residual doping layer 314a is removed via dry etching, unlike the above wet etching, the first conductive area 32 has a third thickness t3, whereas the undoped area 33 has a fourth thickness t4, which is greater than the third thickness t3.

In this instance, the difference between the third thickness t3 and the fourth thickness t4 is substantially the same as the thickness of the residual doping layer 314a.

Dry etching physically removes the film, and thus exhibits substantially the same etching rate regardless of materials. Therefore, because the first conductive area 32 is also etched simultaneously with the dry etching of the residual doping layer 314a, the difference between the third thickness t3 and the fourth thickness t4 is substantially the same as the thickness of the residual doping layer 314a.

Figure 4F:
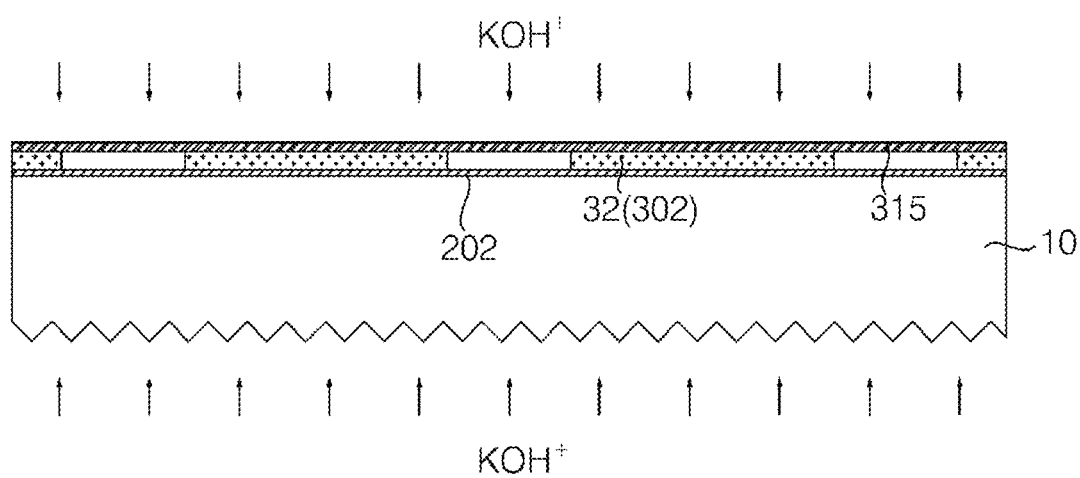

Subsequently, in the texturing operation S106 following the doping layer removal operation S105, in the state in which the second semiconductor layer 302 is masked with a mask layer 315, the semiconductor substrate 10 is dipped into an etchant so that the first semiconductor layer 301, formed on the front surface of the semiconductor substrate 10, and the first protective-film layer 201 thereunder, are completely removed, and simultaneously, the exposed front surface of the semiconductor substrate 10 is also etched, whereby the front surface of the semiconductor substrate 10 is textured. FIG. 4F diagrammatically illustrates this step.

In this instance, the mask layer 315 is formed over the entire surface of the second semiconductor layer 302 so as to protect the second semiconductor layer 302 while the front surface of the semiconductor substrate 10 is textured.

In addition, the mask layer 315 prevents a dopant from being introduced into the first conductive area 32 when the dopant is introduced into the undoped area 33 in order to form a second conductive area in the subsequent process.

The mask layer 315 may be formed of a material that includes no foreign substance, which serves as a dopant. That is, the mask layer 315 may be formed of any of various materials capable of preventing the introduction of the foreign substance. The mask layer 315 is a silicon carbide (SiC) film that effectively blocks the introduction of a dopant, and has a thickness within a range from 100 nm to 200 nm.

The silicon carbide film is easily removed by laser ablation, and is easily removed using a dilute hydrofluoric acid (HF) solution because it is changed to an oxide in the subsequent operation S108. This will be described below in detail with regard to the corresponding operation S108.

The mask layer 315 is only formed over the second semiconductor layer 302, and is not formed on the textured surface, i.e. the front surface of the semiconductor substrate 10. Thus, the mask layer 315 may be formed via any of various methods that enable cross-sectional deposition. In an example form, the mask layer 315 may be formed via a PECVD method that enables cross-sectional deposition.

The semiconductor substrate 10, provided with the mask layer 315, is dipped into an etchant, which is $KOH:H_2O_2=2$ (L):0.6(L), for 15 minutes to 30 minutes, so that the first semiconductor layer 301 and the first protective-film layer 201 thereunder are completely removed, and the exposed front surface of the semiconductor substrate 10 is also etched, whereby the front surface of the semiconductor substrate 10 is textured.

Because the etchant used in operation S106 is more strongly alkaline than the etchant used in the previous operation S105, the surface of the semiconductor substrate 10 may be effectively textured. In FIG. 4F, in order to illustrate this fact, KOH+ is shown, unlike FIG. 4E.

Figure 4G:
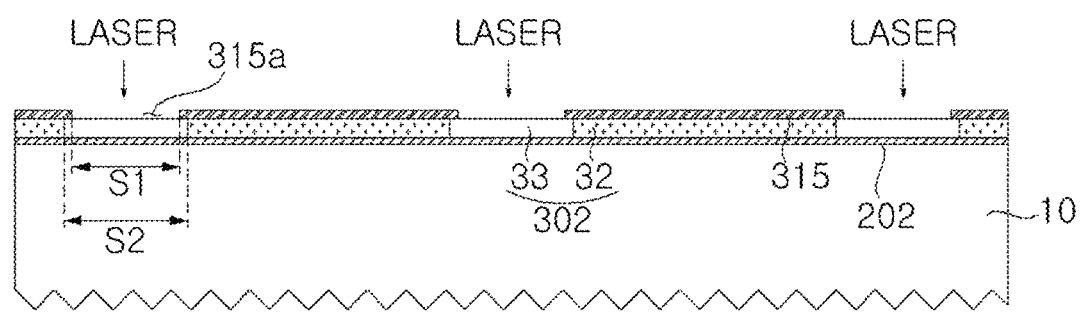

Subsequently, in the mask layer patterning operation S107, openings 315a are formed in the mask layer 315 so as to expose an area of the semiconductor layer 302 (i.e. the undoped area 33) in which the first conductive area 32 has not been formed. FIG. 4G diagrammatically illustrates the mask layer patterning step.

In an example form, the openings 315a are formed by selectively irradiating the mask layer 315 with a laser so that a portion of the mask layer 315 is subjected to laser ablation.

The laser is a pulse-type laser, of which the pulse width is adjusted, and has an energy of 0.5 $J/cm^2$ to 2.5 $J/cm^2$, a frequency of 10 KHz to 100 KHz, a pulse width of 160 ns to 200 ns (nanoseconds), and a wavelength of 350 nm to 600 nm. The pulse-type laser meeting these conditions is the same as the laser used in the above-described first conductive area forming operation S104, but has a great difference only in terms of the pulse width. Thus, the laser facility used in the above first conductive area forming operation S104 may also be used in this step, which may reduce manufacturing costs and may simplify the process.

Figure 17:
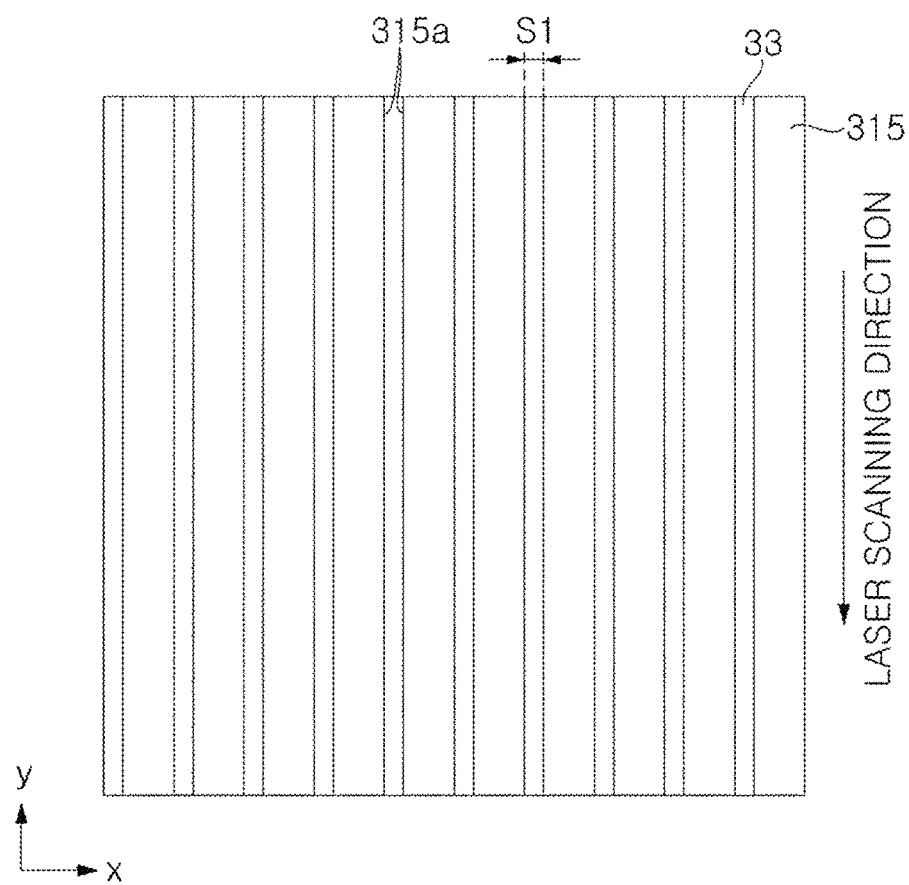
FIGS. 17 and 18 are views illustrating a laser scanning method for forming openings.
Figure 18:
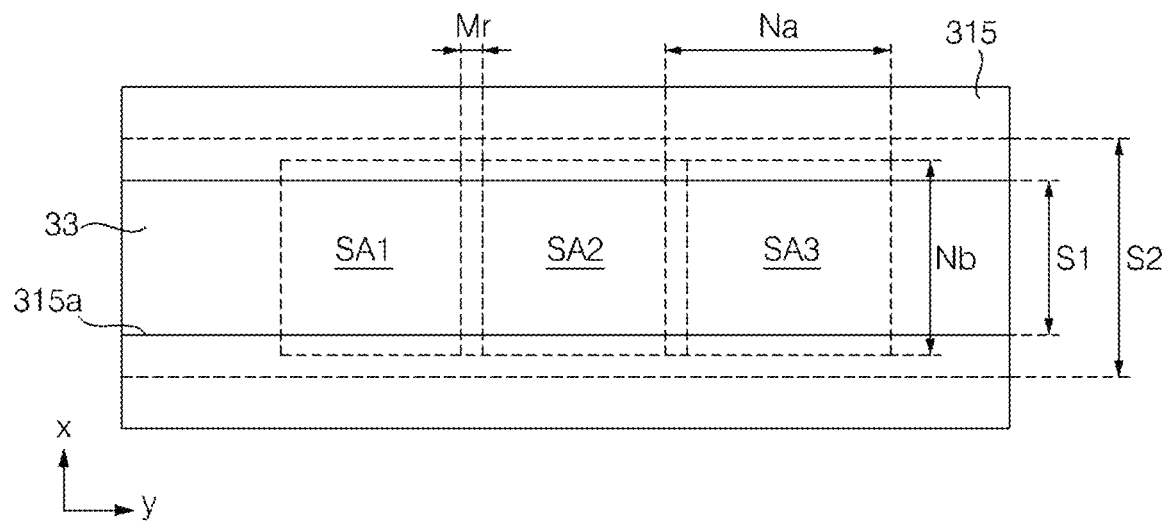

In this step, because the openings 315a are formed in the mask layer 315 using laser ablation, rather than laser thermal diffusion, a laser, of which the strength is reduced because it has a wider pulse width than the laser used in the above-described operation S104, is used. The openings 315a formed in the mask layer 315 may have a smaller width than the openings formed in the doping layer 314. FIGS. 17 and 18 illustrate a laser scanning method in operation S107. The laser scanning method may be substantially the same as that used in the above operation S104, the only difference being that the pulse width of the laser is reduced.

As illustrated in FIG. 17, the opening 315a is elongated in the longitudinal direction of the undoped area 33 (along the y-axis of FIG. 17) so as to expose the undoped area 33 in the longitudinal direction thereof. The opening 315a is formed just above the undoped area 33 so as to expose the undoped area 33 in the longitudinal direction thereof.

The respective neighboring openings 315a are spaced apart from each other by a constant distance so as to generally form a striped arrangement.

FIG. 18 illustrates a laser scanning method of forming the openings. In FIG. 18, only three spots are illustrated for convenience of description, and the distribution of energy in the spot has a top hat shape in the same manner as FIG. 7.

A spot SA has a substantially square shape having a first length Na along the horizontal axis and a second length Nb along the vertical axis.

The first length Na is greater than the width S1 of the opening 315a and is less than the width S2 of the undoped area 33 in consideration of the distribution of energy. When the first length Na is greater than the width S2 of the undoped area 33, the first conductive area 32 may be exposed through the opening 315a. In this instance, in the subsequent operation S108, shunts between the first conductive area 32 and the second conductive area 34 may occur.

In addition, the first to third spots SA1 to SA3 partially overlap the neighboring spots to form overlapping areas Mr in consideration of the distribution of energy. The width of the overlapping area Mr ranges from 5 μm to 15 μm in consideration of the distribution of energy.

The distribution of the energy of the laser has been described above as having a top hat shape. At this time, when the laser has the distribution of energy illustrated in FIG. 11, the first length Nb is substantially the same as the width S1 of the opening 315a.

When the mask layer 315 is patterned using the laser, the opening 315a may be accurately formed at a desired position, and the number of processes may be reduced.

Meanwhile, the width S1 of the opening 315a is less than the width S2 of the undoped area 33. When the width S1 of the opening 315a is less than the width S2 of the undoped area 33, a portion of the undoped area 33, i.e. opposite edges of the undoped area 33 are not exposed, but are covered with the mask layer 315. Therefore, when the dopant is introduced into the undoped area 33 in the subsequent step, no doping occurs in the covered portion for forming the barrier area 33, which is formed of an intrinsic semiconductor layer.

The barrier area 33 is located between the first conductive area 32 and the second conductive area 34 and prevents shunts between the first conductive area 32 and the second conductive area 34, which are of different conductive types.

Figure 19:
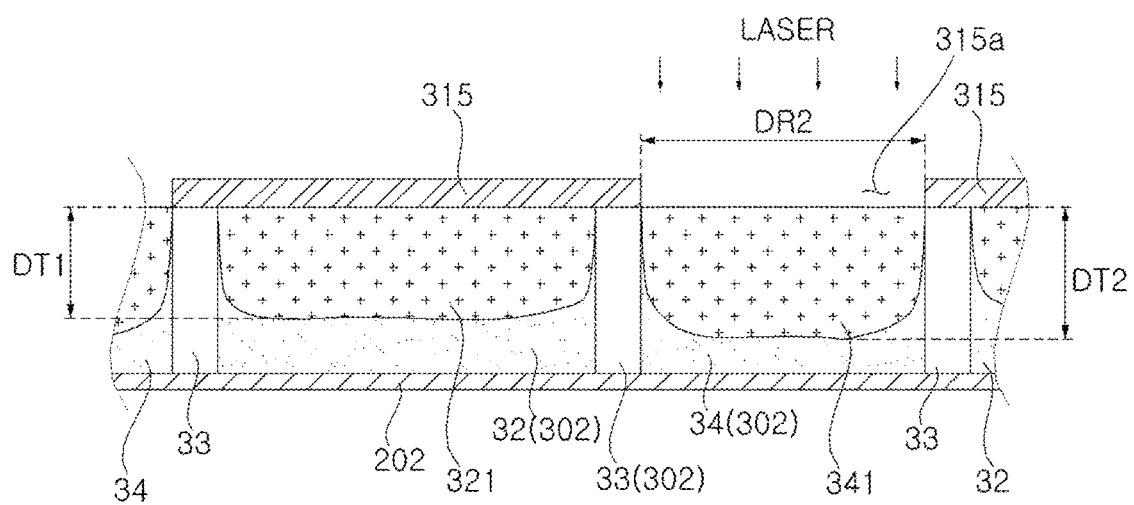
FIG. 19 is a view illustrating the crystalline structure of a fourth polycrystalline area.

FIG. 19 is a cross-sectional view illustrating the crystalline structure of the second conductive area after the mask layer patterning operation S107 ends.

When the mask layer 315 is irradiated with a laser, the opening 315a is formed in the mask layer 315 via laser ablation, and the undoped area 33 below the opening 315a is melted and re-crystallized. As such, the second conductive area 34 includes the fourth polycrystalline area 341, which has a crystalline structure different from that of the remaining area of the second conductive area 34.

The grains in the fourth polycrystalline area 341 have better crystallinity than the unchanged crystalline structure of the barrier area 33, and thus have few defects and are larger and more dense.

When the semiconductor layer 302 is irradiated with a laser, ablation occurs. In this process, because defects included in the grains are removed and the grains are increased in volume and density during re-crystallization, the crystallinity of the fourth polycrystalline area 341 becomes better than that of the semiconductor layer 302.

Meanwhile, the laser used when the second polycrystalline area 321 is formed and the laser used when the fourth polycrystalline area 341 is formed differ from each other only in terms of the pulse width thereof, and have substantially the same energy. Therefore, because the crystallinity of the fourth polycrystalline area 341 is substantially the same as that of the second polycrystalline area 321, the crystalline structure of the fourth polycrystalline area 341 is substantially the same as the crystalline structure of the second polycrystalline area 321.

Although a laser is selectively absorbed by amorphous silicon depending on the wavelength thereof as illustrated in FIG. 7, no laser within a wavelength range of 350 nm or more is absorbed by a silicon carbide.

Accordingly, when the mask layer 315 formed of a silicon carbide is irradiated with a laser, the laser directly penetrates the mask layer 315, melting the semiconductor layer 302. As a result, the fourth polycrystalline area 341 is formed in the depth direction from the surface of the semiconductor layer 302 to the protective-film layer 202. The depth DT2 of the fourth polycrystalline area 341 is greater than the depth DT1 of the second polycrystalline area 321.

Thus, the ratio of the cross-sectional area of the fourth polycrystalline area 341 to the cross-sectional area of the second conductive area 34 is 0.5:1 or more, and is greater than the ratio of the cross-sectional area of the second polycrystalline area 321 to the cross-sectional area of the first conductive area 32.

Because the fourth polycrystalline area 341, which has better crystallinity than the semiconductor layer 302, is widely formed in the second conductive area 34, carriers may effectively move in the second conductive area 34, which may further increase the efficiency with which the solar cell 100 generates power.

Meanwhile, the width DR2 of the fourth polycrystalline area 341 corresponds to the width of the area irradiated with a laser, i.e. the opening 315a, and is substantially within a range from 205 μm to 350 μm, which is the same as the width of the second conductive area 34.

The width DR2 of the fourth polycrystalline area 341 is less than the width DR1 of the second polycrystalline area 321. The width DR2 of the fourth polycrystalline area 341 may be half the width of the second polycrystalline area 321.

Figure 4H:
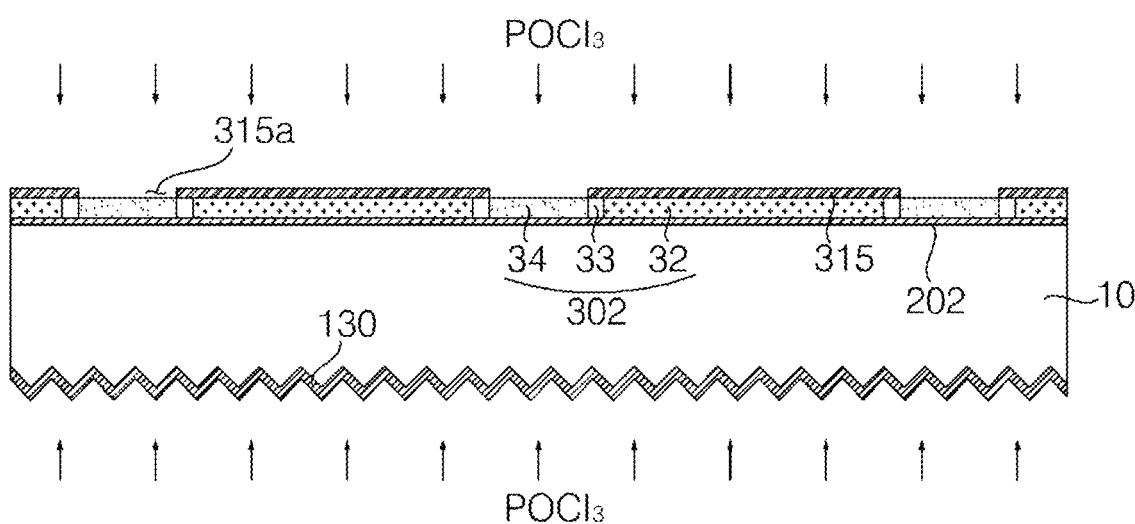

Subsequently, in the second conductive area/front-surface field area forming operation S108, a dopant is introduced into the front surface of the semiconductor substrate 10 to form the front-surface field area 130 and is also introduced into the undoped area 33 on the back surface, which is exposed through the opening 315a, to form the second conductive area 34. FIG. 4H diagrammatically illustrates this step.

The dopant is the first conductive dopant, which is the same as that used in the semiconductor substrate 10. When the semiconductor substrate 10 is an n-type, the first conductive dopant is an n-type dopant including a group-V element, such as phosphorus (P), arsenic (As), bismuth (Bi), or antimony (Sb). When the semiconductor substrate 10 is a p-type, the first conductive dopant is a p-type dopant including a group-III element, such as boron (B), aluminum (Al), gallium (Ga), or indium (In).

In operation S108, the second conductive area 34 and the front-surface field area 130 may be formed at the same time by thermally diffusing the first conductive dopant in a gas atmosphere including the first conductive dopant. Any of various gases including the first conductive dopant may be used as the gas atmosphere. In one example, when the first conductive dopant is an n-type, phosphoryl chloride (POCl$_3$) is used.

As such, the first conductive dopant thermally diffuses from the back surface of the semiconductor substrate 10 to the undoped area 33 through the opening 315a whereby the second conductive area 34 is formed, and the first conductive area 32 is protected by the mask layer 315.

In addition, because the undoped area 33 between the first conductive area 32 and the second conductive area 34 is masked by the mask layer 315 while the dopant is introduced, no dopant is introduced into the undoped area 33, whereby the barrier area 33 is formed as an intrinsic semiconductor layer.

In an example form, the doping concentration of the second conductive area 34 is the same as that of the first conductive area 32.

In addition, the first conductive dopant, which is of the same conductive type as the dopant introduced into the semiconductor substrate 10, is introduced into the front surface of the semiconductor substrate 10, whereby the front-surface field area 130 is formed. The doping concentration of the front-surface field area 130 ranges from $1\times10^{17}$/cm$^3$ to $1\times10^{20}$/cm$^3$, which is lower than that of the second conductive area 34. The semiconductor substrate 10, on which the front-surface field area 130 has been formed, is a monocrystalline semiconductor layer, and the second semiconductor layer 302, on which the second conductive area 34 has been formed, is a crystalline semiconductor layer. Thus, the semiconductor substrate 10 and the second semiconductor layer 302 have different doping concentrations.

In another form, the second conductive area 34 and the front-surface field area 130 may be formed separately. In one example, while the second conductive area 34 is formed, the front surface of the semiconductor substrate 10 may be protected by a protective film. After the second conductive area 34 is formed, the protective film may be removed, and a second conductive dopant may be introduced only into the front surface of the semiconductor substrate 110 so as to sequentially form the front-surface field area 130.

Alternatively, when ion implantation is used, cross-sectional doping may be easily performed, and for example, the doping depth and the doping profile of the front-surface field area 130 may be easily controlled. Thus, a front-surface field area 130 having desired properties may be formed.

Meanwhile, in operation S108, when the second conductive area 34 and the front-surface field area 130 are formed via thermal diffusion using reaction gas (e.g. phosphoryl chloride (POCl$_3$)), an oxide, such as phosphor silicate glass (PSG), is formed on the surface of the second conductive area 34 and the surface of the front-surface field area 130 due to the presence of oxygen in the reaction gas. Therefore, in order to remove the oxide, the semiconductor substrate 10 is dipped into dilute hydrofluoric acid (DHF). In this process, the mask layer formed of a silicon carbide (SiC), which is not removed by an acid solution, is changed into a silicon oxide (SiOx), and thus is easily removed by the dilute hydrofluoric acid (DHF).

In another example, the mask layer formed of a silicon carbide (SiC) or the amorphous silicon dopant layer used in operation S108 may be wet-etched by an etchant (e.g. KOH). Thus, the n-type (e.g. phosphor) conductive area having higher reactivity is etched at the highest rate, the p-type (e.g. boron) conductive area, having lower reactivity, is etched at the lowest rate, and the barrier area may have a thickness between those of the n-type and p-type conductive areas.

Figure 4I:
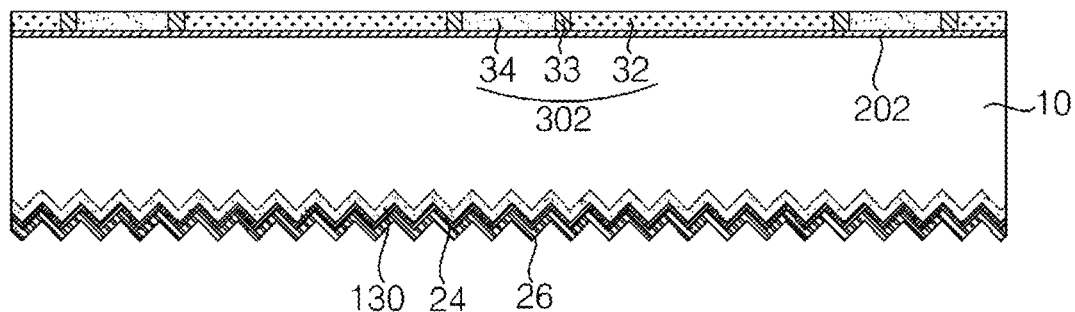
Figure 4J:
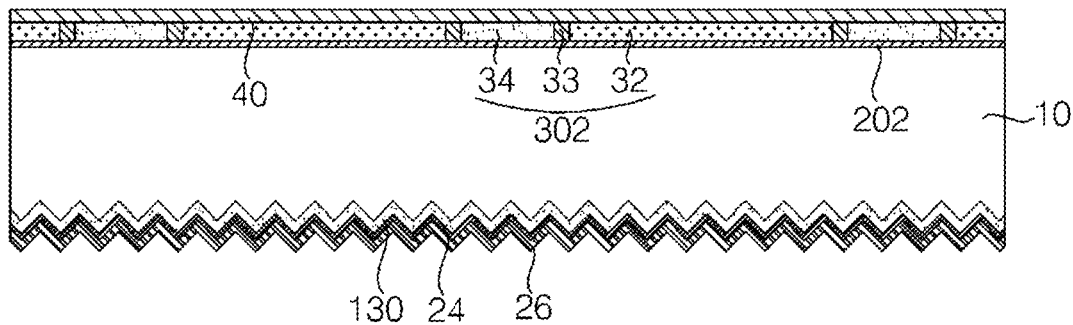

Subsequently, in the insulation film forming operation S109, insulation films are respectively formed on the front surface and the back surface of the semiconductor substrate 10. FIGS. 4I and 4J diagrammatically illustrate this step.

In an example form, the front insulation film 24 and the anti-reflection film 26, each of which is formed of an insulation material, are sequentially formed over the front-surface field area 130 on the front surface of the semiconductor substrate 10, and the insulation film 40 formed of an insulation material is formed over the second semiconductor layer 302 on the back surface of the semiconductor substrate 10.

The insulation material may be a thin film formed of a silicon oxide (SiOx), a silicon nitride (SiNx), a silicon oxide nitride (SiNxOy), or a silicon carbide (SiC).

The insulation films may be formed via any of various methods, such as, for example, vacuum deposition, chemical vapor deposition, spin coating, screen printing, or spray coating. In an example form, the insulation films may be formed via a PECVD method that enables cross-sectional deposition.

When the insulation film is formed via a PECVD method, even if the insulation film 24 and the anti-reflection film 26 are formed of different insulation materials, the insulation film 24 and the anti-reflection film 26 may be formed using different source gases within the same chamber via an in-situ process.

Similarly, when the insulation film 40 is formed over the second semiconductor layer 302 on the back surface of the semiconductor substrate 10, a PECVD method may be used to form the insulation film 40 on only the back surface. The process of forming the front insulation film 24 and the anti-reflection film 26 and the process of forming the insulation film 40 may be an in-situ process.

In this operation S109, the insulation films have been described as being first formed on the front surface of the semiconductor substrate 10, and then being formed to cover the back surface of the semiconductor substrate 10. As such, because the exposure of the first conductive area 32 and the second conductive area 34 to heat is minimized, deterioration in properties or damage may be prevented to the maximum extent.

Figure 4K:
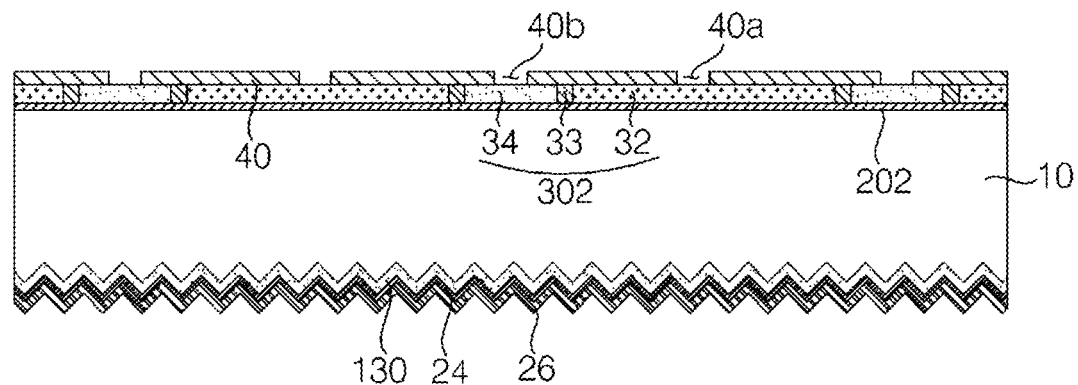
Figure 4L:
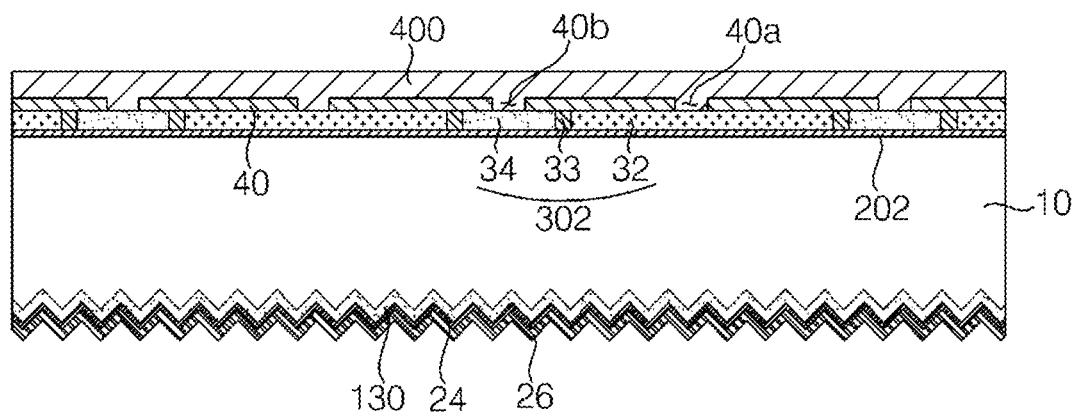
Figure 4M:
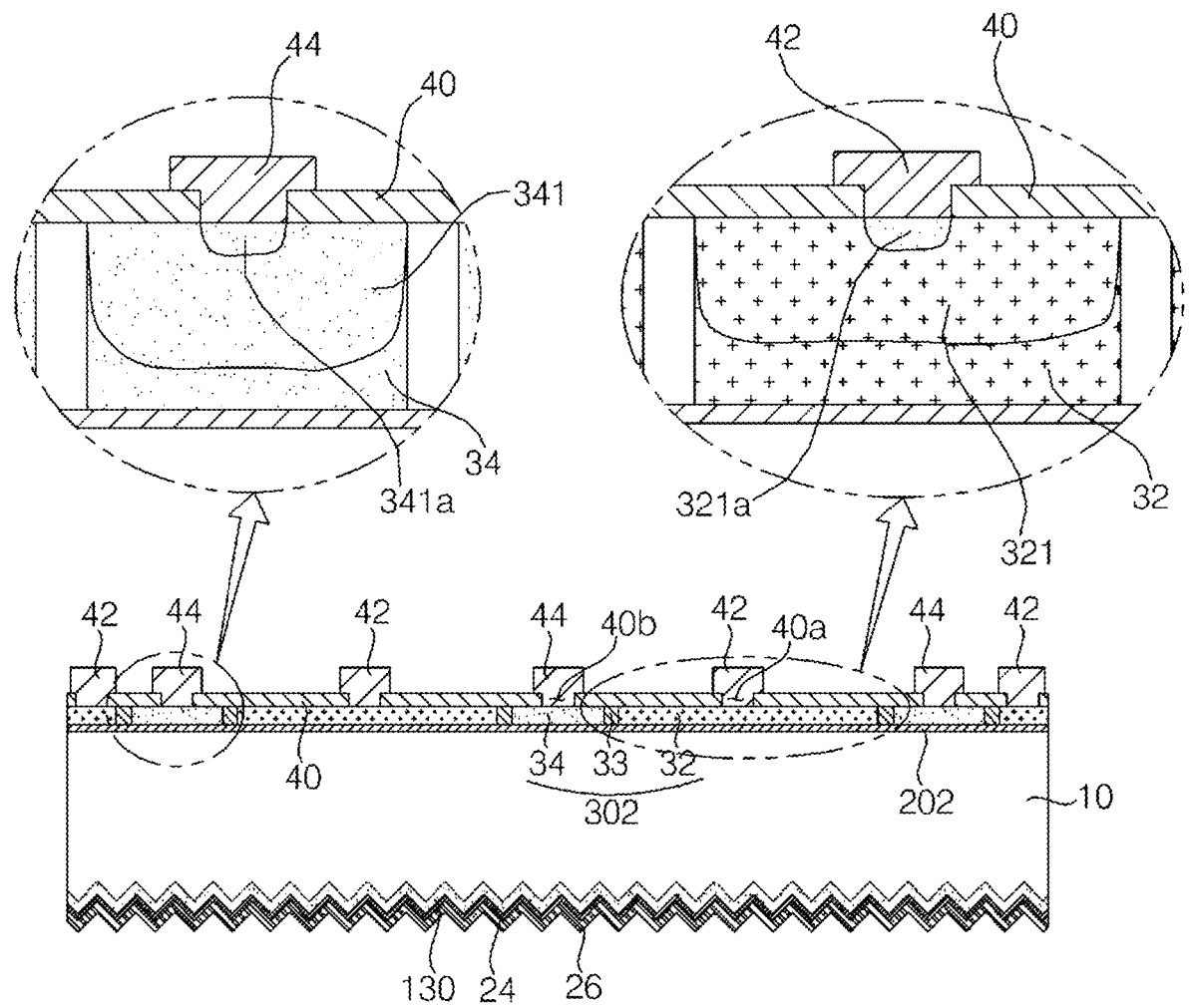

Subsequently, in the electrode forming operation S110, the first electrode 42, which is in contact with the first conductive area 32, and the second electrode 44, which is in contact with the second conductive area 34, are formed respectively on the back surface of the semiconductor substrate 10. FIGS. 4K to 4M diagrammatically illustrate the electrode forming operation S110.

A first opening 40a formed in the insulation film 40 exposes a portion of the first conductive area 32 and a second opening 40b formed in the insulation film 40 exposes a portion of the second conductive area 34. At this time, the widths of the first and second openings 40a and 40b formed in the insulation film 40 may be less than the width of the opening 315a formed in the mask layer 315. Each of the first opening 40a and the second opening 40b may take the form of a slit, which is elongated in the longitudinal direction of the first conductive area 32 or the second conductive area 34. In this instance, the first opening 40a and the second opening 40b are alternately arranged to form a striped arrangement.

In an example form, the first opening 40a and the second opening 40b are formed via laser ablation.

A laser used in operation S110 may have a frequency of 400 KHz and a power of 0.5 watts to 2 watts so as to be suitable for the openings 40a and 40b having a width within a range from 15 μm to 30 μm, and also may have a pico-second (ps) pulse width in consideration of the fact that the width of the openings 40a and 40b ranges from 10 μm to 20 μm, in order to facilitate laser ablation.

Figure 20:
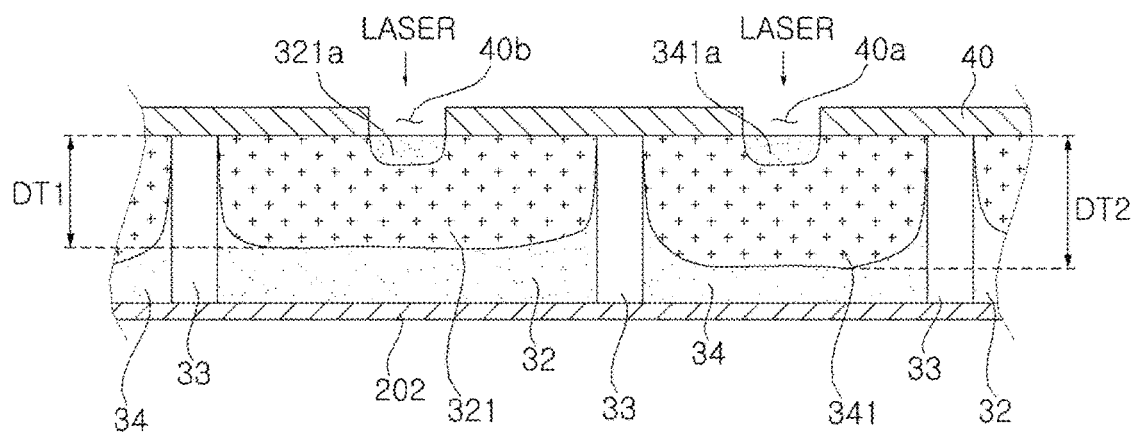
FIG. 20 is a view illustrating the crystalline structure of a third crystalline area.

FIG. 20 is a cross-sectional view illustrating the crystalline structure of the semiconductor layer when the openings 40a and 40b are formed using a laser.

When the insulation film 40 is irradiated with a laser, the openings 40a and 40b, which expose the first conductive area 32 and the second conductive area 34, are formed via laser ablation, and the second crystalline areas 321 and 341 thereunder are melted and re-crystallized, whereby the fifth polycrystalline area 321a is formed in the second polycrystalline area 321 and the sixth polycrystalline area 341a is formed in the fourth polycrystalline area 341.

The crystalline structure of the third crystalline areas 321a and 341a has lower crystallinity than the crystalline structure of the second crystalline areas 321 and 341.

Because the third crystalline areas 321a and 341a are formed using a pico-second (ps) scale laser, having an extremely short laser irradiation time, a re-crystallization time is reduced compared to the second crystalline areas 321 and 341, which are formed using a nano-second (ns) scale laser, and thus the third crystalline areas 321a and 341a have reduced crystallinity. As a result, the grains in the third crystalline areas 321a and 341a are smaller than the grains in the second crystalline areas 321 and 341.

In addition, the third crystalline areas 321a and 341a are formed in the depth direction from the surface of the semiconductor layer 302 to the protective-film layer 202. The depth of the third crystalline areas 321a and 341a is tens of nanometers, which is much smaller than that of the second crystalline areas 321 and 341, and the width of the third crystalline areas 321a and 341a is substantially the same as the width of the openings 40a and 40b.

Meanwhile, because the electrodes 42 and 44 are respectively connected to the first conductive area 32 and the second conductive area 34 through the openings 40a and 40b, the electrodes 42 and 44 are substantially in contact with the third crystalline areas 321a and 341a. Specifically, according to the present embodiment, the third crystalline areas 321a and 341a may have convex-concave portions on the surface thereof, and the surfaces of the first electrode 42 and the second electrode 44, which are in contact with the third crystalline areas 321a and 341a, may have a multilayered structure including two or more layers, and may include convex-concave portions corresponding to the convex-concave portions on the surfaces of the third crystalline areas 321a and 341a.

As such, in this embodiment, the first conductive area 32 and the second conductive area 34 are formed using a laser, and the first conductive area 32 and the second conductive area 34 having a crystalline structure are re-crystallized to achieve improved crystallinity, which improves the efficiency of the solar cell 100.

In another form, the openings 40a and 40b may be formed via any of various methods, such as, for example, dry etching or wet etching.

An electrode layer 400 is formed over the entire insulation film 40 so that the first opening 40a and the second opening 40b are filled with the electrode layer 400. Because the electrode layer 400 needs to be brought into contact with the first conductive area 32 through the first opening 40a, and also needs to be brought into contact with the second conductive area 34 through the second opening 40b, the electrode layer 400 is formed of a conductive material.

In one example, the electrode layer 400 may be formed using paste including aluminum (Al), or may be formed using a multilayered metal via a sputtering method.

The electrode layer 400 may be formed via, for example, plating, deposition, or sputtering. In an example form, paste including aluminum may be applied to the insulation film 40.

The electrode layer 400 is patterned so as to be brought into contact with the first conductive area 32 and the second conductive area 34. The patterning may be performed via various known methods.

In one example, the first and second electrodes 42 and 44 are formed using a laser firing contact technique. In this instance, because the first and second electrodes 42 and 44 are formed when the first and second electrodes 42 and 44 are formed, and thus no process of forming the first and second openings 40a and 40b is required.

Next, solar cells according to some embodiments of the present invention will be described with reference to FIGS. 21 and 22.

Figure 21:
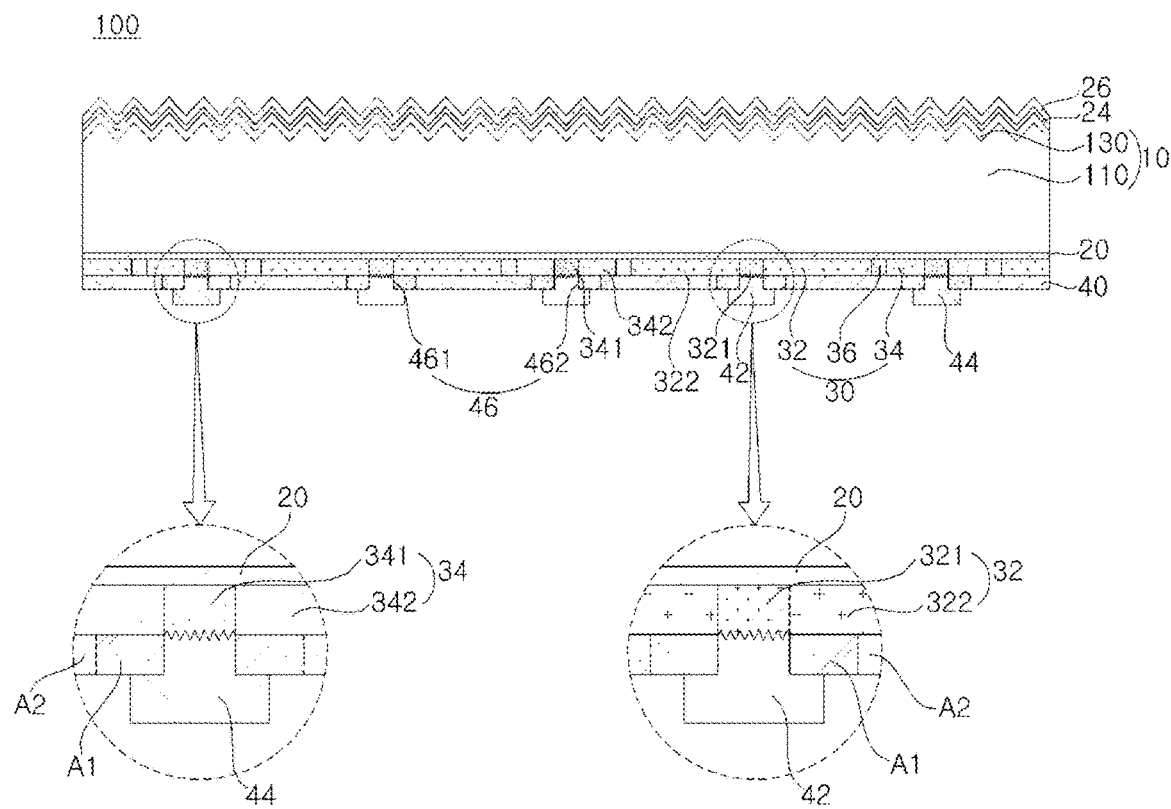
FIG. 21 is a cross-sectional view illustrating a solar cell according to an embodiment of the present invention.
Figure 22:
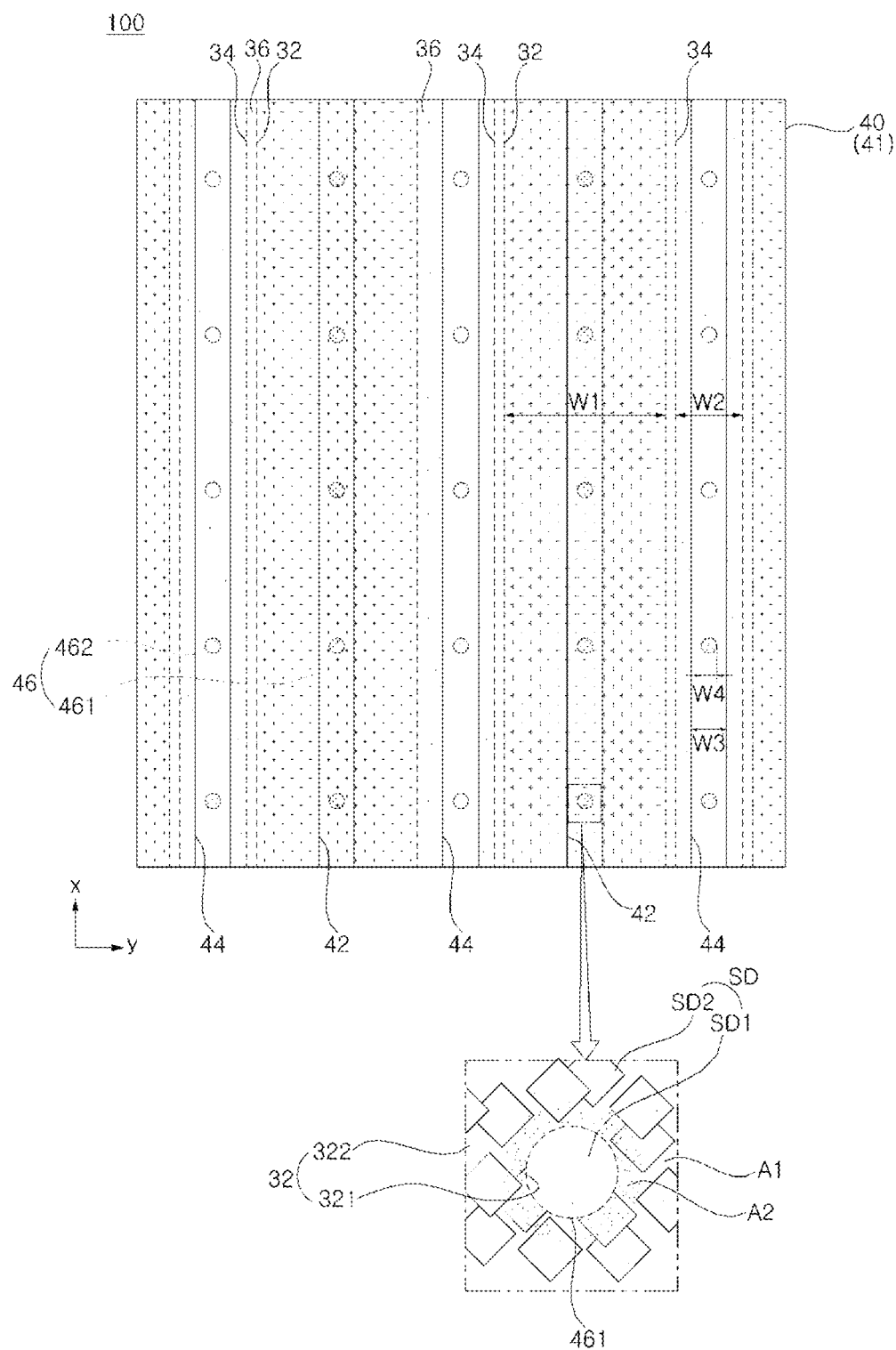
FIG. 22 is a partial rear plan view of the solar cell illustrated in FIG. 21.

FIG. 21 is a cross-sectional view illustrating a solar cell according to an embodiment of the present invention, and FIG. 22 is a partial rear plan view of the solar cell illustrated in FIG. 21. The solar cell according to the present embodiment is substantially similar to the solar cell described above with reference to FIG. 1. Thus, a repeated description thereof may be omitted.

Referring to FIGS. 21 and 22, the solar cell 100 according to the present embodiment includes the semiconductor substrate 10, the first conductive area 32 formed over the semiconductor substrate 10 and configured as a semiconductor layer of a first conductive type, the second conductive area 34 of a second conductive type, which is opposite to the first conductive type, the insulation film 40 disposed over the first conductive area 32 and having a first contact hole 461, the first electrode 42 electrically connected to the first conductive area 32 through the first contact hole 461, and the second electrode 44 electrically connected to the second conductive area 34. The first conductive area 32 includes a first portion 321 including the portion in which the first contact hole 461 is formed, and a second portion 322 located in the area excluding the first portion 321. The first portion 321 has larger surface roughness than the second portion 322, and the crystallinity of the first portion 321 may differ from the crystallinity of the second portion 322. This will be described below in more detail. In addition, the solar cell 100 may further include, for example, the front insulation film 24 and the anti-reflection film 26, which are disposed over the front surface of the semiconductor substrate 10. This will be described below in more detail.

The semiconductor substrate 10 may include a base area 110, which includes a first or second conductive dopant at a relatively low doping concentration, and thus is of a first or second conductive type.

In addition, the semiconductor substrate 10 may include the front-surface field area (or field area) 130 disposed on one surface (e.g. the front surface) of the semiconductor substrate 10. The front-surface field area 130 may be of the same conductive type as that of the base area 110 and may have a higher doping concentration than the base area 110.

The protective-film layer 20 may be formed over the other surface (e.g. the back surface) of the semiconductor substrate 10. In one example, the protective-film layer 20 may be formed to be brought into contact with the back surface of the semiconductor substrate 10, and thus may exhibit a simplified structure and improved tunneling effects. However, the present invention is not limited thereto.

The semiconductor layer 30 including the conductive areas 32 and 34 may be disposed over the protective-film layer 20. In one example, the semiconductor layer 30 may be formed to be brought into contact with the protective-film layer 20, and thus may exhibit a simplified structure and improved tunneling effects. However, the present invention is not limited thereto.

In the present embodiment, the semiconductor layer 30 may include the first conductive area 32, which includes a first conductive dopant and thus is of a first conductive type, and the second conductive area 34, which includes a second conductive dopant and thus is of a second conductive type. The first conductive area 32 and the second conductive area 34 may be located in the same plane over the protective-film layer 20. In addition, a barrier area 36 may be located between the first conductive area 32 and the second conductive area 34 in the same plane as the conductive areas 32 and 34.

At this time, the first conductive area 32 may be formed of a semiconductor (e.g. silicon) including the first conductive dopant, the conductive type of which is opposite to that of the base area 110. In addition, the second conductive area 34 may include the same second conductive dopant as that of the base area 110, but may have a higher doping concentration than the base area 110. In the present embodiment, the first and second conductive areas 32 and 34 are formed over the semiconductor substrate 10 (more accurately, over the protective-film layer 20) separately from the semiconductor substrate 10, and are respectively configured as a semiconductor layer doped with the first or second conductive dopant. Thus, the first and second conductive areas 32 and 34 may be configured as a semiconductor layer, which has a crystalline structure different from that of the semiconductor substrate 10, in order to be easily formed on the semiconductor substrate 10. For example, the first and second conductive areas 32 and 34 may be formed by doping, for example, an amorphous semiconductor layer, a microcrystalline semiconductor layer, or a polycrystalline semiconductor layer (e.g. amorphous silicon, microcrystalline silicon, or polycrystalline silicon), which may be easily manufactured via any of various methods, such as, for example, deposition, with the first or second conductive dopant. In particular, when the first and second conductive areas 32 and 34 are formed of polycrystalline silicon, the first and second conductive areas 32 and 34 may have thermal stability and excellent electrical properties. The first or second conductive dopant may be introduced into the semiconductor layer while the semiconductor layer is formed, or after the semiconductor layer is formed, via any of various doping methods, such as thermal diffusion or ion implantation.

The barrier area 36 may be formed of, for example, an undoped insulation material (e.g. an oxide or a nitride). Alternatively, the barrier area 36 may be formed of an intrinsic semiconductor. At this time, the first conductive area 32, the second conductive area 34, and the barrier area 36 may be configured as the same semiconductor layer (e.g. an amorphous silicon, microcrystalline silicon, or polycrystalline silicon layer), which is continuously formed such that the side surfaces thereof come into contact with one another. The barrier area 36 may be formed of an i-type (intrinsic) semiconductor material, which substantially includes no dopant. In one example, after a semiconductor layer is formed of a semiconductor material, an area of the semiconductor layer is doped with the first conductive dopant so as to form the first conductive area 32, and another area of the semiconductor layer is doped with the second conductive dopant so as to form the second conductive area 34, whereby the remaining area in which the first conductive area 32 and the second conductive area 34 are not formed may configure the barrier area 36. Thus, the method of manufacturing the first conductive area 32, the second conductive area 34, and the barrier area 36 may be simplified.

However, the present invention is not limited thereto. Thus, the barrier area 36 may be formed via any of various methods, so as to have any of various thicknesses and any of various shapes. The barrier area 36 may take the form of a trench that is an empty space. Various other alterations are possible. FIGS. 21 and 22 illustrate that the barrier area 36 causes the first conductive area 32 and the second conductive area 34 to be wholly spaced apart from each other. However, the barrier area 36 may be formed to cause the first conductive area 32 and the second conductive area 34 to be spaced apart from each other only along a portion of the boundary therebetween. Alternatively, no barrier area 36 may be formed so that the boundaries of the first conductive area 32 and the second conductive area 34 come into contact with each other.

In the present embodiment, the first conductive area 32 and/or the second conductive area 34 may include the first portion 321 and the second portion 322, which differ from each other in surface roughness and crystallinity. This is because the surface roughness and the crystallinity vary when a contact hole 46 is formed in the insulation film 40 through a laser etching or ablation process. This will be described below in more detail.

The insulation film 40 may be formed over the first and second conductive areas 32 and 34 and the barrier area 36 on the back surface of the semiconductor substrate 10. In one example, the insulation film 40 may be formed to be brought into contact with the first and second conductive areas 32 and 34 and the barrier area 36, and thus may have a simplified structure. However, the present invention is not limited thereto.

The insulation film 40 includes the contact hole 46 for electrical connection between the conductive areas 32 and 34 and the electrodes 42 and 44. The contact hole 46 includes the first contact hole 461 for connection between the first conductive area 32 and the first electrode 42, and a second contact hole 462 for connection between the second conductive area 34 and the second electrode 44. As such, the insulation film 40 serves to prevent the first conductive area 32 and the second conductive area 34 from being connected to the wrong electrodes (i.e. the second electrode 44 in the instance of the first conductive area 32 and the first electrode 42 in the instance of the second conductive area 34). In addition, the insulation film 40 may exert passivation effects of the first and second conductive areas 32 and 34 and/or the barrier area 36.

In addition, the front insulation film 24 and/or the anti-reflection film 26 may be disposed over the front surface of the semiconductor substrate 10 (more accurately, over the front-surface field area 130 formed on the front surface of the semiconductor substrate 10). However, the present invention is not limited thereto, and an insulation film having a different stacking structure may be formed over the front-surface field area 130.

The front insulation film 24 and the anti-reflection film 26 may substantially be formed throughout the front surface of the semiconductor substrate 10. In addition, the insulation film 40 may be formed throughout the back surface of the semiconductor layer 30 excluding the contact hole 46. In this instance, "formed throughout" includes not only physically complete formation, but also formation with inevitably excluded parts.

Hereinafter, an example of the plan shapes of the first conductive area 32, the second conductive area 34, the barrier area 36, the contact hole 46 in the insulation film 40, and the first and second electrodes 42 and 44 will be described in detail with reference to FIGS. 21 and 22.

Referring to FIGS. 21 and 22, in the present embodiment, the first conductive area 32 and the second conductive area 34 extend a long length to form stripes and are alternately arranged in the direction crossing the longitudinal direction thereof. The barrier area 36 may be located, as a spacer, between the first conductive area 32 and the second conductive area 34. In FIGS. 21 and 22, a plurality of first conductive areas 32, which are spaced apart from one another, may be interconnected at one edge thereof, and a plurality of second conductive areas 34, which are spaced apart from one another, may be interconnected at the other edge thereof. However, the present invention is not limited thereto.

At this time, the first conductive area 32 may be wider than the second conductive area 34. In one example, the areas of the first conductive area 32 and the second conductive area 34 may be adjusted by providing the first and second conductive areas 32 and 34 with different widths. That is, the width W1 of the first conductive area 32 may be greater than the width W2 of the second conductive area 34.

In addition, the first electrode 42 may be formed in a stripe shape so as to correspond to the first conductive area 32, and the second electrode 44 may be formed in a stripe shape so as to correspond to the second conductive area 34.

The present embodiment illustrates the instance where the first and second contact holes 461 and 462 are formed so as to connect only portions of the first and second electrodes 42 and 44 to the first conductive area 32 and the second conductive area 34 respectively. More specifically, a plurality of first contact holes 461 may be spaced apart from one another by a constant distance in the direction in which the first conductive area 32 extends, and a plurality of second contact holes 462 may be spaced apart from one another by a constant distance in the direction in which the second conductive area 34 extends. As such, the number or the total area of the first and second contact holes 461 and 462 may be reduced, which may minimize the time and cost of the process of forming the first and second contact holes 461 and 462.

However, the present invention is not limited thereto. The first contact holes 461 may be formed so as to partially overlap each other, and the second contact holes 462 may be formed so as to partially overlap each other. Alternatively, at least one of the first and second contact holes 461 and 462 may be elongated along the first and second conductive areas 32 and 34 so as to correspond to the entire first and second electrodes 42 and 44.

At this time, the width W3 of the electrodes 42 and 44 may be greater than the width W4 of the contact hole 46. As such, the first and second electrodes 42 and 44 may have a reduced resistance attributable to the sufficient width thereof, and alignment between the first and second conductive areas 32 and 34 and the first and second electrodes 42 and 44 may be improved.

In FIGS. 21 and 22, the first conductive areas 32, which are spaced apart from one another, may be interconnected at one edge thereof, and the second conductive areas 34, which are spaced apart from one another, may be interconnected at the other edge thereof. However, the present invention is not limited thereto.

In the present embodiment, the contact hole 46 may be formed by irradiating a local portion of the insulation film 40 with a laser so that the insulation film 40 is evaporated in the corresponding portion. The method of forming the contact hole 46 will be described later in more detail with reference to FIG. 23K. When the contact hole 46 is formed as described above, the conductive areas 32 and 34, which are close to the insulation film 40, undergo variation in properties. Thus, the first conductive area 32 includes the first portion 321, which includes the portion in which the first contact hole 461 is formed, and the second portion 322, which constitutes the remaining area excluding the first portion 321 and has surface roughness and crystallinity different from those of the first portion 321. At this time, because the first portion 321 is affected by the formation of the first contact hole 461, the first portion 321 may have the same or similar size as the first contact hole 461 (e.g. with an error of 10% or less) and may overlap the first contact hole 461. In addition, the second portion 322 may be the remaining portion excluding the first portion 321.

More specifically, the first portion 321 has larger surface roughness than the second portion 322. When the first contact hole 461 is formed using a laser, heat is transferred to the first conductive area 32. The portion of the first conductive area 32 that is melted and re-crystallized by the heat constitutes the first portion 321. Thus, because the first portion 321 is thermally melted and re-crystallized, the first portion 321 has greater surface curvature, and consequently larger surface roughness than the second portion 322.

In addition, the first portion 321 has crystallinity different from that of the second portion 322 because it is also affected by the laser when the first contact hole 461 is formed, and thus is re-crystallized under conditions different from those for the second portion 322. More specifically, the crystallinity of the second portion 322 may be lower than the crystallinity of the first portion 321.

When the second portion 322 includes a polycrystalline semiconductor, the first portion 321 may include a polycrystalline semiconductor, and the degree of crystallization of the first portion 321 may be lower than that of the second portion 322. As such, the mobility of carriers may be maintained at a high value throughout the entire first conductive area 32. However, the present invention is not limited thereto. In another example, the second portion 322 may include a polycrystalline semiconductor, and the first portion 321 may include a microcrystalline semiconductor or an amorphous semiconductor. Alternatively, when the second portion 322 includes a microcrystalline semiconductor, the first portion 321 may include an amorphous semiconductor. When both the first and second portions 321 and 322 include an amorphous semiconductor, the crystallinity of the first portion 321 may be similar to the crystallinity of the second portion 322.

In the present embodiment, the insulation film 40 includes, for example, a nitride. Therefore, in order to form the first contact hole 461, it is necessary to use a laser that is capable of etching or removing a layer including a nitride. The laser for removing the layer including the nitride has a relatively small pulse width. With a laser having such a pulse width, however, a sufficient amount of energy required for crystallization may not be supplied to the first conductive area 32. Differently, the second portion 322, which is not affected by the formation of the first contact hole 461, remains at a relatively high degree of crystallization, i.e. relatively high crystallinity because it maintains the properties of the first conductive area 32, which has been formed under conditions in which a sufficient degree of crystallization is acquired. Thus, the first portion 321 has a lower degree of crystallization, i.e. lower crystallinity than the second portion 322.

In one example, the degree of crystallization of the first portion 321 may range from 50% to 70%, and the degree of crystallization of the second portion 322 may range from 85% to 98%. The degree of crystallization of the second portion 322 is limited to the range within which the first conductive area 32 may exhibit excellent thermal stability and excellent electrical properties. When the degree of crystallization of the second portion 322 is below 85%, the first conductive area 32 may have difficulty in exhibiting excellent properties due to low mobility. In addition, it may be difficult to form the second portion 322 to have a degree of crystallization above 98%. In addition, the degree of crystallization of the first portion 321 is limited to the range within which the first contact hole 461 is stably formed in the insulation film 40 without considerably deteriorating various properties, such as, for example, the mobility of carriers, of the first portion 321. When the degree of crystallization of the first portion 321 is below 50%, the thermal stability and electrical properties of the corresponding portion may be deteriorated. In addition, when the degree of crystallization of the first portion 321 is above 70%, the pulse width of the laser used to form the first contact hole 461 needs to be increased. In this instance, for example, the nitride may not be easily removed, which may make it difficult to stably form the first contact hole 461.

Alternatively, the degree of crystallization of the first portion 321 may be greater than the degree of crystallization of the second portion 322 by 5% or more (e.g. 10% or more). This difference ensures that the first portion 321 and the second portion 322 exert sufficient effects. However, the present invention is not limited thereto.

In addition, the crystal grains in the first portion 321 may be smaller than the crystal grains in the second portion 322. This is considered to be because the heat provided to the first portion 321 by a laser is not sufficient to realize crystallization, and thus crystal grains are not grown to a large size and are irregularly arranged. For example, the ratio of the size of crystal grains (e.g. the average size of crystal grains) in the first portion 321 to the size of crystal grains (e.g. the average size of crystal grains) in the second portion 322 may range from 10% to 50%. In one example, the size of crystal grains in the first portion 321 may range from 10 nm to 1 μm. When the ratio of the size of crystal grains in the first portion 321 to the size of crystal grains in the second portion 322 is below 10%, the crystallinity of the first portion 321 may not be sufficient. When the ratio of the size of crystal grains in the first portion 321 to the size of crystal grains in the second portion 322 is above 50%, the pulse width of the laser used to form the first contact hole 461 is increased, which may make it difficult to stably form the first contact hole 461.

The degree of crystallization of the first and second portions 321 and 322 may be measured or analyzed by various methods. In one example, the degree of crystallization of the first and second portions 321 and 322 may indicate the percentage of a crystalline structure in the semiconductor layer 30 (e.g. a silicon semiconductor layer), and may be measured or analyzed using, for example, X-ray diffraction (XRD), electron backscatter diffraction (EBSD), or a RAMAN analyzer.

In addition, in the present embodiment, because the first contact hole 461 may be formed using the laser, the first portion 321 may have various properties different from those of the second portion 322. Microscopic shapes of the first portion 321 and the second portion 322 are schematically illustrated in the enlarged circle of FIG. 22.

Referring to the enlarged circles of FIGS. 21 and 22, when observed in the presence of illumination (in particular, using a microscope), in the present embodiment, a saw damage mark SD2 of the second portion 322 is seen to be deeper than a saw damage mark SD1 of the first portion 321. The semiconductor substrate 10 is formed by cutting a semiconductor ingot, and at this time, the saw damage marks SD1 and SD2 remain on the semiconductor substrate 10. Because the properties of a semiconductor device greatly depend on the properties of the semiconductor substrate, a very high-quality semiconductor substrate having no saw damage marks is used in the semiconductor device. On the other hand, in the solar cell 100, because the properties or efficiency of the solar cell 100 are not greatly affected by the saw damage marks SD1 and SD2, using the semiconductor substrate 10 having the saw damage marks SD1 and SD2 may reduce costs. Thus, when the semiconductor substrate 10 of the solar cell 100 includes the saw damage marks SD1 and SD2, because the portion of the first conductive area 32 that is melted and re-crystallized by a laser undergoes variation in crystallinity, the saw damage marks SD1 and SD2 are seen at different degrees. That is, the saw damage mark SD2 may be clearly and deeply seen in the second portion 322, which has relatively high or excellent crystallinity, and the saw damage mark SD1 may be seen to be blurry or may not be clearly visible in the first portion 321, which has low crystallinity.

In addition, the portion of the solar cell 100 including the first portion 321 may be seen to be brighter than the portion including the second portion 322. This is because the insulation film 40 is removed from the first portion 321. At this time, a first area A1, which corresponds to a portion of the second portion 322 close to the first portion 321 or a portion of the insulation film 40, may be seen to be brighter than a second area A2, which corresponds to the remaining portion of the second portion 322 or the insulation film 40. More specifically, the first area A1 may have a predetermined width and may be seen to be brighter than the second area A2. This is considered to be because the insulation film 40 close to the first contact hole 461 undergoes variation in thickness or properties when the first contact hole 461 is formed, whereby the corresponding portion is seen to be brighter than the remaining portion.

Meanwhile, in the present embodiment, the second conductive area 34 includes a first portion 341 including the portion in which the second contact hole 462 is formed, and a second portion 342 located in the area excluding the first portion 341. The description of the first contact hole 461, the first portion 321 and the second portion 322 of the first conductive area 32 may be applied to the second contact hole 462, the first portion 341 and the second portion 342 of the second conductive area 34, and thus a detailed description of the second contact hole 462, the first portion 341 and the second portion 342 of the second conductive area 34 is omitted. At this time, the first portions 321 and 341 of the first and second conductive areas 32 and 34 may have the same or similar properties (e.g. surface roughness or crystallinity), and the second portions 322 and 342 of the first and second conductive areas 32 and 34 may have the same or similar properties. This is because the first and second conductive areas 32 and 34 or the second portions 322 and 342 are included in the semiconductor layer 30, which is formed through a single process, to thereby be irradiated with the same or similar laser, and the first portions 321 and 341 are also irradiated with the same or similar laser so as to form the first and second contact holes 461 and 462.

When the first portions 321 and 341, which correspond to the contact hole 46, have larger surface roughness than the second portions 322 and 342, the electrodes 42 and 44, which are connected to (e.g. in contact with) the first portions 321 and 341 through the contact hole 46, also have large surface roughness. Thus, the surfaces of the electrodes 42 and 44 may reflect light, which penetrates the semiconductor substrate 10 and is directed to the back surface, to enable the reuse of light. In addition, such large surface roughness may maximize the contact area between the first portions 321 and 341 and the electrodes 42 and 44, thereby improving bonding properties.

In addition, in the present embodiment, the surface roughness of the barrier area 36 may be smaller than the surface roughness of the first portions 321 and 341 and may be larger than the surface roughness of the second portions 322 and 342. In addition, the crystallinity of the barrier area 36 may be higher than the crystallinity of the first portions 321 and 341 and lower than the crystallinity of the second portions 322 and 342. In one example, when the semiconductor layer 30 is formed of a polycrystalline semiconductor, the degree of crystallization of the barrier area 36 may be higher than the degree of crystallization of the first portions 321 and 341 and lower than the degree of crystallization of the second portions 322 and 342. In addition, the crystal grains in the barrier area 36 may be larger than the crystal grains in the first portions 321 and 341 and smaller than the crystal grains in the second portions 322 and 342.

In the present embodiment, before the contact hole 46 is formed, heat generated by a laser may be supplied to the entire first and second conductive areas 32 and 34 when a doping process (see FIG. 23F) is performed on the first and second conductive areas 32 and 34, or when a mask layer for doping (see reference numeral 340 in FIG. 23G) is patterned. At this time, the mask layer 340 includes a material that may be easily patterned by a laser (e.g. a carbide, such as a silicon carbide). Thus, the laser used to perform the doping process or to pattern the mask layer 340 has a larger pulse width than the laser used to form the contact hole 46 in the insulation film 40. As such, a relatively large amount of heat may be supplied to the first and second conductive areas 32 and 34, which may facilitate the crystallization of the first and second conductive areas 32 and 34. At this time, because the large amount of heat ensures the sufficient generation and growth of crystal grains, the degree of crystallization of the first and second conductive areas 32 and 34 may be higher than the degree of crystallization of the barrier area 36, and the crystal grains in the first and second conductive areas 32 and 34 may be larger than the crystal grains in the barrier area 36. In addition, the surface roughness of the first and second conductive areas 32 and 34 is smaller than that of the barrier area 36. When the contact hole 46 is formed in this state, although the first and second conductive areas 32 and 34, which have a high degree of crystallization, i.e. high crystallinity, or small surface roughness, as described above, remain in the second portions 322 and 342 in which no contact hole 46 is formed, the portion in which the contact hole 46 is formed forms the first portions 321 and 341, which have a lower degree of crystallization, i.e. lower crystallinity than the barrier area 36. Thus, the first portions 321 and 341 have smaller surface roughness than the barrier area 36.

The above description illustrates the instance where the first and second conductive areas 32 and 34 and the barrier area 36 include a polycrystalline semiconductor. However, the present invention is not limited thereto. In another example, the second portion 322 may include a polycrystalline semiconductor, and the first portion 321 and the barrier area 36 may include a microcrystalline semiconductor or an amorphous semiconductor. When the first portions 321 and 341 and the barrier area 36 include a microcrystalline semiconductor, the barrier area 36 may have crystallinity superior to that of the first portions 321 and 341. Alternatively, when the second portion 322 includes a microcrystalline semiconductor, the first portion 321 and the barrier area 36 may include an amorphous semiconductor. When the first and second portions 321 and 322 and the barrier area 36 include an amorphous semiconductor, the first and second portions 321 and 322 and the barrier area 36 may have similar crystallinities.

As such, in the present embodiment, the second portions 322 and 342 of the first and second conductive areas 32 and 34, which directly participate in photoelectric conversion, may have crystallinity superior to that of the barrier area 36. In addition, the first portions 321 and 341 of the first and second conductive areas 32 and 34, which are connected to the electrodes 42 and 44, may have large surface roughness, which may improve the reflectance and bonding of the electrodes 42 and 44.

When light is introduced into the solar cell 100 according to the present embodiment, electrons and holes are produced via photoelectric conversion at a pn junction formed between the base area 110 and the first conductive area 32, and the produced electrons and holes move to the first conductive area 32 and the second conductive area 34 via tunneling through the protective-film layer 20, and thereafter move to the first and second electrodes 42 and 44. Thereby, electricity is generated.

In addition, the first portions 321 and 341 corresponding to the contact hole 46 may have larger surface roughness than the second portions 322 and 342, whereby the reflectance of the electrodes 42 and 44 may be improved and the bonding of the electrodes 42 and 44 may be improved. In addition, the second portions 322 and 342 in which no contact hole 46 is formed may have a high degree of crystallization, i.e. high crystallinity, thus having high mobility and excellent electrical properties. Thus, the efficiency of the solar cell 100 may be improved.

The above description illustrates the instance where the first conductive area 32 and the second conductive area 34 are disposed together over the same protective-film layer 20 so as to be covered with the insulation film 40. However, the present invention is not limited thereto. Alternative embodiments thereof will be described below with reference to FIGS. 25 and 26.

In addition, FIGS. 21 and 22 illustrate the instance where no textured structure is disposed on the back surface of the semiconductor substrate 10 on which the first and second conductive areas 32 and 34 have been formed. However, the present invention is not limited thereto, and a textured structure may be disposed on the back surface of the semiconductor substrate 10. In this instance, unlike the above description, the first portions 321 and 341 may have uneven surfaces, and the second portions 322 and 342 may have larger surface roughness than the first portions 321 and 341, but may have relatively regular convex-concave portions depending on a particular crystalline surface.

A method of manufacturing the solar cell 100 having the above-described structure will be described below in detail with reference to FIGS. 23A to 23L. FIGS. 23A to 23L are cross-sectional views illustrating the method of manufacturing the solar cell according to an embodiment of the present invention.

Figure 23A:
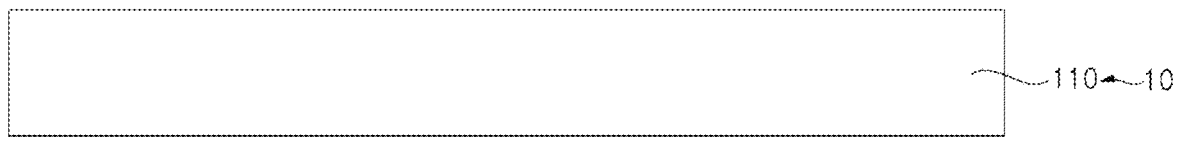
FIGS. 23A to 23L are cross-sectional views illustrating a method of manufacturing a solar cell according to an embodiment of the present invention.

First, as illustrated in FIG. 23A, the semiconductor substrate 10, which includes the base area 110 including a second conductive dopant, is prepared.

Figure 23B:

Subsequently, as illustrated in FIG. 23B, the protective-film layer 20 is formed on the surface of the semiconductor substrate 10. The protective-film layer 20 may be formed on the entire back surface of the semiconductor substrate 10.

In this instance, the protective-film layer 20 may be formed via, for example, thermal growth, deposition (e.g. Plasma Enhanced Chemical Vapor Deposition (PECVD) or Atomic Layer Deposition (ALD)), or chemical oxidation. However, the present invention is not limited thereto, and the first protective-film layer 20 may be formed via any of various methods.

Subsequently, as illustrated in FIGS. 23C to 23G, the first conductive area 32, the second conductive area 34, and the front-surface field area 130 are formed on the protective-film layer 20. Then, a textured structure may be formed on the front surface of the semiconductor substrate 10. This will be described below in detail.

Figure 23C:
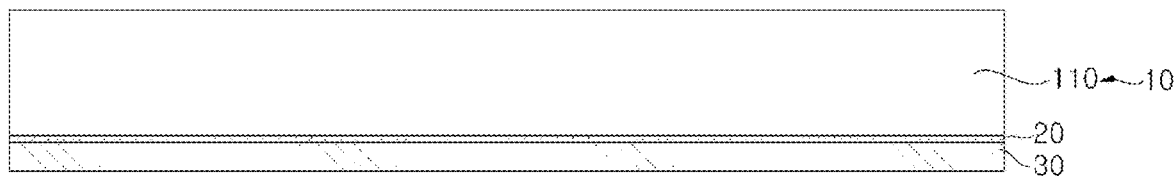

As illustrated in FIG. 23C, the semiconductor layer 30 is formed over the protective-film layer 20. The semiconductor layer 30 may be formed of a microcrystalline, amorphous, or polycrystalline semiconductor. The semiconductor layer 30 may be formed via, for example, thermal growth or deposition (e.g. Low Pressure Chemical Vapor Deposition (LPCVD)). However, the present invention is not limited thereto, and the semiconductor layer 30 may be formed via any of various methods. At this time, the semiconductor layer 30 may be formed using a polycrystalline semiconductor having high crystallinity. In one example, the degree of crystallization of the semiconductor layer 30 may range from 80% to 98% (e.g. within a range from 85% to 98%).

Figure 23D:
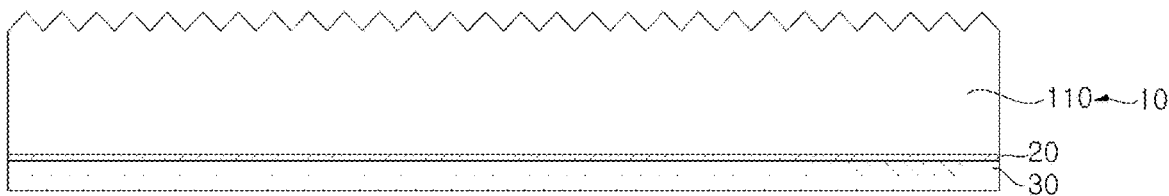

Subsequently, as illustrated in FIG. 23D, the front surface of the semiconductor substrate 10 may be subjected to texturing, so as to have convex-concave portions. The texturing performed on the surface of the semiconductor substrate 10 may be wet texturing or dry texturing. Wet texturing may be performed by dipping the semiconductor substrate 10 into a texturing solution, and advantageously has a short processing time. Dry texturing is the process of grinding the surface of the semiconductor substrate 10 using, for example, a diamond grill or a laser, and may disadvantageously entail a long processing time and the potential for damage to the semiconductor substrate 10, although it may form even convex-concave portions. In addition, the semiconductor substrate 10 may be textured via, for example, Reactive Ion Etching (RIE). As such, in the present invention, the semiconductor substrate 10 may be textured via any of various methods.

The present embodiment illustrates the instance where the front surface of the semiconductor substrate 10 is textured after the semiconductor layer 30 is formed. However, the present invention is not limited thereto. Thus, the surface of the semiconductor substrate 10 may be textured before the semiconductor layer 30 is formed, or in another process.

Subsequently, as illustrated in FIGS. 23E to 23L, the first conductive area 32, the second conductive area 34, and the barrier area 36 are formed in the semiconductor layer 30. For example, an area of the semiconductor layer 30 corresponding to the first conductive area 32 may be doped with a first conductive dopant via any of various methods such as, for example, ion implantation, thermal diffusion, or laser doping, and an area of the semiconductor layer 30 corresponding to the second conductive area 34 may be doped with the second conductive dopant via any of various methods such as, for example, ion implantation, thermal diffusion, or laser doping. As such, the area located between the first conductive area 32 and the second conductive area 34 configures the barrier area 36.

Then, the front surface of the semiconductor substrate 10 is doped with the second conductive dopant so as to form the front-surface field area 130. The front-surface field area 130 may be formed via any of various methods such as, for example, ion implantation, thermal diffusion, or laser doping. Various other methods may be used. Alternatively, the front-surface field area 130 may be formed by doping the front surface of the semiconductor substrate 10 with the second conductive dopant when the semiconductor layer 30 is doped with the second conductive dopant in order to form the second conductive area 34.

In one example, one of the first and second conductive areas 32 and 34 may be formed by forming a dopant layer 320, which includes the first or second conductive dopant, over the semiconductor layer 30, and selectively introducing the first or second conductive dopant of the dopant layer 320 into the semiconductor substrate 10 via laser doping using a laser 302 or 304. Then, the other one of the first and second conductive areas 32 and 34 may be formed via ion implantation or thermal diffusion of the first or second conductive dopant using the mask layer 340, which includes an opening 340a. Hereinafter, an example in which the first conductive area 32 is formed via laser doping and the second conductive area 34 is formed using the mask layer 340 will be described. As such, the front-surface field area 130 may be formed when the second conductive area 34 is formed, which may simplify processing.

Figure 23E:
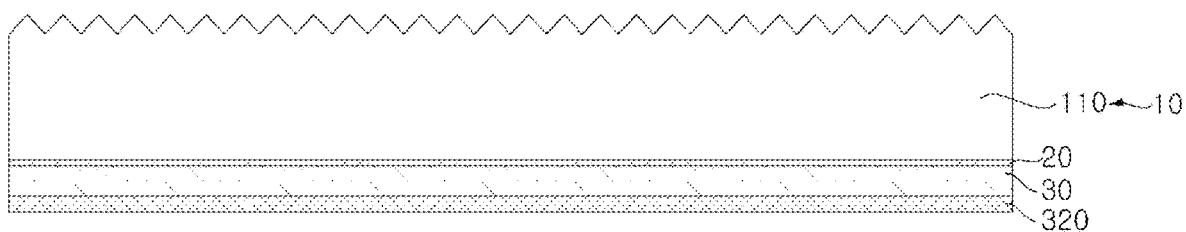
Figure 23F:
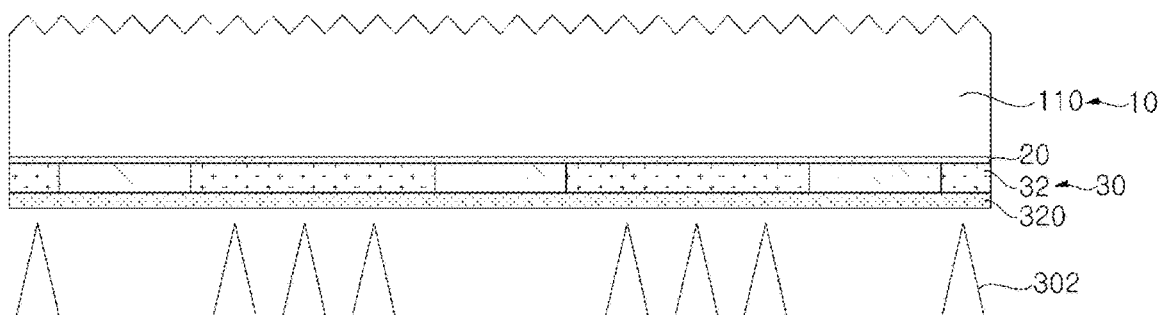

As illustrated in FIGS. 23E and 23F, the dopant layer 320 including the first conductive dopant is formed over the semiconductor layer 30, and a portion of the dopant layer 320 corresponding to the first conductive area 32 is selectively irradiated with the laser 302 to perform a laser doping process. As such, the first conductive dopant included in the dopant layer 320 diffuses into the semiconductor layer 30 so as to form the first conductive area 32.

The dopant layer 320 may be formed of any of various materials including the first conductive dopant. In one example, the dopant layer 320 may be formed of a semiconductor (e.g. silicon) including the first conductive dopant. At this time, when the dopant layer 320 has an amorphous structure, the dopant layer 320 may include a sufficient amount of first conductive dopant. In addition, the dopant layer 320 having an amorphous structure may have a high coefficient of absorption of light, and may thus reduce the strength of light passing therethrough, thereby minimizing the effect of the laser 302 on the semiconductor layer 30 or the protective-film layer 20. When the dopant layer 320 includes the same semiconductor material as the semiconductor material included in the semiconductor layer 30, the dopant layer 320 may be formed by changing, for example, reaction gas or temperature in the process of forming the semiconductor layer 30. Thus, the semiconductor layer 30 and the dopant layer 320 may be formed through successive processes, i.e. an in-situ process. However, the present invention is not limited thereto. Thus, the dopant layer 320 may be formed of, for example, boron, silicate glass, or phosphor silicate glass, or may be formed of any of various other materials.

In one example, the thickness of the dopant layer 320 may range from 30 nm to 50 nm. When the thickness of the dopant layer 320 is below 30 nm, the laser 302 may have an excessive effect on the semiconductor layer 30 or the protective-film layer 20, causing deterioration in properties. When the thickness of the dopant layer 320 is above 50 nm, it may be difficult to effectively diffuse the dopant into the semiconductor layer 30. However, the present invention is not limited as to the thickness of the dopant layer 320.

The laser 302 may be a laser capable of sufficiently diffusing the first conductive dopant in the portion of the semiconductor layer 30 corresponding to the first conductive area 32. In one example, an ultraviolet laser may be used as the laser 302. This is because ultraviolet laser radiation may be absorbed by a nanometer-scale film. For reference, because green laser radiation may be absorbed by a micrometer-scale film, the semiconductor layer 30 or the protective-film layer 20 may be damaged when a green laser is used as a laser for doping. In addition, a pulse-type laser, i.e. a laser having a nanometer-scale pulse width (i.e. within a range from 1 nm to 999 nm) may be used. A laser having such a nanometer-scale pulse width may supply a sufficient amount of heat to the dopant layer 320 and the semiconductor layer 30, and therefore re-crystallization may occur in the portion of the semiconductor layer 30 that is irradiated with the laser. When a sufficient amount of heat is supplied, sufficient crystallization is realized in the corresponding portion of the semiconductor layer 30 (i.e. in the first conductive area 32). Therefore, the first conductive area 32 has a higher degree of re-crystallization and includes larger crystal grains than the portion of the semiconductor layer 30 in which the first conductive area 32 is not formed.

In one example, the pulse width of the laser 302 may range from 80 ns to 100 ns. This pulse width is limited to the range within which the dopant may be effectively diffused and within which the properties of the first conductive area 32 may be improved via re-crystallization. However, the present invention is not limited thereto.

After the laser doping process is completed, the dopant layer 320 is removed. The method of removing the dopant layer 320 may be any of known methods. In one example, the dopant layer 320 may be removed via wet etching using, for example, an alkaline solution, or dry etching, such as reactive ion etching.

Figure 23G:
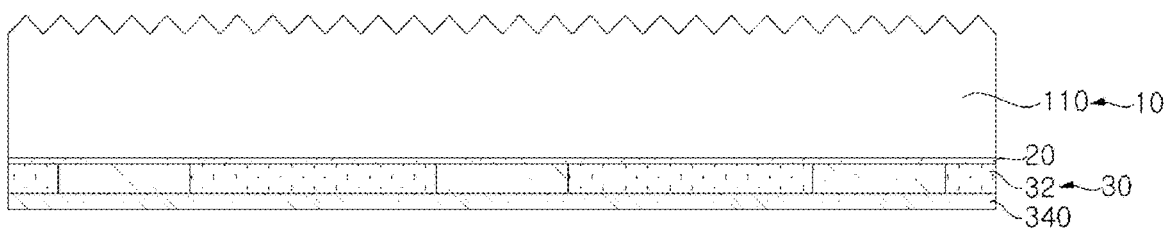
Figure 23H:
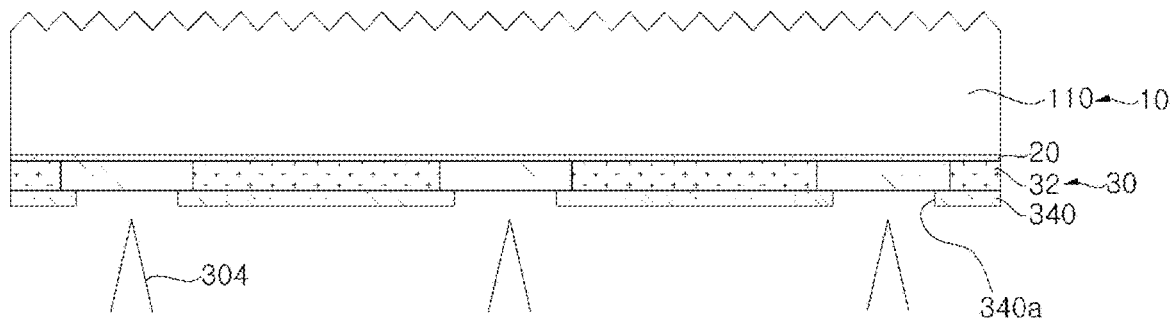

Subsequently, as illustrated in FIG. 23G, the mask layer 340 is formed over the semiconductor layer 30 including the first conductive area 32, and as illustrated in FIG. 23H, the opening 340a corresponding to the second conductive area 34 is formed in the mask layer 340. At this time, the opening 340a may be formed via laser ablation using the laser 304.

The mask layer 340 may be formed of any of various materials, which may prevent diffusion of the second conductive dopant. In one example, the mask layer 340 may be a silicon carbide film including a silicon carbide (SiC). When the mask layer 340 is configured as a silicon carbide film, the mask layer 340 may effectively prevent diffusion of the dopant, may be easily patterned by the laser 304, and may be easily removed after processing.

The laser 304 for forming the opening 340a in the mask layer 340 may be a laser that is similar to the laser 302 used in the laser doping process for forming the first conductive area 32. That is, the laser 304 may be an ultraviolet laser. In addition, the laser 304 may be a pulse-type laser, which has a nanometer-scale pulse width (i.e. within a range from 1 nm to 999 nm). However, the pulse width of the laser 304 used to form the opening 340a may be slightly greater than the pulse width of the laser 302 used to form the first conductive area 32. This serves to transfer a higher temperature of heat to the mask layer 340 so as to melt and evaporate a portion of the mask layer 340. In one example, the pulse width of the laser 304 may range from 160 ns to 200 ns. This pulse width is limited to the range within which the laser may form the opening 340a in the mask layer 340 and may improve the properties of the second conductive area 34. However, the present invention is not limited thereto.

The laser 304, which has a nanometer-scale pulse width as described above, may supply a sufficient amount of heat to the semiconductor layer 30, whereby re-crystallization may occur in the portion of the semiconductor layer 30 irradiated with the laser. Because the corresponding portion of the semiconductor layer 30 (i.e. the second conductive area 34) is crystallized when such a sufficient amount of heat is supplied, the second conductive area 34 has a higher degree of re-crystallization and includes larger crystal grains than the portion of the semiconductor layer 30 in which the first and second conductive areas 32 and 34 are not formed (i.e. the barrier area 36).

Figure 23I:
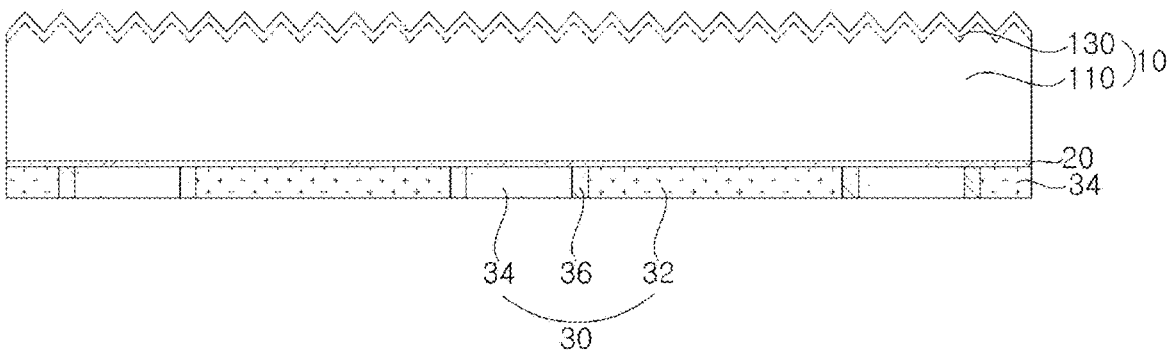

Subsequently, as illustrated in FIG. 23I, the second conductive area 34 is formed by diffusing the second conductive dopant through the opening 340a, and the mask layer 340 is removed. Any of various methods, such as thermal diffusion or ion implantation, may be used to diffuse the second conductive dopant. At this time, when the second conductive dopant is diffused by thermal diffusion, the front-surface field area 130 may also be formed on the front surface of the semiconductor substrate 10 simultaneously with the formation of the second conductive area 34.

In the present embodiment, the first conductive area 32 is crystallized in the laser doping process, and the second conductive area 34 is crystallized in the patterning process of forming the opening 340a. Thus, the first and second conductive areas 34 may have a higher degree of crystallization and may include larger crystal grains than the barrier area 36, which is not irradiated with a laser.

Figure 23J:
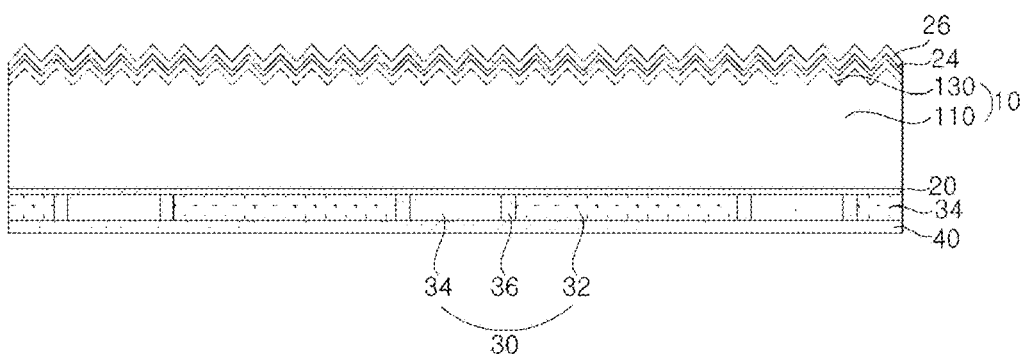

Subsequently, as illustrated in FIG. 23J, the front insulation film 24 and the anti-reflection film 26 are sequentially formed on the front surface of the semiconductor substrate 10, and the insulation film 40 is formed on the back surface of the semiconductor substrate 10. The front insulation film 24, the anti-reflection film 26, or the insulation film 40 may be formed via any of various methods, such as, for example, chemical vapor deposition, vacuum deposition, spin coating, screen printing, or spray coating. In particular, the front insulation film 24, the anti-reflection film 26, or the insulation film 40 may be formed via chemical vapor deposition.

Figure 23K:
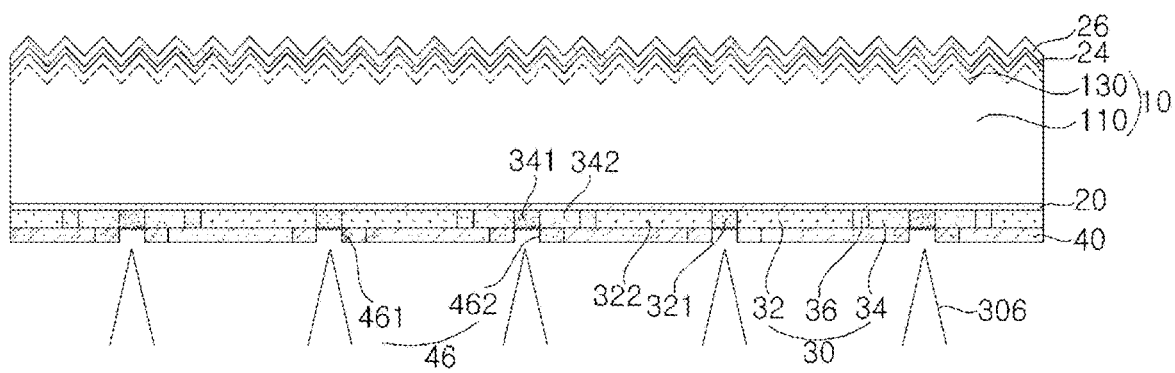

Subsequently, as illustrated in FIG. 23K, the contact hole 46 is formed in the insulation film 40. In the present embodiment, the contact hole 46 may be formed via laser ablation by irradiating the corresponding portion of the insulation film 40 with a laser 306.

The laser 306 may be any laser capable of forming the contact hole 46 in the insulation film 40. In one example, the laser 306 may be an ultraviolet laser. This is because ultraviolet laser radiation may be absorbed by a nanometer-scale film. In addition, the laser 306 may be a pulse-type laser, i.e. a laser having a picometer-scale pulse width (i.e. within a range from 1 pm to 999 pm) or having an output of 0.5 W to 2 W. This is because it may be difficult to form the contact hole 46 in the insulation film 40 formed of a nitride when the laser 306 has a nanometer-scale pulse width.

The laser 306 having such a picometer-scale pulse width may form the contact hole 46 by supplying heat at a high strength for a short time. In one example, the laser 306 may have a pulse width of 1 pm or 100 pm. This pulse width is limited to the range within which the laser may stably form the contact hole 46 in the insulation film 40 formed of a predetermined material. However, the present invention is not limited thereto.

Figure 24:
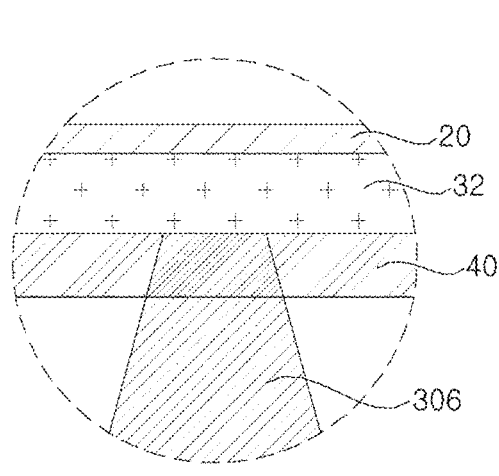
FIG. 24 is a view illustrating the principle of forming a contact hole in an insulation film by a laser.
Figure 24:
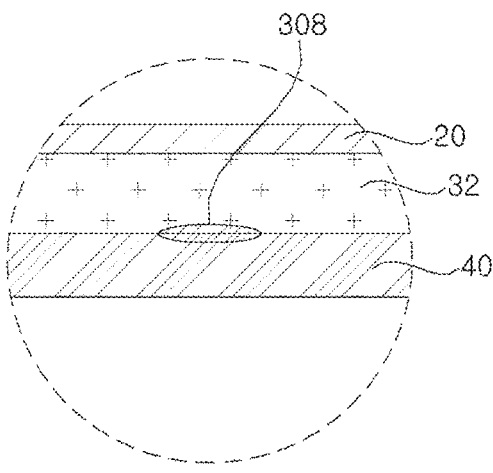
Figure 24:
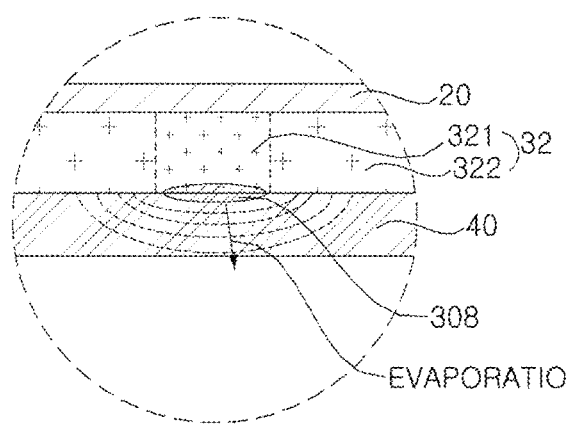
Figure 24:
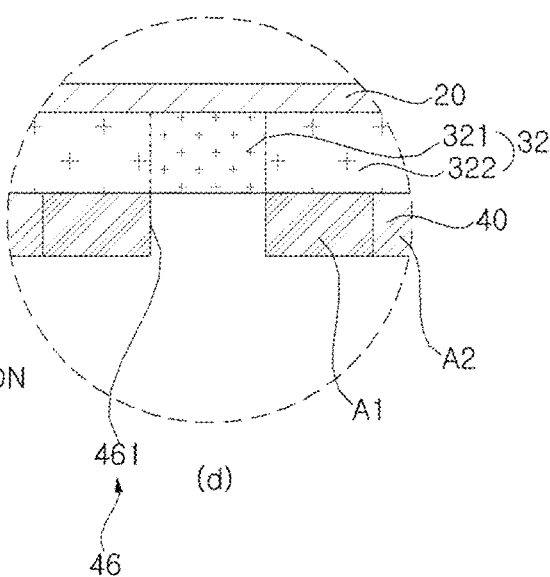

When the insulation film 40 is irradiated with the laser in order to form the contact hole 46, the contact hole 46 is formed based on the principle illustrated in FIG. 24. First, when the insulation film 40 is irradiated with the laser 306 as illustrated in (a) of FIG. 24, the corresponding portion of the insulation film 40 absorbs heat as illustrated in (b) of FIG. 24, and the insulation film 40 is melted and evaporated as illustrated in (c) of FIG. 24, whereby the contact hole 46 is formed as illustrated in (d) of FIG. 24.

At this time, because the laser 306 has a picometer-scale pulse width, a relatively small amount of heat is supplied to the portion of the semiconductor layer 30 corresponding to the contact hole 46. As such, the first portions 321 and 341 of the semiconductor layer 30, corresponding to the contact hole 46, are changed to thus have properties different from those of the second portions 322 and 342. More specifically, when the first portions 321 and 341 are melted and crystallized, some portions of the first portions 321 and 341 may not be re-crystallized because a sufficient amount of heat is not supplied thereto. Thus, the first portions 321 and 341 corresponding to the contact hole 46 have a lower degree of crystallization and include larger crystal grains than the second portions 322 and 342, which maintain the original properties of the first and second conductive areas 32 and 34. At this time, the first portions 321 and 341 corresponding to the contact hole 46, have a lower degree of crystallization, i.e. lower crystallinity, and include smaller crystal grains than the barrier area 36, which is not irradiated with a laser during laser doping or patterning. This is because the heat supplied by the laser 306 is not sufficient for crystallization.

In addition, because the semiconductor layer 30 is melted and re-crystallized such that some portions thereof are crystallized but some portions thereof are not crystallized, the first portions 321 and 341 have larger surface roughness than the second portions 322 and 342 and the barrier area 36. In addition, it can be seen that the saw damage marks (see reference numerals SD1 and SD2 of FIG. 2) of the semiconductor substrate 10 may be different due to variation in the crystallinity of the first portions 321 and 341, and some of the properties of the insulation film 40 may vary in the first area A1, which corresponds to a portion of the insulation film 40 or the second portions 322 and 342, which are close to the first portions 321 and 341, whereby the first area A1 may be seen to be brighter than the second area A2, which corresponds to the remaining portion of the insulation film 40 or the second portions 322 and 342.

Figure 23L:
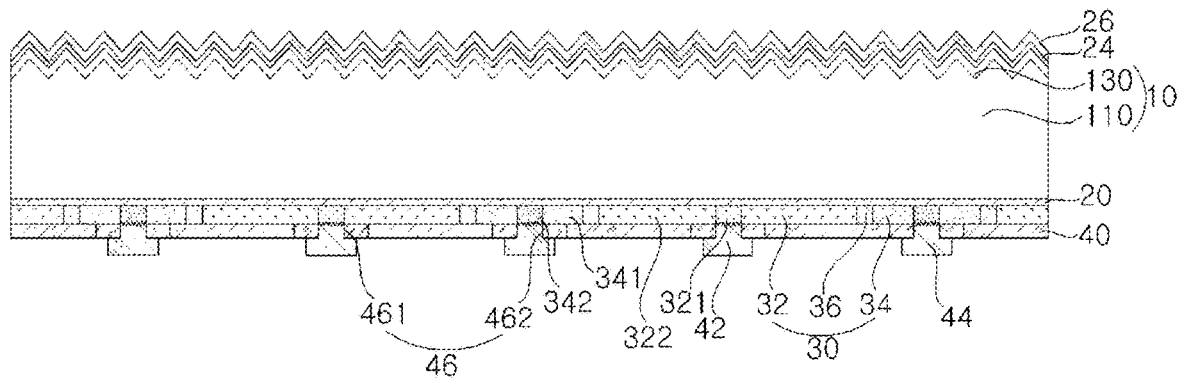

Subsequently, as illustrated in FIG. 23L, the contact hole 46 is filled with the first and second electrodes 42 and 44.

A plurality of electrode layers are formed in sequence throughout the conductive areas 32 and 34 and the insulation film 40 via, for example, sputtering or plating, and are then patterned to form the first and second electrodes 42 and 44. The patterning may be performed using, for example, an etchant or etching paste, or performed via dry etching. Alternatively, the electrodes 42 and 44 may be formed over the conductive areas 32 and 34 to have a desired pattern so that the contact hole 46 is filled with the electrodes 42 and 44.

With the manufacturing method described above, the solar cell 100 having excellent efficiency may be manufactured via simplified processing, which may improve the productivity of the solar cell 100. In particular, forming the contact hole 46 using the laser 306 enables easy and rapid formation of the contact hole 46. In the instance where the first and second electrodes 42 and 44 are disposed together on the back surface of the semiconductor substrate 10 as in the present embodiment, forming the contact hole 46 using the laser 306 may greatly increase, for example, a degree of freedom of design.

Hereinafter, a solar cell and a method of manufacturing the same according to another embodiment of the present invention will be described in detail. A detailed description of the same or extremely similar parts as those of the above description will be omitted, and only different parts will be described in detail. In addition, the above-described embodiment and alternative embodiments thereof and the following embodiments and alternative embodiments thereof may be combined with one another, and this combination falls within the scope of the present invention.

Figure 25:
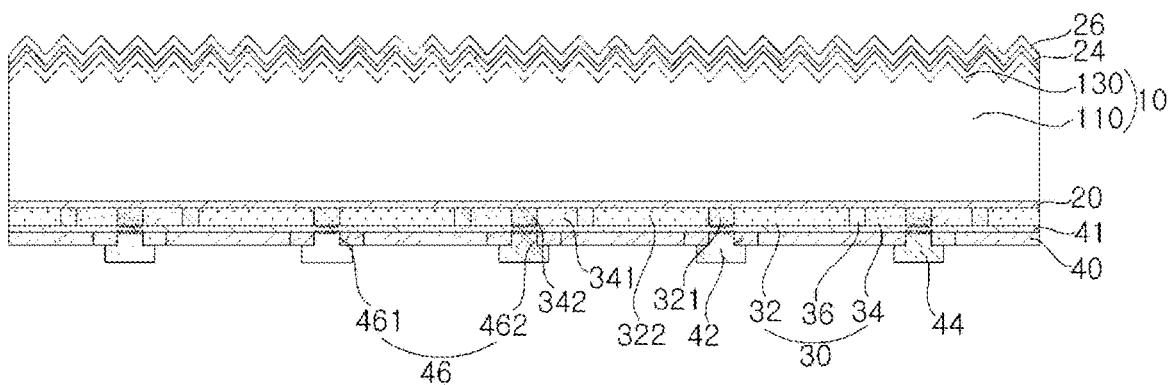
FIG. 25 is a cross-sectional view illustrating a solar cell according to another embodiment of the present invention.

FIG. 25 is a cross-sectional view illustrating a solar cell according to another embodiment of the present invention.

Referring to FIG. 25, in the present embodiment, an intermediate insulation film 41 may be disposed between the semiconductor layer 30 and the insulation film 40. The intermediate insulation film 41 disposed between the semiconductor layer 30 and the insulation film 40 may prevent a laser (see reference numeral 306 in FIG. 23K) having an excessive effect on the semiconductor layer 30 (i.e. the first and second conductive areas 32 and 34) when the contact hole 46 is formed using the laser 306. In addition, the intermediate insulation film 41 may be disposed over the entire semiconductor layer 30 to improve a passivation property of the semiconductor layer 30.

In this instance, the electrodes 42 and 44 may be electrically connected to the conductive areas 32 and 33 with the intermediate insulation film 41 interposed therebetween. The intermediate insulation film 41 may be formed of an oxide film (e.g. a silicon oxide film), which may improve a passivation property without deteriorating electrical properties between the electrodes 42 and 44 and the conductive areas 32 and 34. The thickness of the intermediate insulation film 41 may be equal to or less than the thickness of the protective-film layer 20 so as to reduce low contact resistance between the electrodes 42 and 44 and the conductive areas 32 and 34. However, the present invention is not limited thereto, and for example, the material and thickness of the intermediate insulation film 41 may be altered in various ways.

Figure 26:
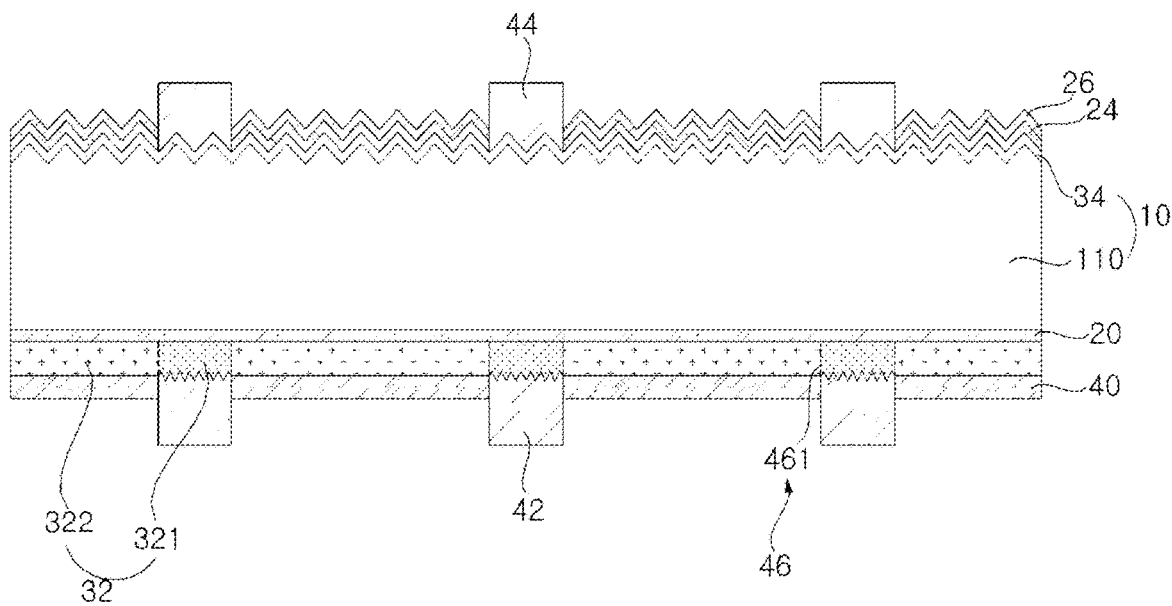
FIG. 26 is a cross-sectional view of a solar cell according to another embodiment of the present invention.

FIG. 26 is a cross-sectional view of a solar cell according to another embodiment of the present invention.

Referring to FIG. 26, in the present embodiment, the first conductive area 32 and the second conductive area 34 may be formed on different surfaces of the semiconductor substrate 10. FIG. 26 illustrates the instance where the second conductive area 34 is doped with a dopant, which is different from a dopant in the base area 110 of the semiconductor substrate 10, at a higher doping concentration than the base area 110. However, the present invention is not limited thereto, and the second conductive area 34 may be a semiconductor layer including an amorphous, microcrystalline or polycrystalline semiconductor, which is formed separately from the semiconductor substrate 10. At this time, another protective-film layer may be disposed, or may not be disposed between the second conductive area 34 and the semiconductor substrate 10.

In addition, although FIG. 26 illustrates the instance where the protective-film layer 20, the first conductive area 32 and the first electrode 42 are disposed on the back surface of the semiconductor substrate 10, the protective-film layer 20, the first conductive area 32 and the second electrode 44 may be disposed on the front surface of the semiconductor substrate 10. At this time, the second conductive area 34 may be disposed on the front surface of the semiconductor substrate 10 in the same manner as the first conductive area 32, or may be disposed on the back surface of the semiconductor substrate 10, unlike the first conductive area 32. Various other alterations are possible.

Figure 27:
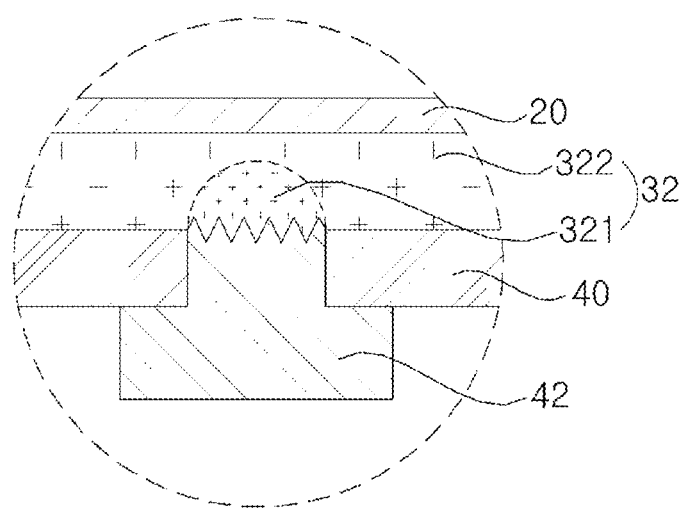
FIG. 27 is a partially enlarged sectional view illustrating a solar cell according to another embodiment of the present invention.

FIG. 27 is a partially enlarged sectional view illustrating a solar cell according to another embodiment of the present invention.

In the above-described embodiment, the first portion 321 is formed in the thickness direction of the first conductive area 32 to extend between the first conductive area 32 and the protective-film layer 20. Referring to FIG. 27, in the present embodiment, the first portion 321 is formed in a portion of the first conductive area 32 in the thickness direction of the first conductive area 32. At this time, the first portion 321 may be located close to the first electrode 42. Such a structure may be formed when the laser 306 has no effect on the first conductive area 32 in the thickness direction. As such, although the first portion 321 is formed near the surface of the electrodes 42 and 44, which determines the reflectance and contact resistance of the electrodes 42 and 44, the first conductive area 32, which have excellent electrical properties and mobility, may remain below the first portion 321. Although FIG. 27 illustrates the second portion 322 as being located below the first portion 321, the present invention is not limited thereto. A third portion, which has a higher degree of crystallization, i.e. higher crystallinity than the first portion 321, but has a lower degree of crystallization, i.e. lower crystallinity than the second portion 322, may be located below the first portion 321.

In addition, although only the first conductive area 32 is illustrated in FIG. 27, the second conductive area 34 may be similarly formed such that the first portion 341 is formed only in a portion of the second conductive area 34 in the thickness direction.

Figure 28:
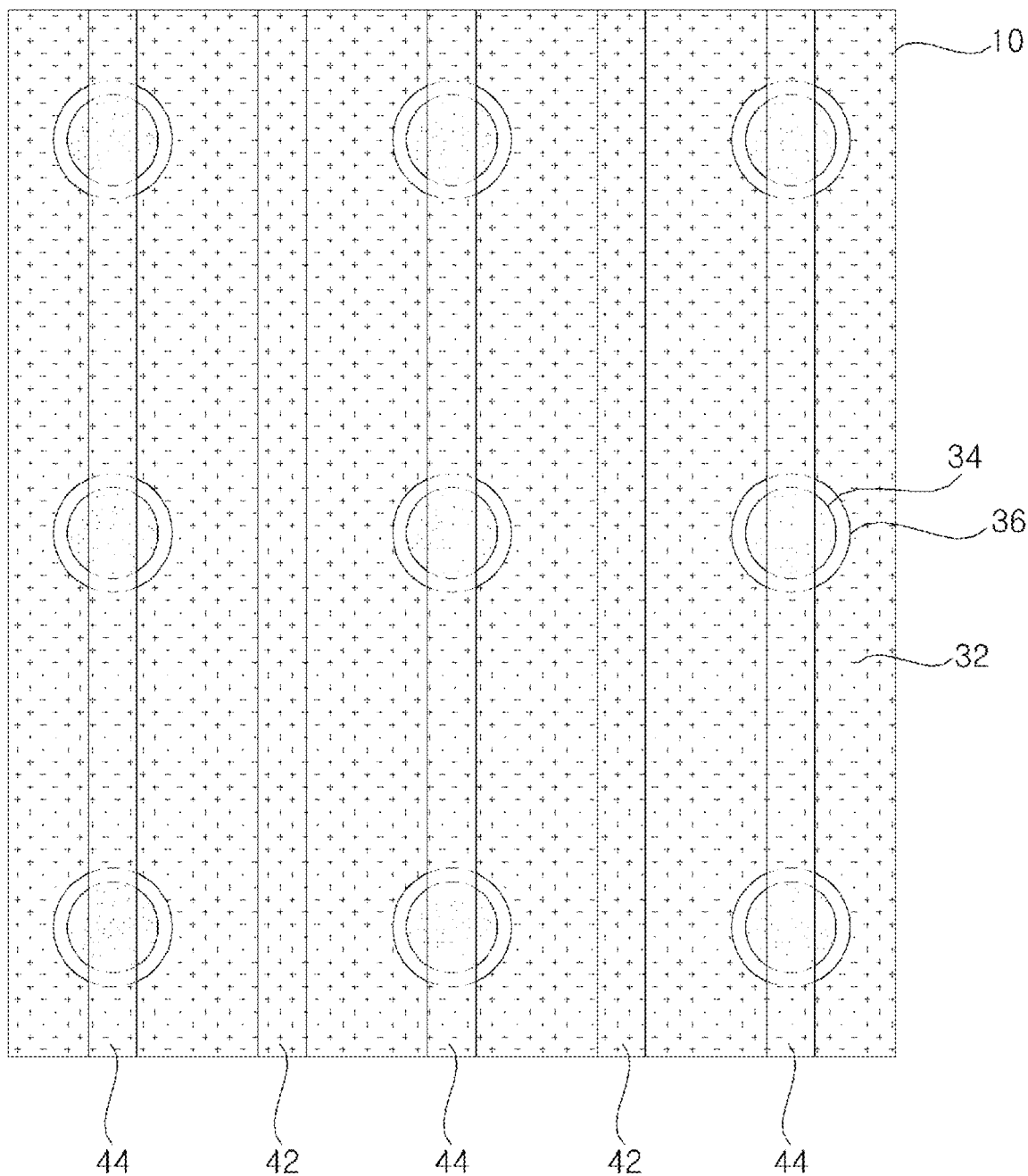
FIG. 28 is a partial rear plan view illustrating a solar cell according to another embodiment of the present invention.

FIG. 28 is a partial rear plan view illustrating a solar cell according to another embodiment of the present invention. In FIG. 28, no insulation film (see reference numeral 40 in FIG. 21) is illustrated, and only the first and second conductive area 32 and 34, the barrier area 36 and the first and second electrodes 42 and 44 are illustrated. In the present embodiment, the insulation film 40 is disposed between the first and second electrodes 42 and 44 and the first and second conductive areas 32 and 34 and the barrier area 36. In addition, the first contact hole (see reference numeral 461 in FIG. 21) for connection between the first electrode 42 and the first conductive area 32 may be formed in the portion of the insulation film 40 at which the first electrode 42 and the first conductive area 32 overlap each other, and the second contact hole (see reference numeral 462 in FIG. 21) for connection between the second electrode 44 and the second conductive area 34 may be formed in the portion of the insulation film 40 at which the second electrode 44 and the second conductive area 34 overlap each other.

Referring to FIG. 28, in the solar cell 100 according to the present embodiment, a plurality of second conductive areas 34 may have an island shape and may be space apart from one another, and the first conductive area 32 may be formed throughout the remaining portion excluding the second conductive areas 34 and the barrier areas 36 surrounding the respective second conductive areas 34.

As such, the first conductive area 32, which functions as an emitter area, may have the maximum area, which may improve photoelectric conversion efficiency. In addition, it is possible to distribute the second conductive areas 34 in the entire semiconductor substrate 10 while minimizing the area of the second conductive areas 34. Thus, it is possible to maximize the area of the second conductive areas 34 while effectively preventing surface recombination by the second conductive areas 34. However, the present invention is not limited thereto, and of course, the second conductive areas 34 may have any of various other shapes so long as they can have the minimum area possible.

Although FIG. 28 illustrates the second conductive areas 34 as having a circular shape, the present invention is not limited thereto. Thus, the second conductive areas 34 may have an elliptical shape or a polygonal shape such as, for example, a triangular shape, a rectangular shape, or a hexagonal shape.

Hereinafter, a manufacturing example of the present invention will be described below in more detail. However, the manufacturing example of the present invention, which will be described below, is merely given by way of example, and the present invention is not limited thereto.

Manufacturing Example

A protective-film layer formed of a silicon oxide film was formed on one surface of an n-type monocrystalline semiconductor substrate. A semiconductor layer including polycrystalline silicon was formed over the protective-film layer via low-pressure chemical vapor deposition. Then, a first conductive area and a second conductive area were formed in the semiconductor layer respectively by doping an area of the semiconductor layer with a p-type dopant via laser doping and by doping another area of the semiconductor layer with an n-type dopant via thermal diffusion using a mask layer. Then, a back passivation film formed of a silicon nitride film and a silicon carbide film was formed, and contact holes were formed in the back passivation film using a laser having a pulse width of 20 pm. A first electrode and a second electrode were formed so as to be electrically connected to the first conductive area and the second conductive area through the contact holes.

Figure 29:
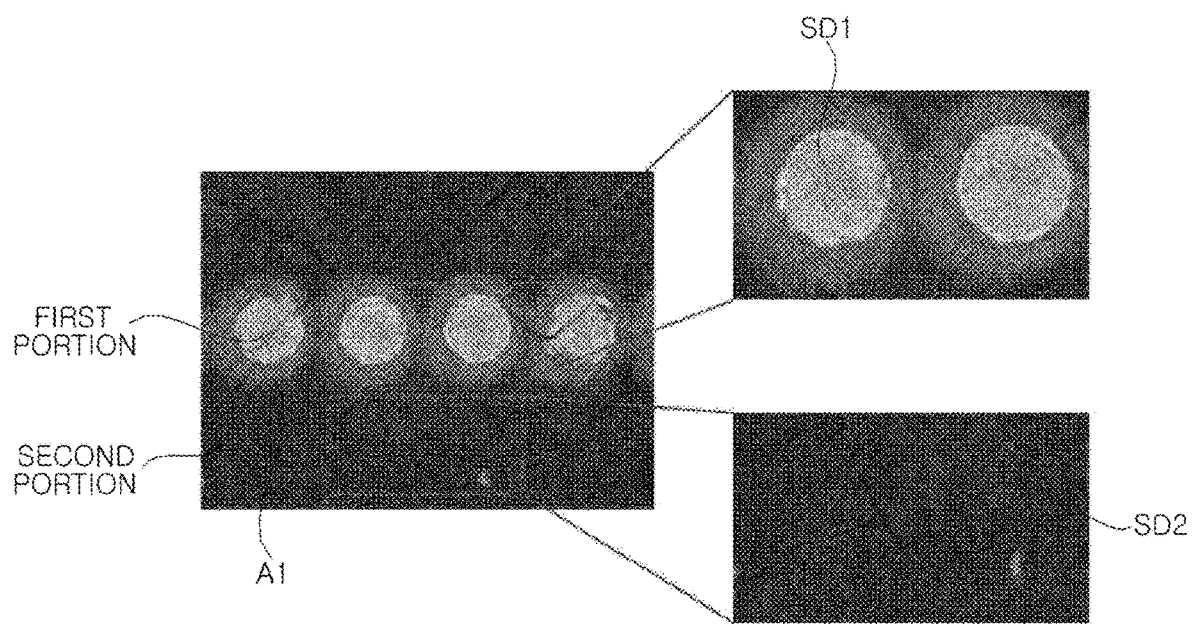
FIG. 29 is a microphotograph illustrating the back surface of a solar cell according to a manufacturing example.
Figure 30:
FIG. 30 is a photograph illustrating the cross section of a solar cell in the portion in which a contact hole is formed (i.e. a first portion) and in the portion in which no contact hole is formed (i.e. a second portion)
Figure 30:
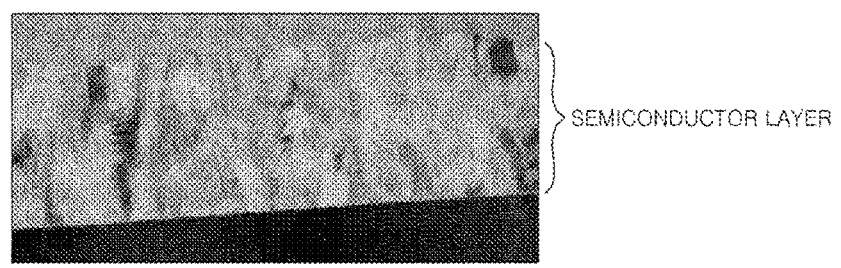
Figure 31:
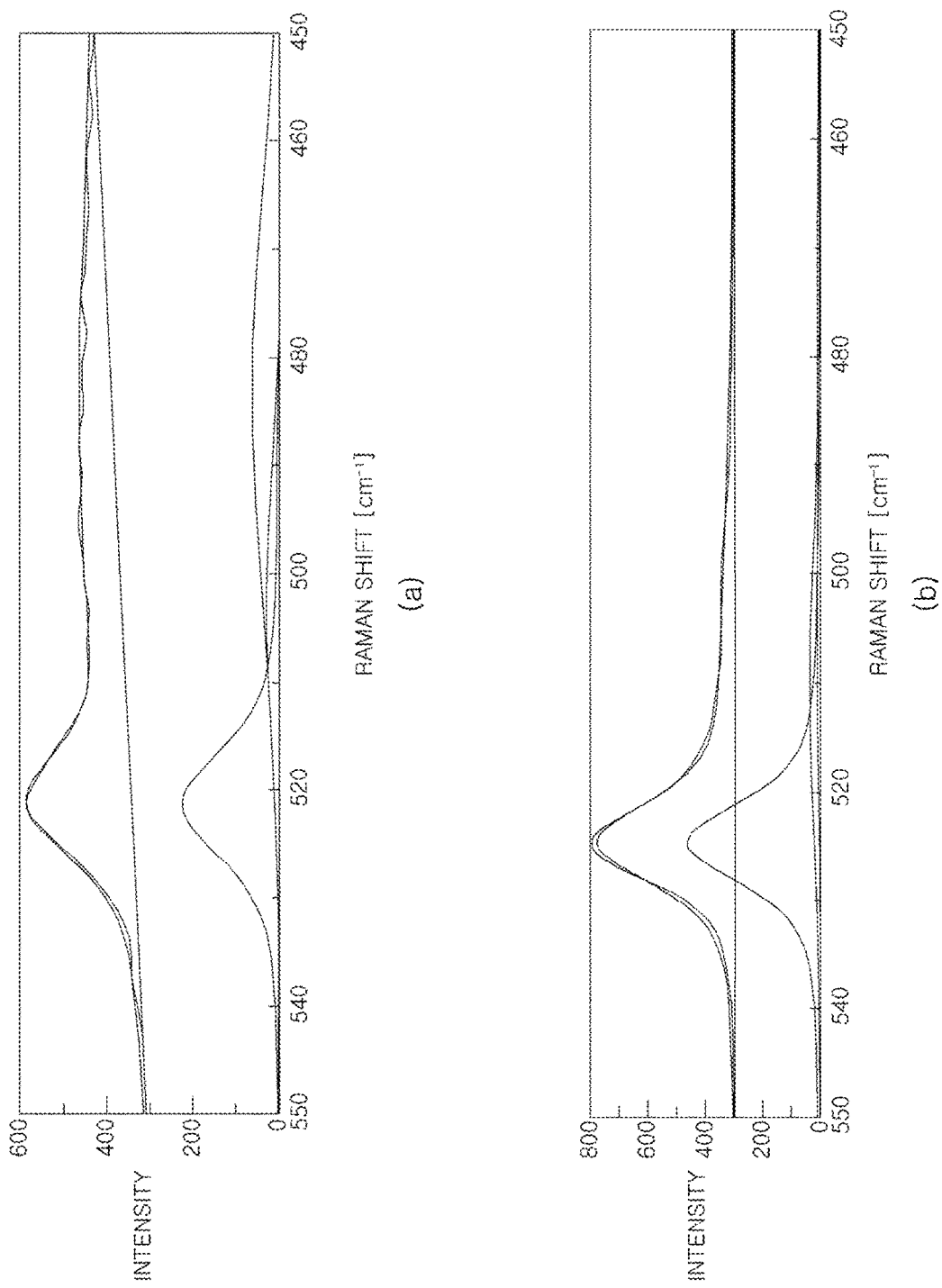
FIG. 31 is a graph illustrating the result of analysis of a semiconductor layer via a Raman analysis method in the portion in which the contact hole is formed (i.e. the first portion) and in the portion in which no contact hole is formed (i.e. the second portion)

A microphotograph of the back surface of a solar cell according to the manufacturing example is illustrated in FIG. 29, and photographs of the cross section of the solar cell in the portion in which the contact hole is formed (i.e. a first portion) and in the portion in which no contact hole is formed (i.e. a second portion) are illustrated respectively in (a) and (b) of FIG. 30. The result of analysis of the semiconductor layer via a Raman analysis method in the portion in which the contact hole is formed (i.e. the first portion) and in the portion in which no contact hole is formed (i.e. the second portion) is illustrated in FIG. 31, and the degree of crystallization thereof is illustrated in Table 1. At this time, the result was measured in the portion of the semiconductor layer close to the electrode, in the middle portion of the semiconductor layer, and in the portion of the semiconductor layer close to the protective-film layer.

TABLE 1

| | Portion close to electrode | Middle portion | Portion close to protective-film layer |
| --- | --- | --- | --- |
| First portion | 54.60% | 58.80% | 65.30% |
| Second portion | 92.70% | 92.40% | 92.70% |

Referring to FIG. 29, it can be seen that the saw damage mark SD2 of the portion in which no contact hole is formed (i.e. the second portion) is deeper than the saw damage mark SD1 of the portion in which the contact hole is formed (i.e. the first portion). In addition, it can be seen that the area corresponding to the periphery of the brightest portion, in which the contact hole is formed (i.e. the first area A1), is brighter than the remaining area. In addition, it can be seen that, referring to (a) of FIG. 30, the semiconductor layer in the portion in which the contact hole is formed (i.e. the first portion) has large surface roughness, whereas referring to (b) of FIG. 30, the semiconductor layer in the portion in which no contact hole is formed (i.e. the second portion) has small surface roughness.

In addition, referring to Table 1, based on the result of FIG. 31, it can be seen that the portion in which the contact hole is formed (i.e. the first portion) has a high degree of crystallization of 92% or more, whereas the portion in which no contact hole is formed (i.e. the second portion) has a low degree of crystallization within a range from about 50% to 60%. In addition, it can be seen that, in the portion in which no contact hole is formed (i.e. the second portion), the degree of crystallization increases with increasing distance from the electrode. This is presumed to be because the effect of the laser is reduced with increasing distance from the electrode.

Next, a solar cell according to some embodiments of the present invention will be described with reference to FIGS. 32 and 33.

Figure 32:
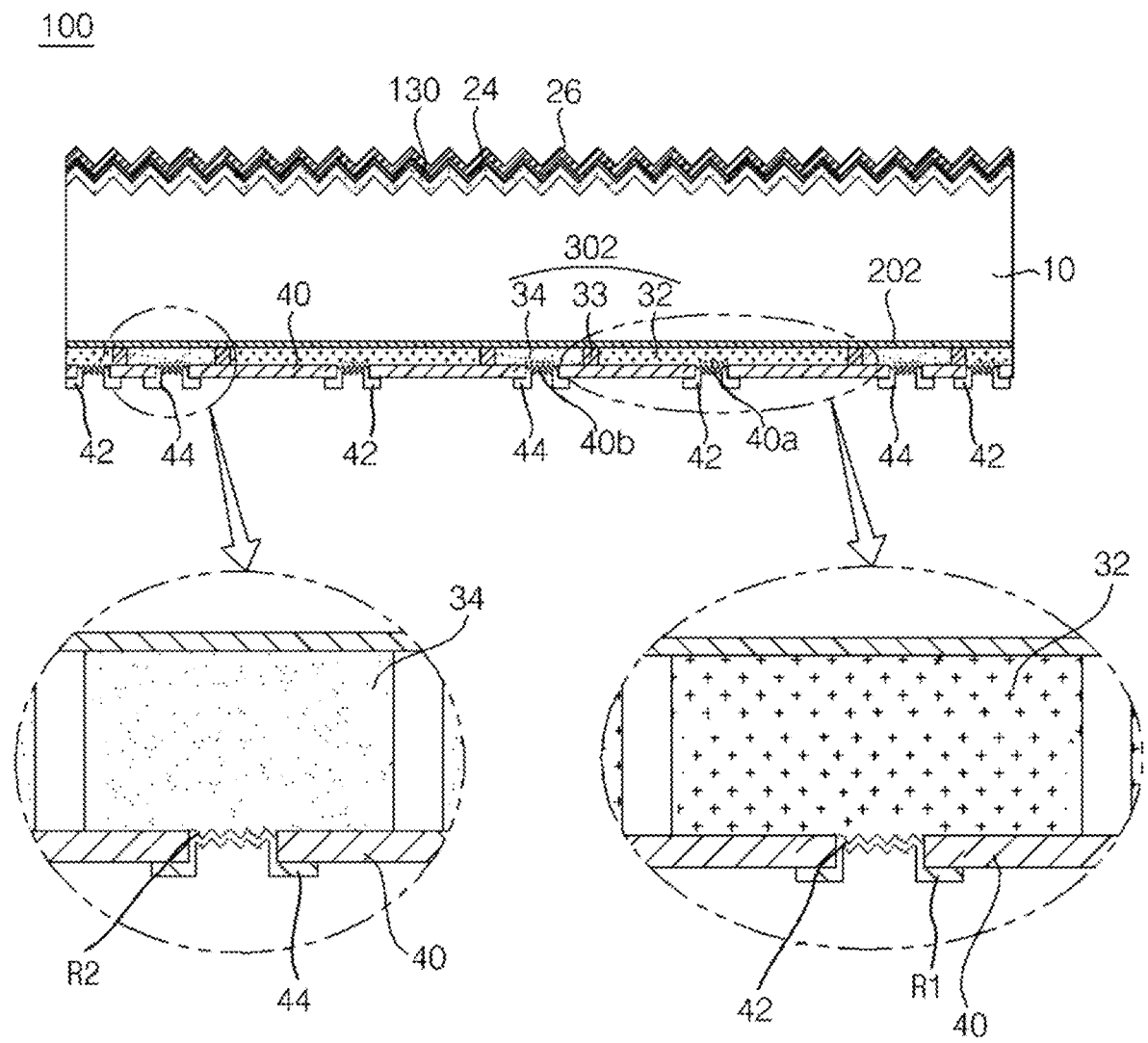
FIG. 32 is a cross-sectional view illustrating an example of a solar cell according to an embodiment of the present invention.
Figure 33:
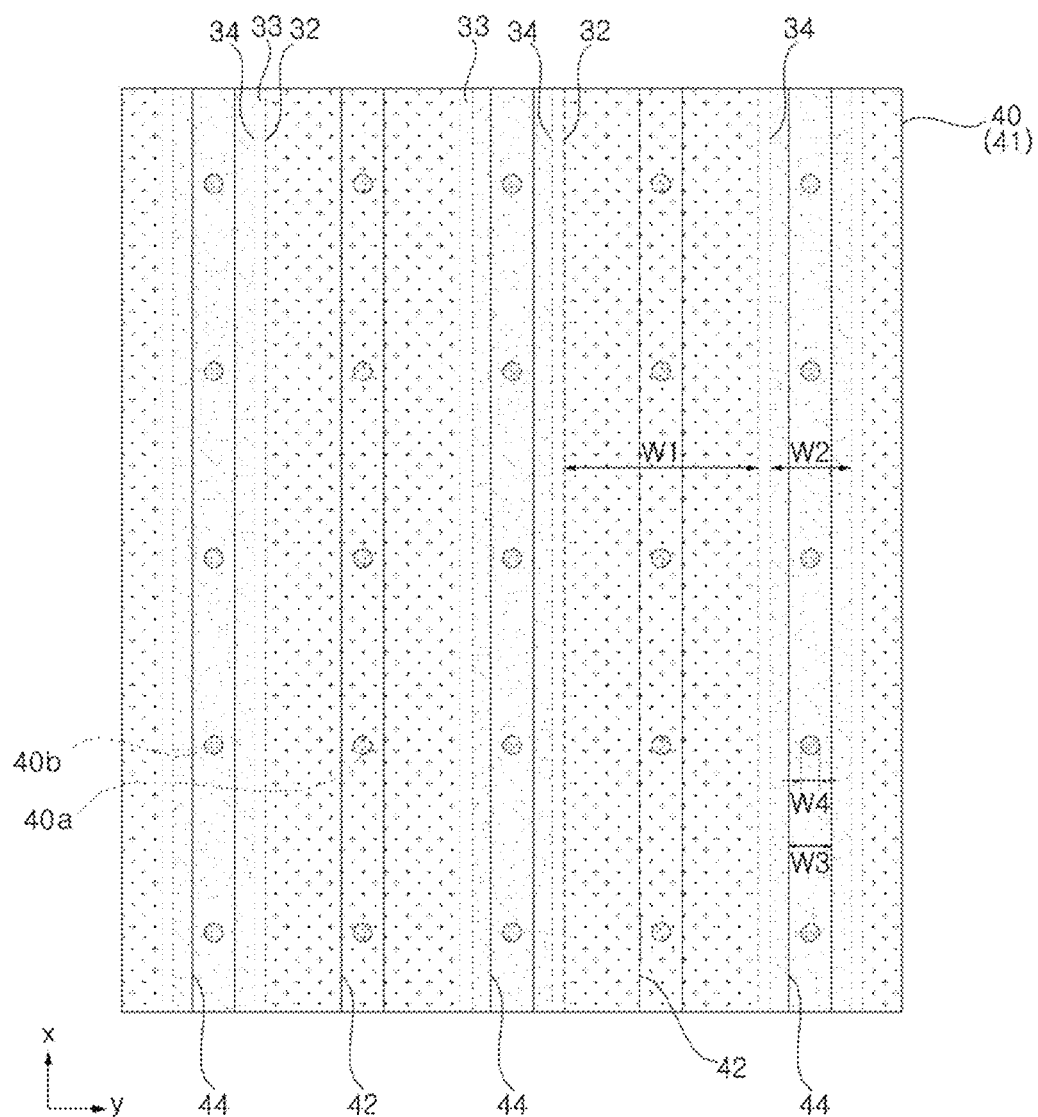
FIG. 33 is a plan view illustrating the back surface of the solar cell illustrated in FIG. 32.

FIG. 32 is a cross-sectional view illustrating an example of the solar cell according to some embodiments of the present invention, and FIG. 33 is a partial rear plan view illustrating the solar cell illustrated in FIG. 32. The solar cell according to the present embodiment may be substantially the same as the above-described solar cell. Thus, a repeated description may be omitted.

Referring to FIGS. 32 and 33, the solar cell 100 according to the present embodiment includes the semiconductor substrate 10, a protective-film layer 202 formed on the surface of the semiconductor substrate 10, the first conductive area 32 formed over the protective-film layer 202 and configured as a semiconductor layer of a first conductive type, the second conductive area 34 of a second conductive type, which is opposite to the first conductive type, and the first electrode 42 and the second electrode 44 configured to be brought into contact with the first conductive area 32 and the second conductive area 34 respectively.

In the present embodiment, the first conductive area 32 includes a contact-hole area, which is exposed through a first contact hole 40a. The surface of the contact-hole area has first contact-hole surface roughness R1. The second conductive area 34 includes a contact-hole area, which is exposed through a second contact hole 40b. The surface of the contact-hole area has second contact-hole surface roughness R2. In the present embodiment, the first and second electrodes 42 and 44 respectively have first electrode surface roughness, which corresponds to the first contact-hole surface roughness R1, and second electrode surface roughness, which corresponds to the second contact-hole surface roughness R2. This will be described later in detail.

The semiconductor substrate 10 may be doped with a first or second conductive dopant at a relatively low doping concentration, and thus may be of a first or second conductive type.

In addition, the semiconductor substrate 10 may include the front-surface field area (or the field area) 130 disposed on one surface (e.g. the front surface) of the semiconductor substrate 10. The front-surface field area 130 may be of the same conductive type as the semiconductor substrate 10, and may have a higher doping concentration than the semiconductor substrate 10.

The present embodiment illustrates the instance where the front-surface field area 130 is a doped area formed by doping the semiconductor substrate 10 with a second conductive dopant at a relatively high doping concentration. Thus, the front-surface field area 130 may include a second conductive crystalline (monocrystalline or polycrystalline) semiconductor so as to constitute a portion of the semiconductor substrate 10.

However, the present invention is not limited thereto. Thus, the front-surface field area 130 may be formed by doping a separate semiconductor layer (e.g. an amorphous semiconductor layer, a microcrystalline semiconductor layer, or a polycrystalline semiconductor layer), rather than the semiconductor substrate 10, with the second conductive dopant. Alternatively, the front-surface field area 130 may be configured as a field area, which functions similar to a layer (e.g. the front insulation film 24 and/or the anti-reflection film 26), which is formed close to the semiconductor substrate 10 and is doped with a fixed charge. For example, when the semiconductor substrate 10 is of an n-type, the front insulation film 24 may be formed of an oxide (e.g. an aluminum oxide) having a fixed negative charge, so as to form an inversion layer on the surface of the semiconductor substrate 10. In this instance, the semiconductor substrate 10 may include no separate doping area, which may minimize defects of the semiconductor substrate 10. The front-surface field area 130 having various configurations may be formed using various other methods.

The protective-film layer 202 may be formed on the other surface (e.g. the back surface) of the semiconductor substrate 10. The protective-film layer 202 may be formed on the entire back surface of the semiconductor substrate 10. Thus, the protective-film layer 202 may be easily formed without patterning.

In order to achieve sufficient tunneling effects, the thickness of the protective-film layer 202 may be less than the thickness of the insulation film 40. In one example, the thickness of the protective-film layer 202 may be 5 nm or less (more specifically, 2 nm or less, for example, within a range from 0.5 nm to 2 nm). When the thickness of the protective-film layer 202 exceeds 5 nm, smooth tunneling does not occur, and consequently, the solar cell 100 may not operate. When the thickness of the protective-film layer 202 is below 0.5 nm, it may be difficult to form the protective-film layer 202 having a desired quality. In order to further improve tunneling effects, the thickness of the protective-film layer 202 may be 2 nm or less (more specifically, within a range from 0.5 nm to 2 nm). At this time, in order to further improve tunneling effects, the thickness of the protective-film layer 202 may range from 0.5 nm to 1.5 nm. However, the present invention is not limited thereto, and the thickness of the protective-film layer 202 may have any of various values.

The semiconductor layer 302 including the conductive areas 32 and 34 may be disposed over the protective-film layer 202. In one example, the semiconductor layer 302 may be formed to be brought into contact with the protective-film layer 202, and thus may exhibit a simplified structure and improved tunneling effects. However, the present invention is not limited thereto.

In the present embodiment, the semiconductor layer 302 may include the first conductive area 32, which includes a first conductive dopant and thus is of a first conductive type, and the second conductive area 34, which includes a second conductive dopant and thus is of a second conductive type. The first conductive area 32 and the second conductive area 34 may be located in the same plane over the protective-film layer 202. That is, there may be no layer interposed between the first and second conductive areas 32 and 34 and the protective-film layer 202. Alternatively, when another layer is interposed between the first and second conductive areas 32 and 34 and the protective-film layer 202, the interposed layer may have the same stacking structure. In addition, the barrier area 33 may be located between the first conductive area 32 and the second conductive area 34 in the same plane as the conductive areas 32 and 34.

The first conductive area 32 configures an emitter area, which forms a pn junction with the semiconductor substrate 10 with the protective-film layer 202 interposed therebetween so as to produce carriers via photoelectric conversion. The second conductive area 34 configures a back-surface field area, which forms a back-surface field so as to prevent the loss of carriers due to recombination on the surface of the semiconductor substrate 10.

In addition, the barrier area 33 may be located between the first conductive area 32 and the second conductive area 34 so that the first conductive area 32 and the second conductive area 34 are spaced apart from each other. When the first conductive area 32 and the second conductive area 34 are in contact with each other, shunts may occur, undesirably causing deterioration in the performance of the solar cell 100. Therefore, unnecessary or undesired shunts may be prevented when the barrier area 33 is located between the first conductive area 32 and the second conductive area 34.

The barrier area 33 may be formed of any of various materials, which may substantially insulate the first conductive area 32 and the second conductive area 34 from each other. In an example form, the barrier area 33 may be formed of an undoped insulation material, and more specifically, an intrinsic semiconductor including no dopant. Alternatively, a groove may be formed between the first conductive area 32 and the second conductive area 34 so as to physically isolate the first conductive area 32 and the second conductive area 34 from each other.

In addition, when the semiconductor substrate 10 is of an n-type, it forms a pn junction with the first conductive area 32, and the first conductive area 32 forms an emitter. In this instance, the area of the first conductive area 32 may be greater than the area of the second conductive area 34.

When the semiconductor substrate 10 and the second conductive area 34 are of an n-type conductive type and the first conductive area 32 is of a p-type conductive type, the wide first conductive area 32 may serve to collect holes. Because holes have longer lifetimes than electrons, the first conductive area 32 may effectively collect holes.

The back insulation film 40 is formed over the semiconductor layer 302. The back insulation film 40 includes the first contact hole 40a for connection between the first conductive area 32 and the first electrode 42, and the second contact hole 40b for connection between the second conductive area 34 and the second electrode 44, and functions to passivate the semiconductor layer 302. The first and second conductive areas 32 and 34 are exposed respectively through the contact holes 40a and 40b of the insulation film 40, and the exposed first and second conductive areas 32 and 34 have a particular surface shape. The contact holes are typically shaped as a plurality of circular, elliptical or polygonal openings, spaced apart from one another, or as stripe-shaped openings. The first conductive area 32 and the second conductive area 34 may have a predetermined shape depending on the shape of the contact holes 40a and 40b, and in particular, may have predetermined surface roughnesses, which may be referred to as the first and second contact-hole surface roughnesses R1 and R2.

The back insulation film 40 may be formed of a single film or multiple films in the form of a combination of two or more films selected from the group consisting of a silicon nitride film, a silicon nitride film containing hydrogen, a silicon oxide film, a silicon oxide nitride film, a silicon carbide film, and $Al_2O_3$, $MgF_2$, ZnS, $TiO_2$, and $CeO_2$ films.

The electrodes 42 and 44, disposed on the back surface of the semiconductor substrate 10, include the first electrode 42, which is in contact with the first conductive area 32, and the second electrode 44, which is in contact with the second conductive area 34. The first electrode 42 may penetrate the contact hole 40a in the back insulation film 40 to thereby be brought into contact with the first conductive area 32 having the first contact-hole surface roughness R1, whereby the surface of the first electrode 42 may have first electrode surface roughness Ra1. In this instance, the first electrode surface roughness Ra1 may be acquired when the first contact-hole surface roughness R1 is transferred to the surface of the first electrode 42.

The second electrode 44 may penetrate the contact hole 40b in the back insulation film 40 to thereby be brought into contact with the second conductive area 34 having the second contact-hole surface roughness R2, whereby the surface of the second electrode 44 may have second electrode surface roughness Ra2. In this instance, the second electrode surface roughness Ra2 may be acquired when the second contact-hole surface roughness R2 is transferred to the surface of the second electrode 44.

The first and second electrodes 42 and 44 may include any of various metal materials. In addition, the first and second electrodes 42 and 44 may have any of various plan shapes in order to collect and outwardly transfer carriers by being connected respectively to the first conductive area 32 and the second conductive area 34 while not being electrically connected to each other.

In the present embodiment, the contact holes 40a and 40b may be formed by irradiating local portions of the insulation film 40 with a laser so that the corresponding portions of the insulation film 40 are removed via evaporation. Through this process, the first and second contact-hole surface roughnesses R1 and R2 may be acquired.

When the contact holes 40a and 40b are formed using a laser, heat is transferred to the first and second conductive areas 32 and 34, causing corresponding portions of the first and second conductive areas 32 and 34 to be melted and re-crystallized. The re-crystallized portions exhibit sharper curvature than the remaining portion, and thus have increased surface roughnesses, i.e. the first and second contact-hole surface roughnesses R1 and R2.

When the portions of the first and second conductive areas 32 and 34 corresponding to the contact holes 40a and 40b have larger surface roughnesses than the remaining portion, the electrodes 42 and 44 connected to (e.g. in contact with) the first and second conductive areas 32 and 34 through the contact holes 40a and 40b have increased surface roughnesses. That is, the first and second electrodes 42 and 44 may have the first and second electrode surface roughnesses Ra1 and Ra2, which are acquired when the first and second contact-hole surface roughnesses R1 and R2 are transferred to the first and second electrodes 42 and 44.

Thus, the surfaces of the electrodes 42 and 44 may reflect light, which penetrates the semiconductor substrate 10 and is directed to the back surface, to enable the reuse of light. In addition, such large surface roughness may maximize the contact area between the portions of the first and second conductive areas 32 and 34 corresponding to the first and second contact holes 40a and 40b and the electrodes 42 and 44, thereby improving bonding properties.

The contact holes may be formed by removing the back insulation film 40 using etching paste, rather than laser irradiation. In this instance, groove-shaped marks of the profile of the contact holes may be imprinted in the contact-hole areas of the first conductive area 32 and the second conductive area 34.

Meanwhile, in the present embodiment, the thickness of the first and second electrodes 42 and 44 may be 1 μm or less. More specifically, the height of the first and second electrodes 42 and 44 from the interface with the conductive areas 32 and 34 to the other surface may be 1 μm or less. In the present embodiment, the first and second electrodes 42 and 44 may be a multilayered film formed via deposition. For example, the first and second electrodes 42 and 44 may have a four layered structure including a first titanium layer, an aluminum layer, a second titanium layer, and a nickel-vanadium alloy layer. The first titanium layer has a thickness of 50 nm or less, the aluminum layer has a thickness of 550 nm or less, the second titanium layer has a thickness of 150 nm or less, and the nickel-vanadium alloy layer has a thickness of 250 nm or less. However, the present invention is not limited thereto, and various other metals may be used.

In the present embodiment, the portions of the first and second conductive areas 32 and 34, which are connected to the electrodes 42 and 44 through the first and second contact holes 40a and 40b, may have the first and second contact-hole surface roughnesses R1 and R2, which are relatively high, thus improving the reflectance and bonding of the electrodes 42 and 44.

When light is introduced into the solar cell 100 according to the present embodiment, electrons and holes are produced via photoelectric conversion at a pn junction formed between the semiconductor substrate 10 and the first conductive area 32, and the produced electrons and holes move to the first conductive area 32 and the second conductive area 34 via tunneling through the protective-film layer 202, and thereafter move to the first and second electrodes 42 and 44. Thereby, electricity is generated.

In the solar cell 100 having a back-surface electrode structure in which the electrodes 42 and 44 are formed on the back surface of the semiconductor substrate 10 and no electrode is formed on the front surface of the semiconductor substrate 10 as in the present embodiment, shading loss may be minimized on the front surface of the semiconductor substrate 10. Thus, the efficiency of the solar cell 100 may be improved. However, the present invention is not limited thereto.

The first and second conductive areas 32 and 34 are formed over the semiconductor substrate 10 with the protective-film layer 202 interposed therebetween, and thus are formed separately from the semiconductor substrate 10. As such, loss due to recombination may be less than that when a doped area formed by doping an area of the semiconductor substrate 10 with a dopant is used as a conductive area.

In addition, the portion corresponding to the contact holes 40a and 40b have larger surface roughness than the remaining portion, whereby the reflectance of the electrodes 42 and 44 may be improved and the bonding of the electrodes 42 and 44 may be improved. In addition, the portion in which no contact holes 40a and 40b are formed may have a high degree of crystallization, i.e. high crystallinity, thus achieving high mobility and excellent electrical properties. Thus, the efficiency of the solar cell 100 may be improved.

The above description illustrates the instance where the first conductive area 32 and the second conductive area 34 are disposed together over the same protective-film layer 202 and are covered together with the insulation film 40. However, the present invention is not limited thereto.

In addition, FIGS. 32 and 33 illustrate the instance where no textured structure is disposed on the back surface of the semiconductor substrate 10 on which the first and second conductive areas 32 and 34 have been formed. However, the present invention is not limited thereto, and a textured structure may be provided on the back surface of the semiconductor substrate 10.

In addition, the front insulation film 24 and the anti-reflection film 26 are selectively disposed over the front-surface field area 130 on the front surface of the semiconductor substrate 10. That is, in some embodiments, only the front insulation film 24 may be formed over the semiconductor substrate 10, only the anti-reflection film 26 may be formed over the semiconductor substrate 10, or the front insulation film 24 and the anti-reflection film 26 may be sequentially disposed over the semiconductor substrate 10. The front insulation film 24 and the anti-reflection film 26 may substantially be formed on the entire front surface of the semiconductor substrate 10.

The front insulation film 24 is formed so as to be brought into contact with the surface of the semiconductor substrate 10 for the passivation of defects, which exist in the surface or the bulk of the semiconductor substrate 10. As such, the front insulation film 24 may increase the open-circuit voltage of the solar cell 150 by removing recombination sites of minority carriers. The anti-reflection film 26 reduces the reflectance of light introduced into the front surface of the semiconductor substrate 10. Thus, the anti-reflection film 26 may increase the quantity of light, which reaches a pn junction formed at the interface of the semiconductor substrate 10 and the first conductive area 32. Thereby, the anti-reflection film 26 may increase the short-circuit current Isc of the solar cell 100. Thereby, the front insulation film 24 and the anti-reflection film 26 may increase the open-circuit voltage and the short-circuit current of the solar cell 100, thereby improving the efficiency of the solar cell 100.

Each of the front insulation film 24 and the anti-reflection film 26 may include a single film or multiple films in the form of a combination of two or more films selected from the group consisting of a silicon nitride film, a silicon nitride film containing hydrogen, a silicon oxide film, a silicon oxide nitride film, an aluminum oxide film, a silicon carbide film, and $MgF_2$, $ZnS$, $TiO_2$, and $CeO_2$ films.

When light is introduced into the solar cell 100 having the above-described structure according to the present embodiment, electrons and holes are produced via photoelectric conversion at a pn junction formed between the semiconductor substrate 10 and the first conductive area 32, and the produced electrons and holes move to the first conductive area 32 and the second conductive area 34 via tunneling through the protective-film layer 202, and thereafter move to the first and second electrodes 42 and 44. Thereby, electricity is generated.

In the solar cell 100 having a back-surface electrode structure in which the electrodes 42 and 44 are formed on the back surface of the semiconductor substrate 10 and no electrode is formed on the front surface of the semiconductor substrate 10, shading loss may be minimized on the front surface of the semiconductor substrate 10. Thus, the efficiency of the solar cell 100 may be improved.

The first and second conductive areas 32 and 34 are formed over the semiconductor substrate 10 with the protective-film layer 202 interposed therebetween, and thus are formed separately from the semiconductor substrate 10. As such, loss due to recombination may be less than that when a doped area formed by doping an area of the semiconductor substrate 10 with a dopant is used as a conductive area.

Meanwhile, as illustrated in FIG. 33, a plurality of first conductive areas 32 and a plurality of second conductive areas 34 are formed to extend a long length in a given direction, and are arranged side by side. In addition, the first conductive areas 32 and the second conductive areas 34 are alternately arranged. The barrier area 33 may be located between the first conductive area 32 and the second conductive area 34 so that the first conductive area 32 and the second conductive area 34 are spaced apart from each other by the barrier area 33.

In an example form, the area of the first conductive area 32 may be greater than the area of the second conductive area 34, as illustrated in FIG. 33. In one example, the areas of the first conductive area 32 and the second conductive area 34 may be adjusted by providing the first conductive area 32 and the second conductive area 34 with different widths. In this instance, the width W1 of the first conductive area 32 is greater than the width W2 of the second conductive area 34.

Figure 35A:
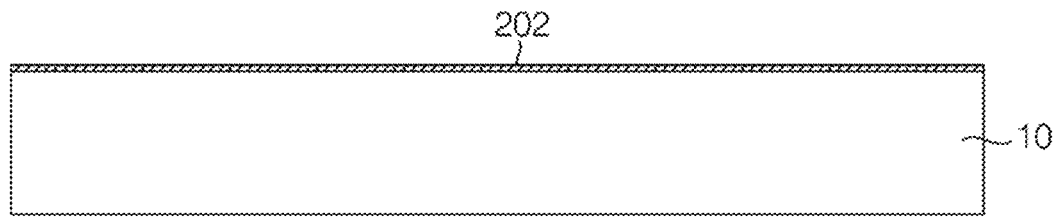
FIGS. 35A to 35O are views diagrammatically illustrating respective operations of FIG. 34.
Figure 35B:
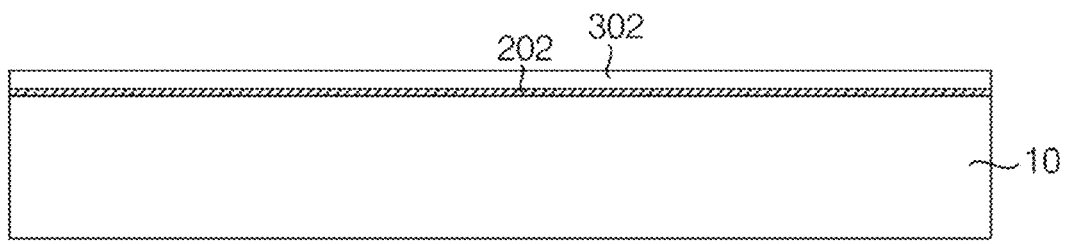
Figure 35C:
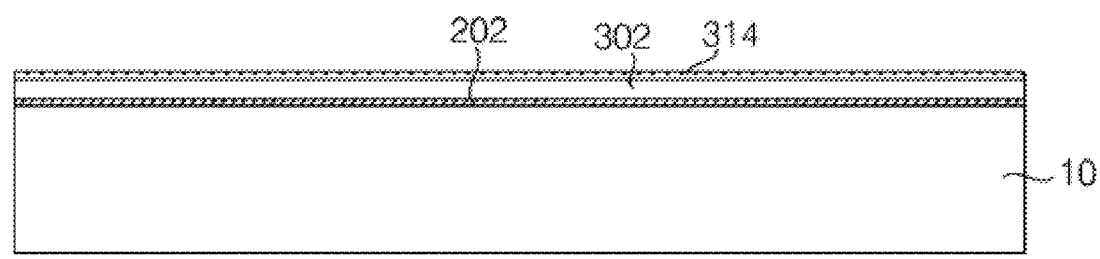
Figure 35D:
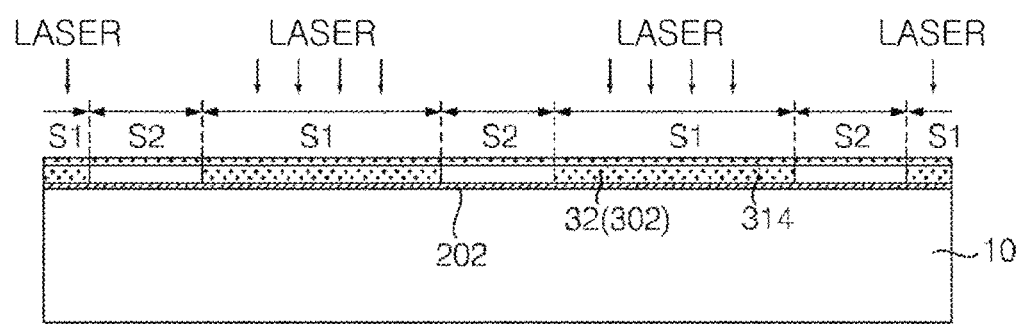
Figure 35E:
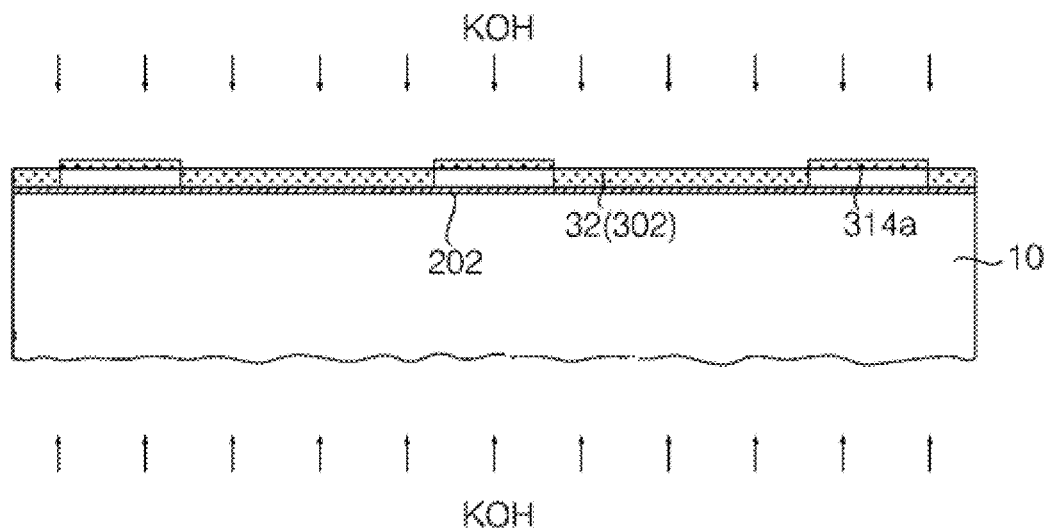
Figure 35F:
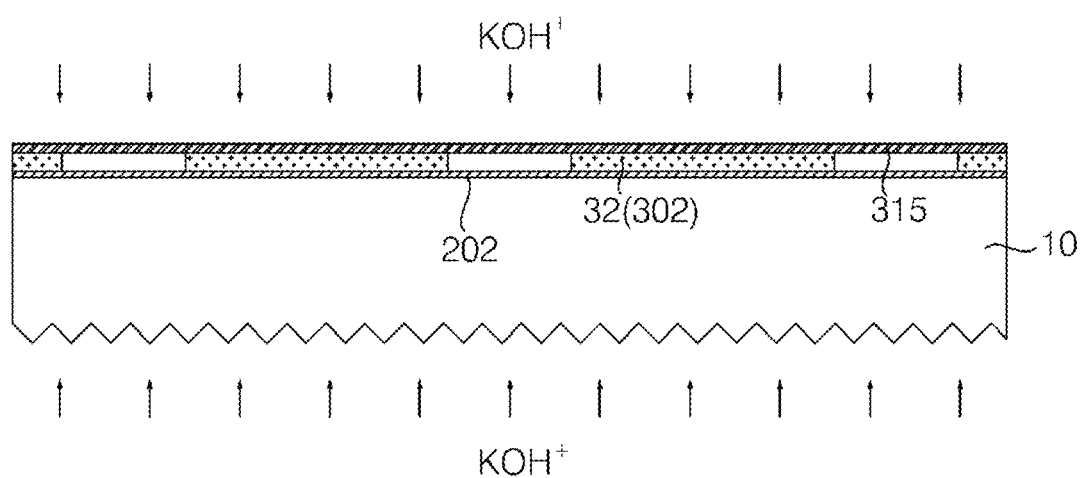
Figure 35G:
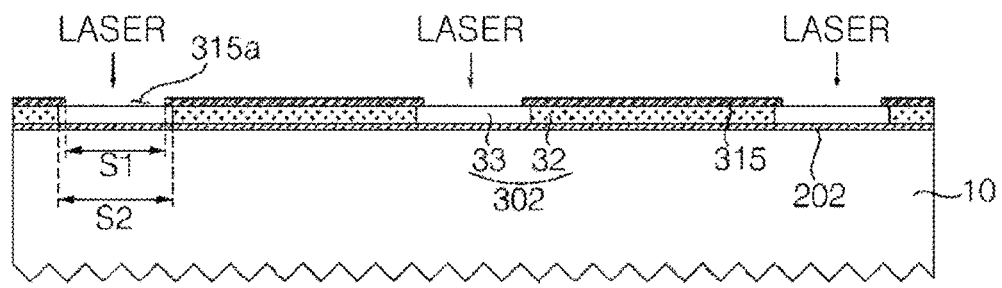

In addition, the first electrode 42 is formed in a stripe shape over the first conductive area 32, and the second electrode 44 is formed in a stripe shape over the second conductive area 34. In the state in which the contact holes are formed in the insulation film 40, which has been formed on the first conductive area 32 and the second conductive area 34, as illustrated in FIG. 35L, the first and second electrodes 42 and 44 are partially brought into contact with the first conductive area 32 and the second conductive area 34 in the contact-hole areas. Images having the profile of the contact holes are imprinted on the surfaces of the first and second electrodes 42 and 44, as illustrated in FIG. 35N.

The profile of the contact holes, imprinted on the surfaces of the first and second electrodes 42 and 44, depends on the shape of openings formed in the insulation film 40 and the surface properties of the contact-hole areas of the first conductive area 32 and the second conductive area 34, which are formed upon the formation of the openings. Referring to the enlarged circles of FIG. 35N, the profile of the contact holes imprinted on the first and second electrodes 42 and 44 is seen as convex-concave portions, which correspond to the surface roughness of the first conductive area 32 and the second conductive area 34 generated when the contact holes are formed. The convex-concave portions remain on the surface of a cell electrode, and thus remain in a final cell structure, thereby having an effect on cell properties and module properties.

Hereinafter, a method of manufacturing the solar cell having the above-described configuration will be described in detail with reference to the accompanying drawings.

Figure 34:
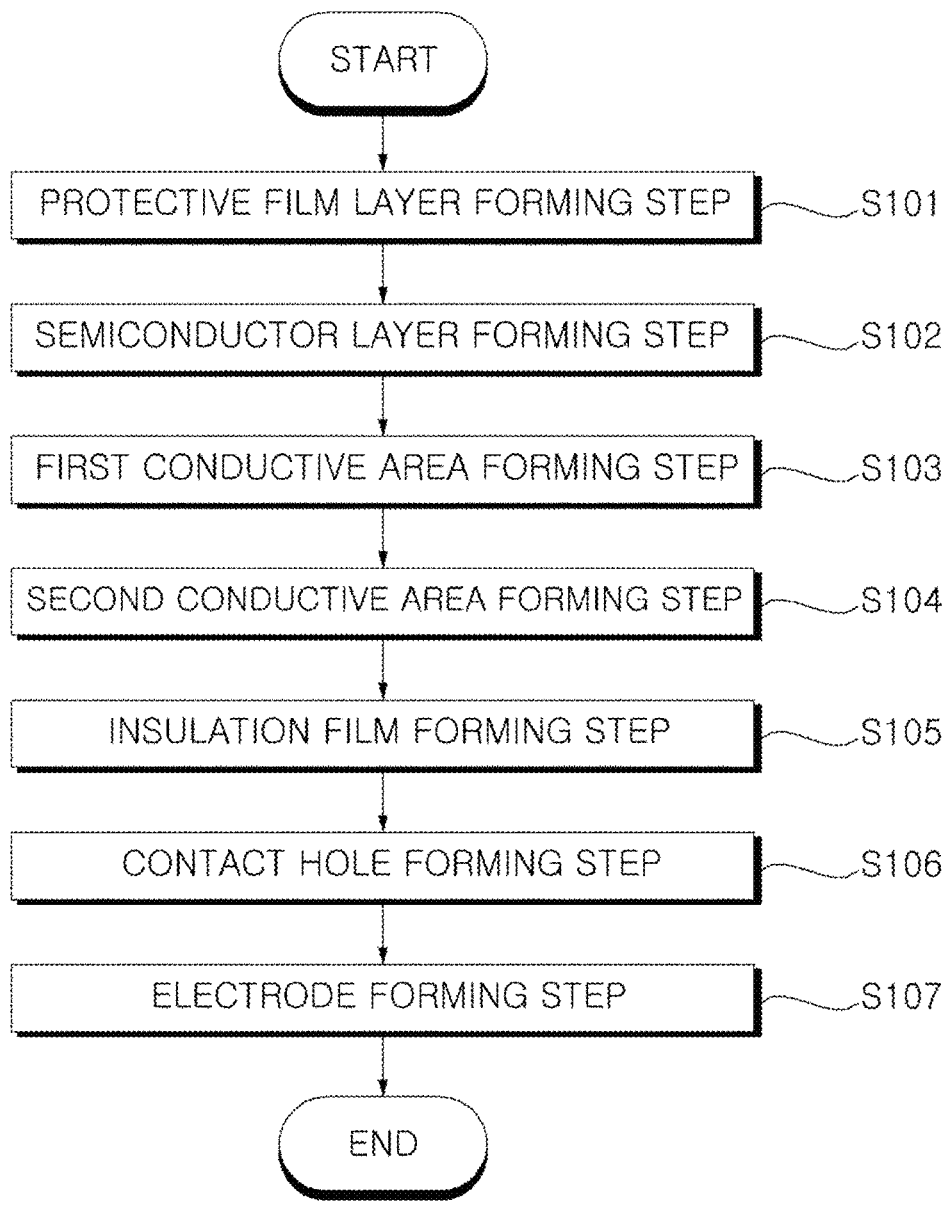
FIG. 34 is a flowchart illustrating a method of manufacturing a solar cell according to an embodiment of the present invention.

First, FIG. 34 is a flowchart illustrating the manufacturing method according to some embodiments of the present invention.

The method of manufacturing the solar cell according to the present embodiment includes a protective-film layer forming operation S101, a semiconductor layer forming operation S102, a first conductive area forming operation S103, a second conductive area forming operation S104, an insulation film forming operation S105, a contact hole forming operation S106, and an electrode forming operation S107.

Hereinafter, the respective operations of FIG. 34 will be described in detail with reference to FIGS. 35A to 35O. FIGS. 35A to 35O are views diagrammatically illustrating the respective operations of FIG. 34. In this instance, FIG. 35J is a plan view of FIG. 35I, and FIG. 35M is a plan view of FIG. 35L.

First, in the protective-film layer forming operation S101, the protective-film layer 202 is formed on the back surface of the semiconductor substrate 10. FIG. 35A diagrammatically illustrates the protective-film layer forming operation S101. For reference, for convenience of description, in FIGS. 35A to 35L, the front surface of the semiconductor substrate 10 is illustrated as facing downward.

The semiconductor substrate 10 is formed of a silicon crystal growth semiconductor having a monocrystalline or polycrystalline structure, and contains any one of the first conductive dopant and the second conductive dopant, which are of opposite conductive types. In one example, the first conductive dopant is an n-type dopant, for example, a group-V element, such as phosphorus (P), arsenic (As), bismuth (Bi), or antimony (Sb), and the second conductive dopant is a p-type dopant, for example, a group-III element, such as boron (B), aluminum (Al), gallium (Ga), or indium (In).

In an example form, the semiconductor substrate 10 has a monocrystalline structure in which grains are grown only in a given direction, and contains an n-type dopant. As such, in the semiconductor substrate 10, holes, which have longer lifetimes than electrons, form majority carriers to facilitate photoelectric conversion at a pn junction surface.

In an example form, the protective-film layer 202 is configured as an oxide layer including a thermal oxide and a silicon oxide, and has a thickness of 5 nm or less, more specifically, a thickness within a range from 0.5 nm to 3 nm. The protective-film layer 202 reduces recombination sites corresponding to a pn junction surface, and therefore functions to enable effective passivation.

When the thickness of the protective-film layer 202 exceeds 5 nm, the probability of tunneling of carriers is reduced, causing a reduction in the efficiency of the solar cell 100. When the thickness of the protective-film layer 202 is below 0.5 nm, the protective-film layer 202 may not perform a passivation function, causing a reduction in the efficiency of the solar cell 100. The protective-film layer 202 may be formed via a method that has generally been used in, for example, the semiconductor field, such as, for example, wet oxidation, thermal oxidation in an atmospheric furnace, PECVD or LPCVD.

Meanwhile, in a subsequent process, the semiconductor layer 302 is formed over the protective-film layer 202. The semiconductor layer 302 may also be formed via an LPCVD method. When the protective-film layer 202 and the semiconductor layer 302 are formed via CVD, the two layers may be successively formed using the same deposition facility, which enables an in-situ process.

When the protective-film layer 202 and the semiconductor layer 302 are formed in an in-situ process, the manufacturing process may be greatly simplified, which may greatly reduce, for example, manufacturing costs and manufacturing time.

Meanwhile, when both the protective-film layer 202 and the semiconductor layer 302 are formed via an LPCVD method, the difference in temperature between the two processes may be adjusted to 100° C. or less. When temperatures, the adjustment of which is relatively difficult, are maintained without great variation as described above, the in-situ process of successively forming the protective-film layer 202 and the semiconductor layer 302 may be facilitated.

Subsequently, in the semiconductor layer forming operation S102 following the protective-film layer forming operation S101, the semiconductor layer 302, which is of a crystalline type and is not doped with a dopant, is formed over the protective-film layer 202. FIG. 35B diagrammatically illustrates the semiconductor layer forming operation S102.

The thickness of the semiconductor layer 302 ranges from 300 nm to 400 nm. When the thickness is below 300 nm, a foreign substance may be doped to the protective-film layer 202 in the subsequent first conductive area forming operation S104. When the thickness is above 400 nm, a foreign substance may be doped on only a portion of the semiconductor layer 302 in a thickness direction, rather than being doped on the entire semiconductor layer 302.

In an example form, in operation S102, the intrinsic semiconductor layer 302 may be formed via an LPCVD method, in order to enable an in-situ process in connection with the previous operation S101. When operation S101 and operation S102 are performed via the same LPCVD method, the processes of the two operations may be performed using the same equipment. Thus, because the semiconductor substrate does not need to be exposed to the exterior environment, contamination of the protective-film layer 202 by a foreign substance, or an increase in the thickness of the protective-film layer 202 by additional oxidation, which is caused when the semiconductor substrate, on which the protective-film layer 202 has been formed, must be removed from the equipment, may be prevented, unlike the related art.

In this operation S102, source gas includes only gas containing a semiconductor material, for example, silane gas ($SiH_4$), because the semiconductor layer 302 is intrinsic. Selectively, the source gas may also contain nitrogen dioxide ($N_2O$) gas and/or oxygen ($O_2$) gas so as to adjust, for example, the size and crystallinity of crystal grains.

In an example form, the semiconductor layer 302 is configured as a polycrystalline semiconductor layer, without limitation thereon. The semiconductor layer 302 may be configured as an amorphous semiconductor layer, or may be configured as a layer including a crystalline structure and amorphous structure.

Subsequently, the doping layer 314 containing a dopant may be formed over the semiconductor layer 302, which is disposed on the back surface of the semiconductor substrate 10. FIG. 35C diagrammatically illustrates a doping layer forming step.

The dopant contained in the doping layer 314 may be of a conductive type, which is opposite to the conductive type of the dopant in the semiconductor substrate 10. In one example, when the semiconductor substrate 10 is doped with an n-type dopant, the dopant in the doping layer 314 is a p-type dopant. Thus, a group-III element, such as boron (B), aluminum (Al), gallium (Ga), or indium (In), is used as the dopant in the doping layer 314. When the semiconductor substrate 10 is doped with a p-type dopant, the dopant in the doping layer 314 is an n-type dopant. Thus, a group-V element, such as phosphorus (P), arsenic (As), bismuth (Bi), or antimony (Sb), is used as the dopant in the doping layer 314.

The dopant included in the doping layer 314 is introduced into the semiconductor layer 302 in the subsequent operation S104, causing the semiconductor layer 302 to form a pn junction with the semiconductor substrate 10 with the protective-film layer 202 interposed therebetween.

The concentration of the dopant included in the doping layer 314 ranges from $1\times10^{20}/cm^3$ to $1\times10^{22}/cm^3$, and is greater than the concentration of a dopant in a first conductive area, which will be described in the subsequent step. In an example form, the doping layer 314 having the above concentration of dopant is configured as a semiconductor layer formed of amorphous silicon, and has a thickness within a range from 30 nm to 50 nm.

When the thickness is below 30 nm, while the doping layer 314 is irradiated with a laser, the doping layer 314 may fail to effectively absorb the laser, which causes damage to the protective-film layer 202, which is thin. On the other hand, when the thickness is above 50 nm, the doping layer 314 may excessively absorb the laser, and thus the dopant may not be effectively introduced into the semiconductor layer 302.

Meanwhile, amorphous silicon has a high coefficient of absorption of light, as is well known, and thus is capable of reducing the strength of light by absorbing light penetrating the layer. As will be described below, the dopant included in the doping layer 314 is selectively introduced into the semiconductor layer 302 by the laser. At this time, because the doping layer 314 configured as an amorphous semiconductor layer is irradiated with the laser, damage to the protective-film layer 202, which is present beneath the semiconductor layer 302 and is thin, may be prevented.

The doping layer 314 may be formed via a deposition method that enables cross-sectional deposition, such as Plasma Enhanced Chemical Vapor Deposition (PECVD), because the doping layer 314 is an amorphous semiconductor layer containing the dopant and is formed only on the back surface of the semiconductor substrate 10.

A mixture of silane gas, $B_2H_6$ gas containing the dopant, or $BCl_3$ is used as source gas, the processing temperature is maintained within a range from 200° C. to 300° C., and the processing pressure is maintained within a range from 1 Torr to 4 Torr.

Meanwhile, although the doping layer 314 has been described above as being configured as an amorphous semiconductor layer, the doping layer 314 may be an oxide film containing the dopant, which is selectively formed of boron silicate glass (BSG) or phosphor silicate glass (PSG).

In addition, instead of separately performing formation of the semiconductor layer and formation of the doping layer, in the semiconductor layer forming operation S102, the semiconductor layer 302 including a first conductive dopant or a second conductive dopant may be formed using a dopant gas so that, instead of using the dopant layer, the dopant gas is introduced into the semiconductor layer via thermal diffusion or ion implantation.

Subsequently, in the first conductive area forming operation S103, the dopant included in the doping layer 314 selectively diffuses into the intrinsic semiconductor layer 302 so as to form the first conductive area 32. FIG. 35D diagrammatically illustrates the first conductive area forming operation S103.

The first conductive area 32 is formed by directly irradiating the doping layer 314 with a laser. As illustrated in FIG. 35D, the entire doping layer 314 is not irradiated with the laser, but only a portion of the doping layer 314, which has a first width S1 corresponding to the first conductive area 32, is selectively irradiated with the laser so that the remaining portion of the doping layer 314, which has a second width S2, is not irradiated with the laser. In the doping layer 314 irradiated with the laser, the dopant included in the doping layer 314 thermally diffuses into the semiconductor layer 302, whereby the first conductive area 32 is formed. Then, the doping layer 314 irradiated with the laser is removed.

When the first conductive area 32 is formed using the laser as described above, for example, a process of masking the doping layer 314 in order to selectively introduce the dopant included in the doping layer 314 into the semiconductor layer 302 may be omitted, which may simplify the manufacturing process and may reduce manufacturing costs.

Thereby, the semiconductor substrate 10 forms a pn junction with the first conductive area 32 with the protective-film layer 202 interposed therebetween. The concentration of the dopant in the first conductive area 32 ranges from $1\times10^{20}/cm^3$ to $1\times10^{22}/cm^3$, and is substantially the same as the concentration of the dopant in the doping layer 314.

When the doping process is performed via laser irradiation, the crystalline structure of the semiconductor layer 302 may vary based on the properties of the laser. That is, when the intrinsic semiconductor layer 302 is an amorphous semiconductor layer, the amorphous semiconductor layer may be crystallized via laser irradiation, thereby being changed into a crystalline semiconductor layer. In addition, when the intrinsic semiconductor layer 302 is a polycrystalline semiconductor layer, the degree of crystallization of an area formed via laser irradiation may be higher than the degree of crystallization of an area formed via deposition. In this area, the size of grains may be increased.

Subsequently, the residual doping layer 314a over the semiconductor layer 302 is removed. In an example form, the residual doping layer 314a may be removed via wet etching by dipping the semiconductor substrate 10 in an etchant, which is $KOH:H_2O_2=2(L):0.8(L)$, for 10 minutes to 20 minutes, or may be removed via dry etching, such as Reactive Ion Etching (RIE), by colliding plasma ions with the residual doping layer 314a to remove the residual doping layer 314a.

"Dipping" is an etching method of immersing the entire semiconductor substrate 10 in a tub in which an etchant is stored. When removing the residual doping layer 314a by dipping the same in the etchant, a portion of the front surface of the semiconductor substrate 10 may be removed at the same time.

Therefore, the front surface of the semiconductor substrate 10 may be effectively textured in the subsequent step. FIG. 35E diagrammatically illustrates wet etching in which the residual doping layer 314a is removed by dipping.

Subsequently, in the state in which the semiconductor layer 302 is masked with the mask layer 315, the semiconductor substrate 10 is dipped into an etchant, whereby the front surface of the semiconductor substrate 10 is textured to have a predetermined convex-concave structure. FIG. 35F diagrammatically illustrates this step.

In this instance, the mask layer 315 is formed over the entire surface of the semiconductor layer 302 so as to protect the semiconductor layer 302 while the front surface of the semiconductor substrate 10 is textured.

In addition, the mask layer 315 prevents a dopant from being introduced into the first conductive area 32 when the dopant is introduced into the undoped area 33 in order to form a second conductive area in the subsequent process.

The mask layer 315 may be formed of a material that includes no foreign substance, which serves as a dopant. That is, the mask layer 315 may be formed of any of various materials capable of preventing the introduction of the foreign substance. The mask layer 315 is a silicon carbide (SiC) film that effectively blocks the introduction of a dopant, and has a thickness within a range from 100 nm to 200 nm.

The silicon carbide film is easily removed by laser ablation, and is easily removed using a dilute hydrofluoric acid (HF) solution because it is changed to an oxide in the subsequent step. This will be described below in detail with regard to the corresponding step.

The mask layer 315 is only formed over the semiconductor layer 302, and is not formed on the textured front surface of the semiconductor substrate 10. Thus, the mask layer 315 may be formed via any of various methods that enable cross-sectional deposition. In an example form, the mask layer 315 may be formed via a PECVD method that enables cross-sectional deposition.

The semiconductor substrate 10, provided with the mask layer 315, is dipped into an etchant, which is $KOH:H_2O_2=2$ (L):0.6(L), for 15 minutes to 30 minutes, so that the first semiconductor layer 301 and the first protective-film layer 201 thereunder are completely removed, and the exposed front surface of the semiconductor substrate 10 is also etched, whereby the front surface of the semiconductor substrate 10 is textured.

Because the etchant used in operation is more strongly alkaline than the etchant used in the previous step, the surface of the semiconductor substrate 10 may be effectively textured. In FIG. 35F, in order to illustrate this fact, KOH+ is shown, unlike FIG. 35E.

Subsequently, an exposing area 315a is formed in the mask layer 315 so as to expose a portion of the undoped area 33. The exposing area corresponds to the second conductive area 34, and the mask layer 315 prevents the dopant from entering the first conductive area 32 and the barrier area 33 in the subsequent doping process of forming the second conductive area 34. FIG. 35G diagrammatically illustrates a mask layer patterning step.

In an example form, the exposing area 315a is formed by selectively irradiating the mask layer 315 with a laser so that a portion of the mask layer 315 is subjected to laser ablation.

The laser is a pulse-type laser, of which the pulse width is adjusted, and has an energy of 0.5 $J/cm^2$ to 2.5 $J/cm^2$, a frequency of 10 KHz to 100 KHz, a pulse width of 160 ns to 200 ns (nanoseconds), and a wavelength of 350 nm to 600 nm. The pulse-type laser meeting these conditions is the same as the laser used in the above-described first conductive area forming operation S104, but has a great difference only in terms of the pulse width. Thus, the laser facility used in the above first conductive area forming operation S104 may also be used in this step, which may reduce manufacturing costs and may simplify the process.

In this step, because the exposing area 315a is formed in the mask layer 315 using laser ablation, a laser, of which the pulse width is wider than that of the laser, which is used in the above-described operation S103, may be used.

When the mask layer 315 is patterned using the laser as described above, the exposing area 315a may be more accurately formed at a desired position, and the number of processes may be reduced. The barrier area 33 is located between the first conductive area 32 and the second conductive area 34, thereby preventing shunts between the first conductive area 32 and the second conductive area 34, which are of different conductive types.

Subsequently, in the second conductive area forming operation S104, the second conductive area 34 is formed by introducing a dopant into the undoped area 33 of the semiconductor layer, which is exposed through the exposing area 315a in the masking layer 315, on the back surface of the semiconductor substrate 10. At this time, the front-surface field area 130 may be formed on the front surface simultaneously with the formation of the second conductive area 34.

Figure 35H:
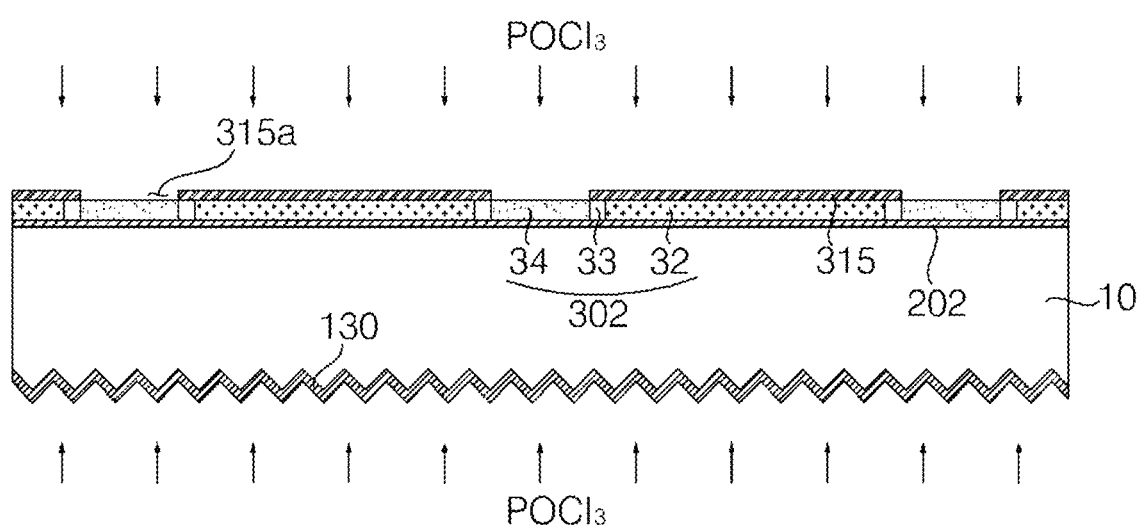
Figure 35I:
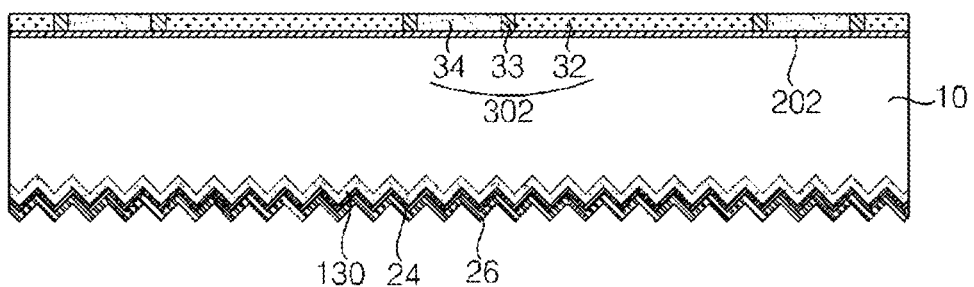
Figure 35J:
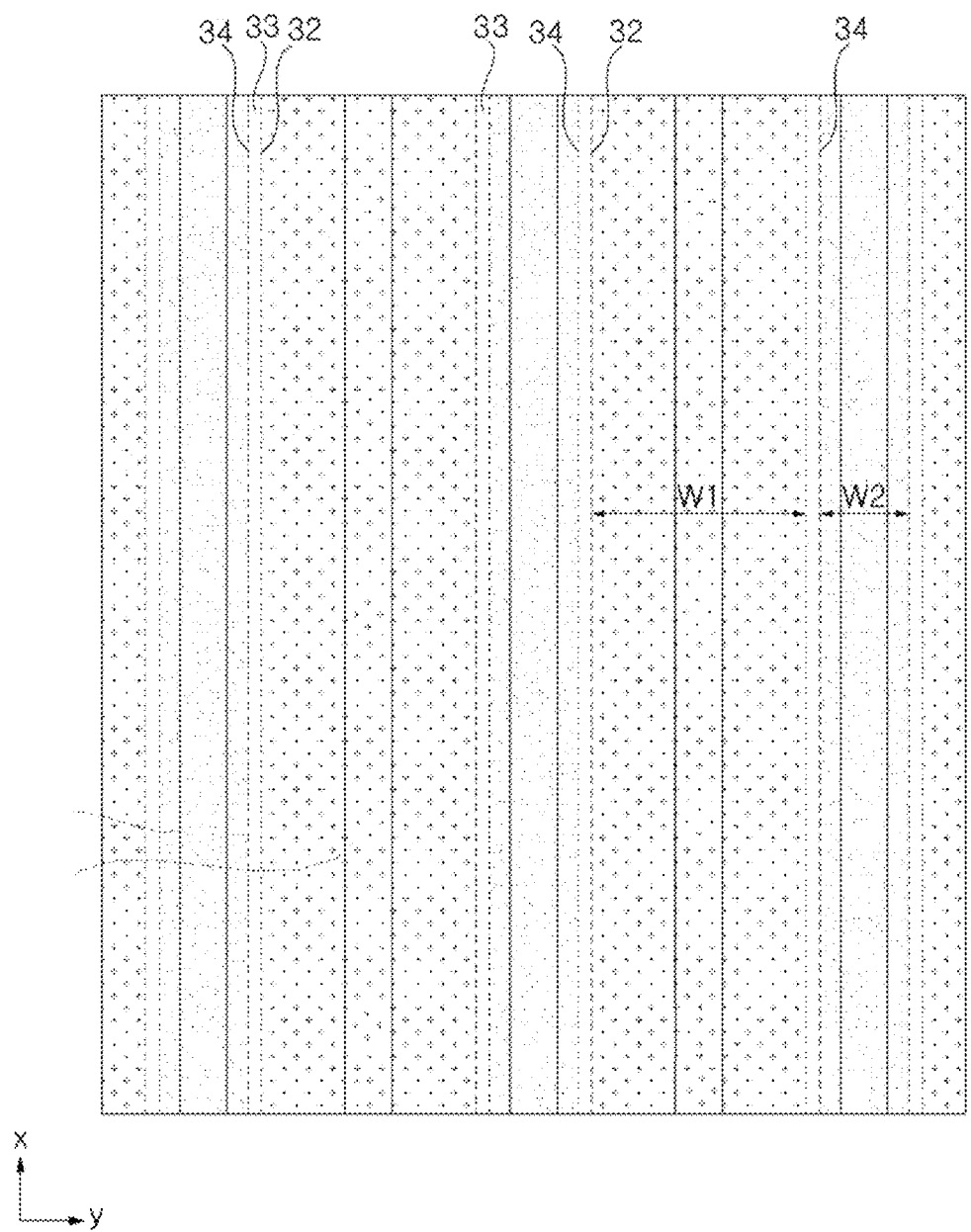

FIG. 35H diagrammatically illustrates this step.

The dopant is the first conductive dopant, which is the same as that used in the semiconductor substrate 10. When the semiconductor substrate 10 is an n-type, the first conductive dopant is an n-type dopant including a group-V element, such as phosphorus (P), arsenic (As), bismuth (Bi), or antimony (Sb). When the semiconductor substrate 10 is a p-type, the first conductive dopant is a p-type dopant including a group-III element, such as boron (B), aluminum (Al), gallium (Ga), or indium (In).

In this step, the second conductive area 34 and the front-surface field area 130 may be formed at the same time by thermally diffusing the first conductive dopant in a gas atmosphere including the first conductive dopant. Any of various gases including the first conductive dopant may be used as the gas atmosphere. In one example, when the first conductive dopant is an n-type, phosphoryl chloride ($POCl_3$) is used.

As such, the first conductive dopant thermally diffuses from the back surface of the semiconductor substrate 10 to the undoped area 33 through the exposing area 315a, whereby the second conductive area 34 is formed, and the first conductive area 32 is protected by the mask layer 315.

In addition, because the undoped area 33 between the first conductive area 32 and the second conductive area 34 is masked by the mask layer 315 while the dopant is introduced, no dopant is introduced into the undoped area 33, whereby the barrier area 33 is formed as an intrinsic semiconductor layer.

In an example form, the doping concentration of the second conductive area 34 is the same as that of the first conductive area 32.

In addition, the first conductive dopant, which is of the same conductive type as the dopant introduced into the semiconductor substrate 10, is introduced into the front surface of the semiconductor substrate 10, whereby the front-surface field area 130 is formed. The doping concentration of the front-surface field area 130 ranges from $1\times10^{17}/cm^3$ to $1\times10^{20}/cm^3$, which is lower than that of the second conductive area 34. The semiconductor substrate 10, on which the front-surface field area 130 has been formed, is a monocrystalline semiconductor layer, and the semiconductor layer 302, on which the second conductive area 34 has been formed, is a crystalline semiconductor layer. Thus, the semiconductor substrate 10 and the semiconductor layer 302 have different doping concentrations.

In another form, the second conductive area 34 and the front-surface field area 130 may be formed separately. In one example, while the second conductive area 34 is formed, the front surface of the semiconductor substrate 10 may be protected by a protective film. After the second conductive area 34 is formed, the protective film may be removed, and a second conductive dopant may be introduced only into the front surface of the semiconductor substrate 110 so as to sequentially form the front-surface field area 130.

Alternatively, when ion implantation is used, cross-sectional doping may be easily performed, and for example, the doping depth and the doping profile of the front-surface field area 130 may be easily controlled. Thus, a front-surface field area 130 having desired properties may be formed.

Meanwhile, in operation S104, when the second conductive area 34 and the front-surface field area 130 are formed via thermal diffusion using reaction gas (e.g. phosphoryl chloride ($POCl_3$)), an oxide, such as phosphor silicate glass (PSG), is formed on the surface of the second conductive area 34 and the surface of the front-surface field area 130 due to the presence of oxygen in the reaction gas. Therefore, in order to remove the oxide, the semiconductor substrate 10 is dipped into dilute hydrofluoric acid (DHF). In this process, the mask layer formed of a silicon carbide (SiC), which is not removed by an acid solution, is changed into a silicon oxide (SiOx), and thus is easily removed by the dilute hydrofluoric acid (DHF).

Figure 35K:
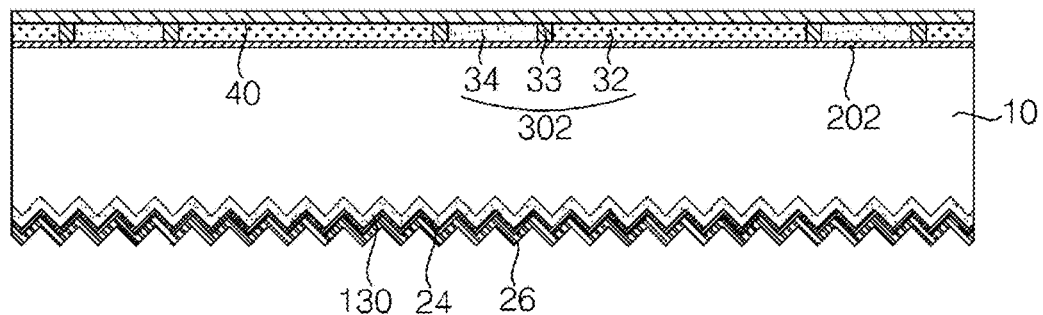
Figure 35L:
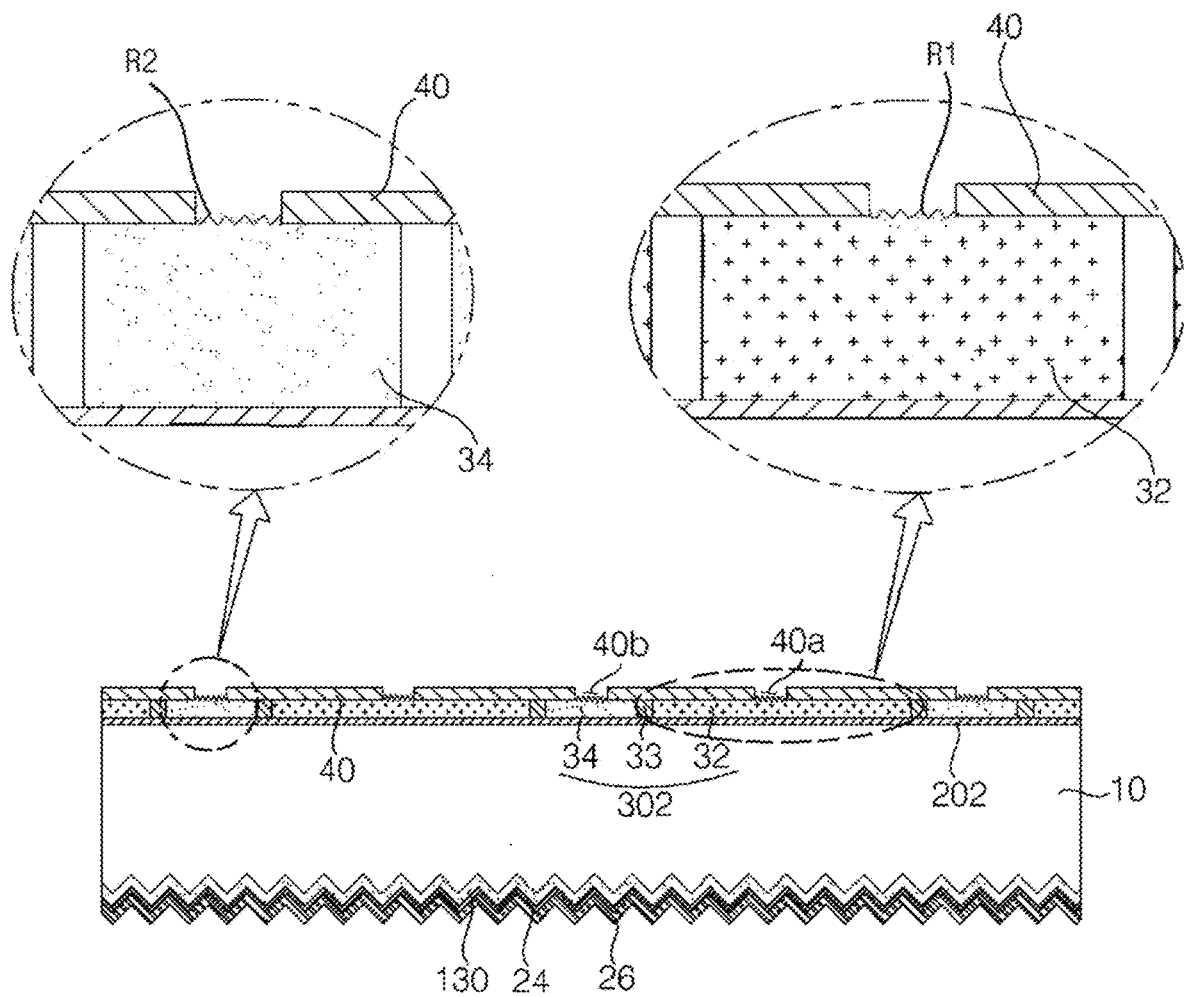
Figure 35M:
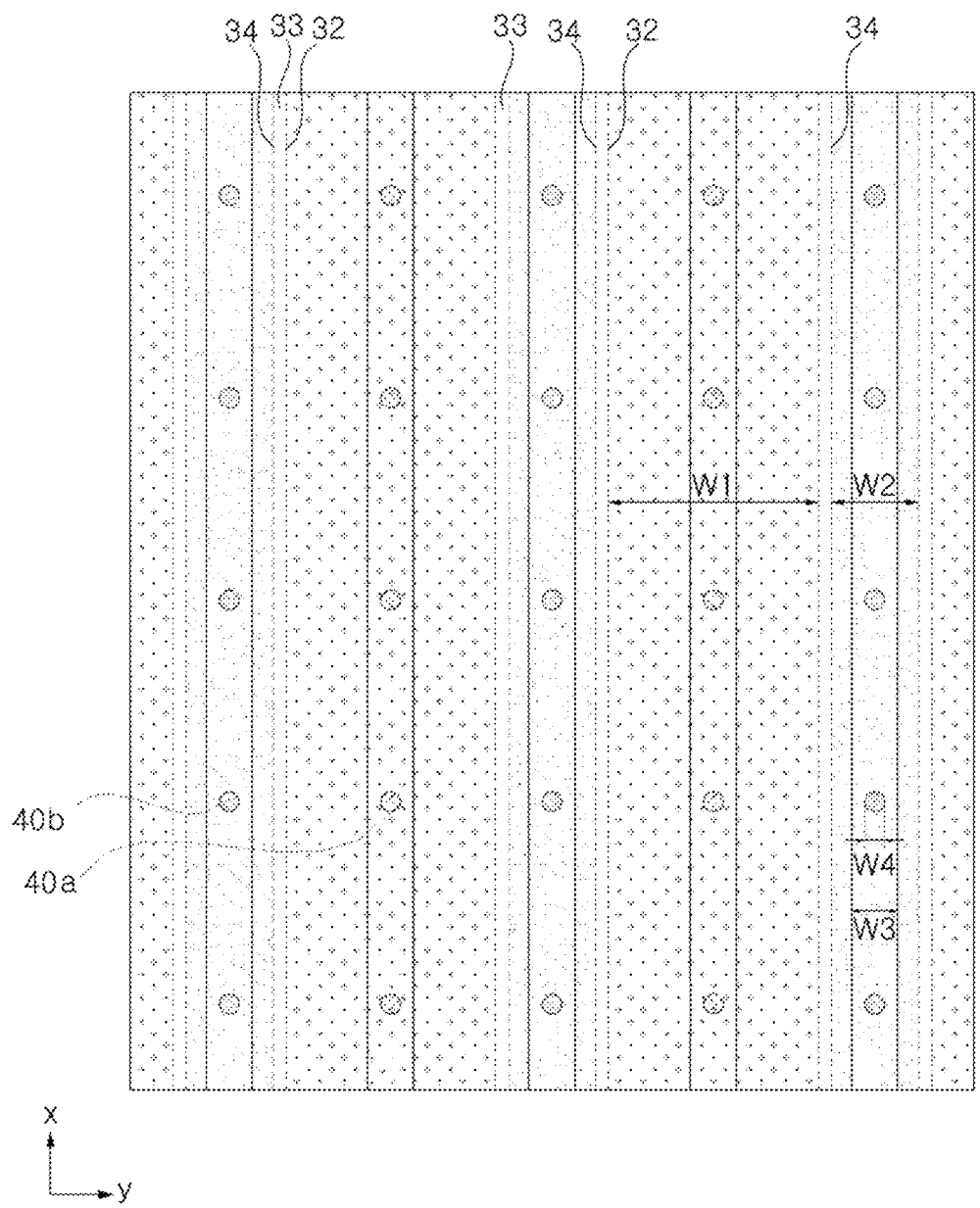
Figure 35N:
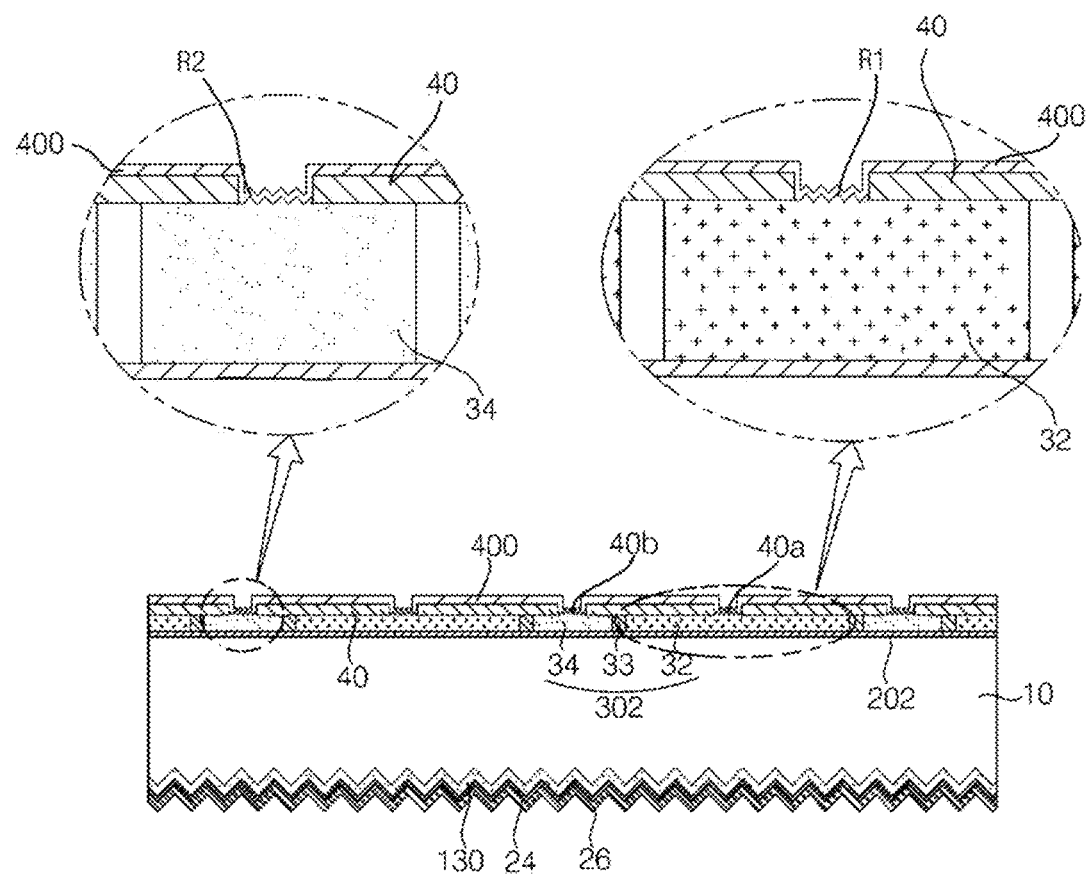
Figure 35O:
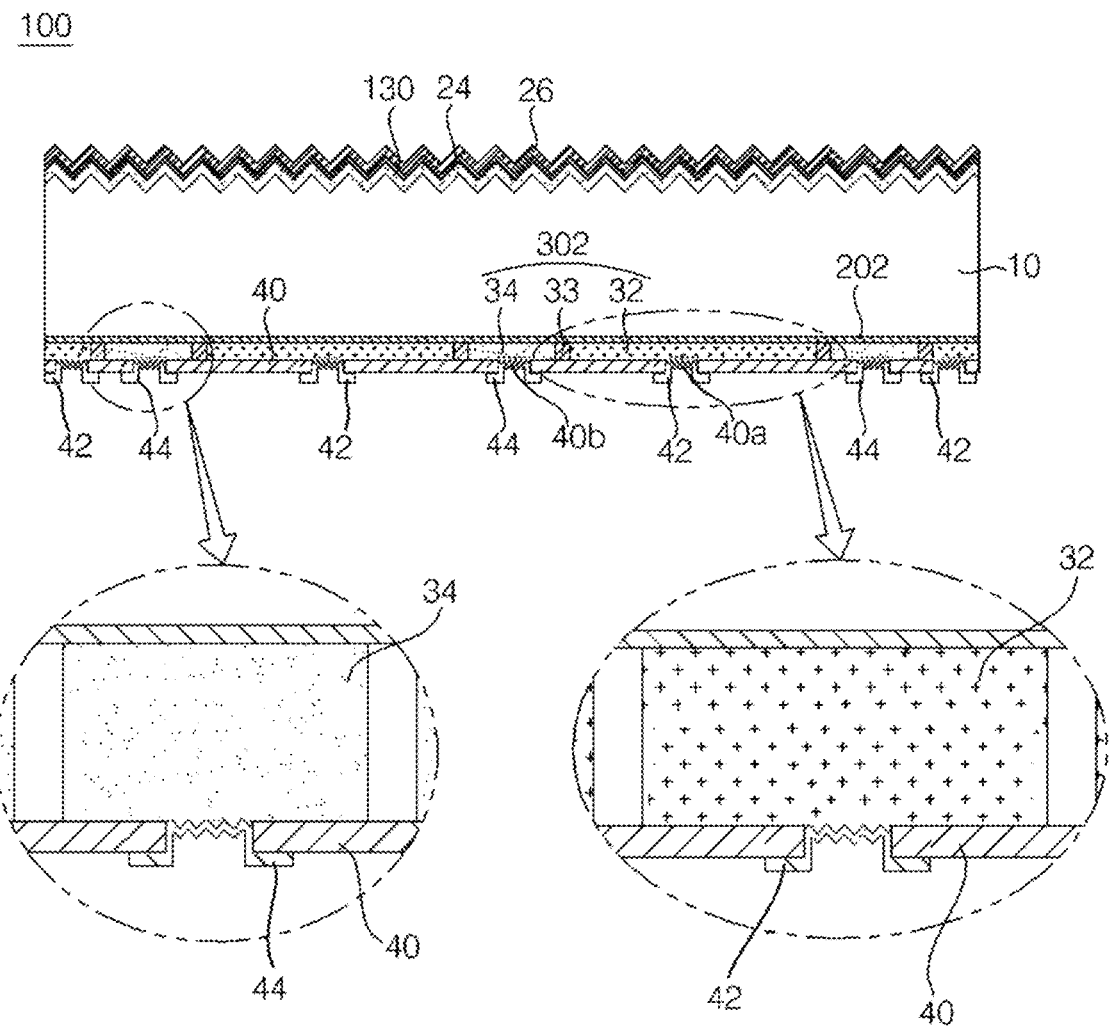

Subsequently, in the insulation film forming operation S105, insulation films are respectively formed on the front surface and the back surface of the semiconductor substrate 10. FIGS. 35I to 35K diagrammatically illustrate this step.

In an example form, the front insulation film 24 and the anti-reflection film 26, each of which is formed of an insulation material, are sequentially formed over the front-surface field area 130 on the front surface of the semiconductor substrate 10, and the back insulation film 40 formed of an insulation material is formed over the semiconductor layer 302 on the back surface of the semiconductor substrate 10.

The insulation material may be a thin film formed of a silicon oxide (SiOx), a silicon nitride (SiNx), a silicon oxide nitride (SiNxOy), or a silicon carbide (SiC).

The insulation films may be formed via any of various methods, such as, for example, vacuum deposition, chemical vapor deposition, spin coating, screen printing, or spray coating. In an example form, the insulation films may be formed via a PECVD method that enables cross-sectional deposition.

When the insulation film is formed via a PECVD method, even if the insulation film 24 and the anti-reflection film 26 are formed of different insulation materials, the insulation film 24 and the anti-reflection film 26 may be formed using different source gases within the same chamber via an in-situ process.

Similarly, when the insulation film 40 is formed over the second semiconductor layer 302 on the back surface of the semiconductor substrate 10, a PECVD method may be used to form the insulation film 40 on only the back surface. The process of forming the front insulation film 24 and the anti-reflection film 26 and the process of forming the insulation film 40 may be an in-situ process.

In this operation S105, the insulation films have been described as being first formed on the front surface of the semiconductor substrate 10, and then being formed to cover the back surface of the semiconductor substrate 10. As such, because the exposure of the first conductive area 32 and the second conductive area 34 to heat is minimized, deterioration in properties or damage may be prevented to the maximum extent.

Subsequently, in the contact hole forming operation S106, portions of the first conductive area 32 and the second conductive area 34 are exposed through the contact holes 40a and 40b. FIGS. 35L and 35M diagrammatically illustrate the contact hole forming operation S106.

The first contact hole 40a formed in the back insulation film 40 exposes a portion of the first conductive area 32 and the second contact hole 40b exposes a portion of the second conductive area 34. Each of the first contact hole 40a and the second contact hole 40b may take the form of a slit, which is elongated in the longitudinal direction of the first conductive area 32 or the second conductive area 34, or may form an arrangement of a plurality of circles, ovals or polygons, which are spaced apart from one another. In this instance, a stripped arrangement of the first contact hole 40a and the second contact hole 40b is formed on the first conductive area 32 and the second conductive area 34, which are alternately arranged. At this time, the exposed areas of the first and second conductive areas 32 and 34, in which the first and second contact holes 40a and 40b are formed, have first and second contact-hole surface roughnesses R1 and R2 respectively.

In an example form, the first contact hole 40a and the second contact hole 40b are formed via laser ablation.

A laser used in operation S106 may have a frequency of 400 KHz and a power of 0.5 watts to 2 watts so as to be suitable for the openings 40a and 40b having a width within a range from 15 μm to 30 μm, and also may have a pico-second (ps) pulse width in consideration of the fact that the width of the openings 40a and 40b ranges from 10 μm to 20 μm, in order to facilitate laser ablation.

The surfaces of the first and second conductive areas 32 and 34 provided with the contact holes 40a and 40b have marks, which distinguish the corresponding areas from the remaining area, formed thereon by the laser used in the contact hole forming step. That is, the surfaces of the first and second conductive areas 32 and 34 provided with the contact holes 40a and 40b undergoes variation in the crystalline structure thereof depending on the strength of the laser because the crystal grains in the surface of the semiconductor layer 302 are melted and re-crystallized, thereby having first and second contact-hole surface roughnesses R1 and R2, which include changed surface roughnesses.

In another form, the contact holes 40a and 40b may be formed via any of various methods, such as wet etching or dry etching. In particular, even when using etching paste, the areas of the semiconductor layer 302 in which the contact holes 40a and 40b are formed are changed in shape, thereby being formed with marks that distinguish the corresponding areas from the remaining area. For example, grooves may be formed in the substrate in the corresponding areas, or the corresponding areas may have the first and second contact-hole surface roughnesses R1 and R2, which are the same as those acquired via laser irradiation.

The marks of the contact holes are not formed through an insulation film removal process using a photoresist, and as illustrated in the enlarged circles of FIG. 35L, convex-concave portions having a predetermined size are formed on the contact-hole areas of the first conductive area 32 and the second conductive area 34. The convex-concave portions typically have a height or width of 500 nm or less.

Subsequently, in the electrode forming operation S107, the first electrode 42, which is in contact with the first conductive area 32, and the second electrode 44, which is in contact with the second conductive area 34, are formed respectively on the back surface of the semiconductor substrate 10. FIGS. 35N to 35O diagrammatically illustrate the electrode forming operation S107.

The electrode layer 400 is formed throughout the first conductive area 32, the second conductive area 34, and the back insulation film 40 through the first contact hole 40a and the second contact hole 40b. Because the electrode layer 400 needs to be brought into contact with the first conductive area 32 through the first contact hole 40a, and also needs to be brought into contact with the second conductive area 34 through the second contact hole 40b, the electrode layer 400 is formed of a conductive material.

In one example, the electrode layer 400 may be formed using a multilayered metal via a sputtering method.

Meanwhile, in the present embodiment, the thickness of the electrode layer 400 may be 1 µm or less. When the thickness of the electrode layer 400 is above 850 nm, the transfer of the first and second contact-hole surface roughnesses R1 and R2 to the surfaces of the first and second electrodes 41 and 42 may be difficult. Because screen printing using paste or electroplating has conventionally been used in the process of filling the contact holes with an electrode having a thickness of tens of micrometers, the profile of the contact hole does not remain on the surface of the electrode.

In the present embodiment, the electrode layer 400 may have a multilayered structure. For example, the electrode layer 400 may have a four layered structure including a first titanium layer, an aluminum layer, a second titanium layer, and a nickel-vanadium alloy layer. The first titanium layer has a thickness of 50 nm or less, the aluminum layer has a thickness of 550 nm or less, the second titanium layer has a thickness of 150 nm or less, and the nickel-vanadium alloy layer has a thickness of 250 nm or less. However, the present invention is not limited thereto, and various other metals may be used.

The electrode layer 400 is formed via deposition, such as, for example, an electron beam method or a spluttering method. In this instance, because the metal atoms from a target are deposited on the substrate surface, the profile of the contact hole is imprinted on the electrode surface. Because the first and second electrodes 42 and 44 formed in the contact holes 40a and 40b for electrode contact are formed to have a small thickness via sputtering, the surface roughness of the surfaces of the first and second conductive areas 32 and 34 provided with the contact holes 40a and 40b is transferred to the first and second electrodes 42 and 44, whereby the first and second electrodes 42 and 44 are provided with first and second convex-concave interfaces R1 and R2. When the surface roughness of the surface of the first and second conductive areas 32 and 34 is transferred to the first and second electrodes 42 and 44, the reflectiveness of the first and second electrodes 32 and 34 may be increased. Because the surface roughness is visible from the cell electrode side, an electrode patterning process may be performed at an accurate position using the profile of the contact hole imprinted on the electrode without requiring a separate alignment key in the subsequent patterning process.

Meanwhile, the electrode layer 400 may be formed via evaporation, which is capable of realizing excellent operation coverage. When using evaporation, the surface roughnesses of the first and second conductive areas 32 and 34 exposed through the contact holes 40a and 40b may be more effectively transferred to the first and second electrodes 42 and 44.

The electrode layer 400 is patterned so as to be brought into contact with each of the first conductive area 32 and the second conductive area 34 while separating the first conductive area 32 and the second conductive area 34 from each other. Various known patterning methods may be used. As described above, the profile of the contact hole imprinted on the electrode surface may be used for alignment during the separation process.

Next, a solar cell panel according to some embodiments of the present invention will be described with reference to FIGS. 36 and 37.

The solar cell panel according to the present embodiment may include the solar cell 100 according to the above-described embodiments. Thus, a repeated description may be omitted.

Figure 36:
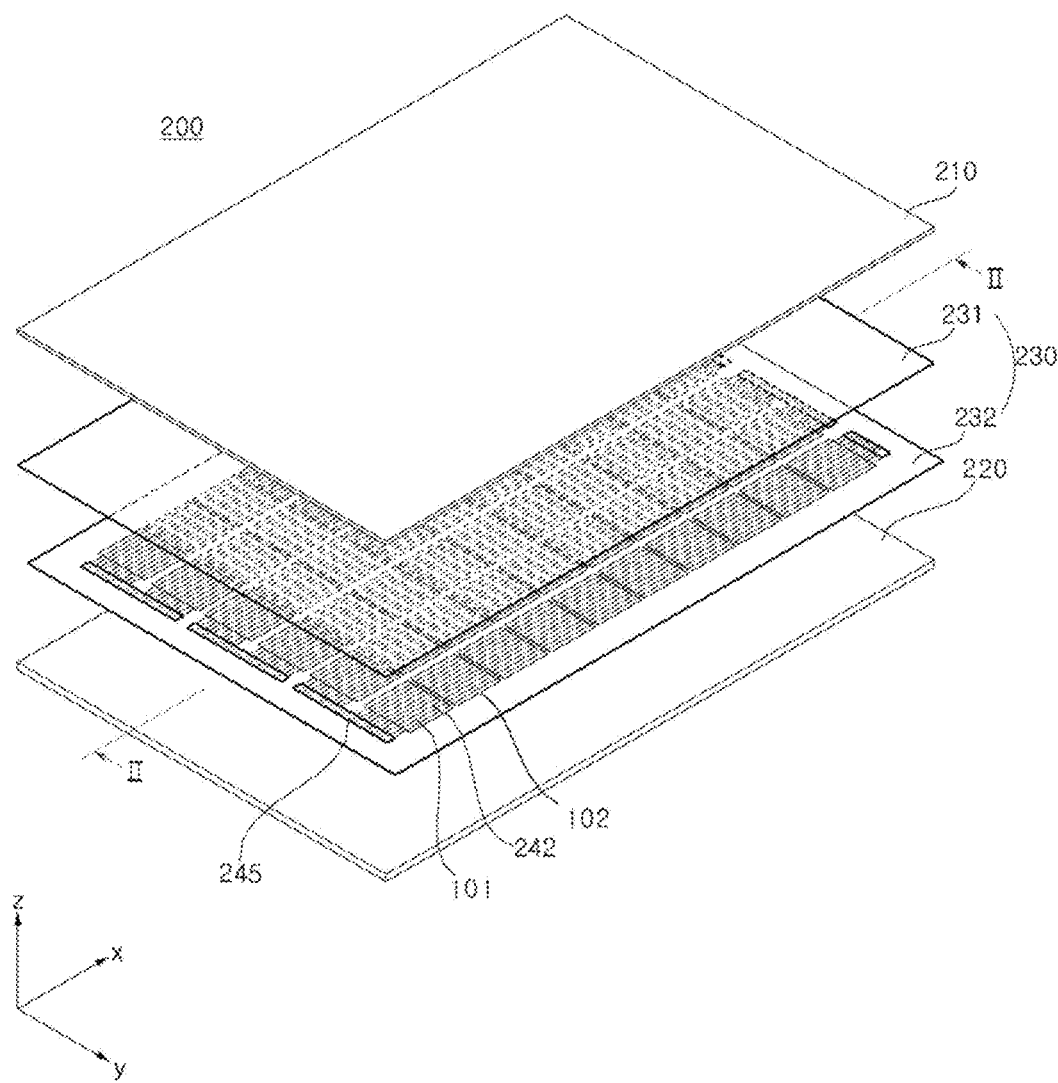
FIG. 36 is a perspective view illustrating a solar cell panel according to an embodiment of the present invention.
Figure 37:
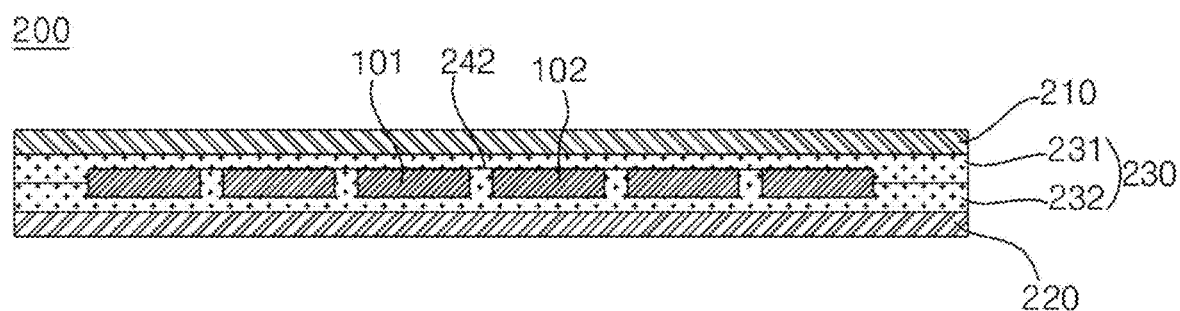
FIG. 37 is a cross-sectional view taken along line II-II of FIG. 36.

FIG. 36 is a perspective view illustrating a solar cell panel according to an embodiment of the present invention, and FIG. 37 is a cross-sectional view taken along line II-II of FIG. 36.

Referring to FIGS. 36 and 37, the solar cell panel 200 according to the present embodiment includes a plurality of solar cells 101 and 102, and interconnectors 242 for electrically interconnecting the solar cells 101 and 102. In addition, the solar cell panel 200 includes a sealing member 230 for surrounding and sealing the solar cells 101 and 102 and the interconnectors 242 for interconnecting the solar cells 101 and 102, a front substrate 210 disposed on the front surface of the solar cells 101 and 102 above the sealing member 230, and a back substrate 220 disposed on the back surface of the solar cells 101 and 102 above the sealing member 230. This will be described below in more detail.

First, the solar cells 101 and 102 may be substantially the same as the solar cell 100 according to the above-described embodiments. Thus, a repeated description is omitted. In addition, the solar cells 101 and 102 may be electrically interconnected in series and/or in parallel by the interconnectors 242. Specifically, the interconnectors 242 may electrically interconnect two neighboring solar cells 101 and 102 among the solar cells 101 and 102.

In one example, each interconnector 242 may include a core layer 142a, which is formed of a metal, and a solder layer, which is coated over the surface of the core layer at a small thickness and includes a solder material so as to enable soldering with the first and second electrodes 42 and 44 of FIG. 1. In one example, the core layer may include Ni, Cu, Ag or Al as a main material, and the solder layer may be formed of an alloy including at least one of tin, lead, silver, bismuth, and indium.

In the present embodiment, the solar cell includes the first and second electrodes 42 and 44, each of which has the surface roughness described above in the embodiment of FIG. 32. That is, each of the first and second electrodes 42 and 44 may include a first convex-concave portion at the interface thereof with the first or second conductive area 32 or 34, and the first convex-concave portion may be the same as the surface roughness. In addition, each of the first and second electrodes 42 and 44 may have a second convex-concave portion on the outermost surface thereof on the opposite side of the interface, the second convex-concave portion corresponding to the first convex-concave portion. As such, the interconnectors 242 are disposed on the first and second electrodes 42 and 44 each having the surface roughness. Thus, when the interconnectors 142 are brought into contact with the first and second electrodes 42 and 44 via soldering, the surface area of the first and second electrodes 42 and 44 is increased owing to the surface roughness, which may increase bonding between the interconnectors 242 and the first and second electrodes 42 and 44.

Meanwhile, the interconnectors 242 may be bonded to the electrodes of the solar cells 101 and 102 using a conductive adhesive, which is provided on the outermost surface of each of the electrodes 42 and 44, on which the second convex-concave portion is formed. In the same manner as the above description, in this instance, bonding between the interconnectors 242 and the first and second electrodes 42 and 44 may be increased by the surface roughnesses of the first and second electrodes 42 and 44.

Meanwhile, in a solar cell module according to the present embodiment, in order to interconnect the neighboring first and second solar cells 101 and 102, the interconnectors 242 may include a first conductive interconnector connected to the first electrode of the first solar cell 101, a second conductive interconnector connected to the second electrode of the second solar cell 102, and a third conductive interconnector for interconnecting the first conductive interconnector and the second conductive interconnector.

In this instance, the first conductive interconnector is electrically connected to the first electrode of the first solar cell 101 via a conductive adhesive layer and is insulated from the second electrode via an insulation layer. The second conductive interconnector is electrically connected to the second electrode of the second solar cell 102 via a conductive adhesive layer and is insulated from the first electrode via an insulation layer.

The first interconnector, the second interconnector, and the third interconnector may be integrated with each other, or may be successively connected to one another. In this instance, the solar cells 101 and 102 may have different arrangements.

The insulation layer or the conductive adhesive layer is formed between the conductive interconnector and the electrode. At this time, when the electrode surface is provided with a convex-concave portion, the insulation layer or the conductive adhesive layer may come into contact with the convex-concave portion of the electrode, which may increase bonding force, and consequently the properties of the module.

That is, the interconnectors may be bonded respectively to the first electrode and the second electrode formed on the back surface of the solar cells 101 and 102. In particular, when the conductive adhesive layer is used to constitute the above-described structure, the interconnectors need to be connected to all cell electrode. In this instance, bonding force may be increased, and the efficiency of the solar cell may be improved.

Bus ribbons 145 are interconnected by the interconnectors 242 so as to interconnect alternate ends of the interconnectors 242, which interconnect the solar cells 101 and 102 in a column (in other words, a solar cell string). The bus ribbons 145 may be located on the ends of the solar cell strings so as to cross the solar cell string. The bus ribbons 145 may interconnect the solar cell strings adjacent to each other, or may connect the solar cell string(s) to a junction box, which prevents the backflow of current. The material, shape, connection structure, and the like of the bus ribbons 145 may be altered in various ways, and the present invention is not limited as to them.

The sealing member 230 may include a first sealing member 231 disposed on the front surface of the solar cells 101 and 102, and a second sealing member 232 disposed on the back surface of the solar cells 101 and 102. The first sealing member 231 and the second sealing member 232 prevent the introduction of moisture and oxygen, which may have a negative effect on the solar cells 101 and 102, and realize a chemical bond between respective elements of the solar cell panel 200. The solar cell panel 200 may be integrated through a lamination process that applies heat and/or pressure in the state in which the front substrate 210, the first sealing member 231, the solar cells 101 and 102, the second sealing material 232, and the back substrate 220 are sequentially stacked one above another.

The first and second sealing members 231 and 232 may be formed of ethylene vinyl acetate (EVA) copolymer resin, polyvinyl butyral, silicone resin, ester-based resin, or olefin-based resin. However, the present invention is not limited thereto. Thus, the first and second sealing members 231 and 232 may be formed using any of various materials via any of various methods, rather than lamination. At this time, the first and second sealing members 231 and 232 may have light transmittance, thus allowing light introduced through the front substrate 210 or light reflected by the front substrate 210 to reach the solar cells 101 and 102.

The front substrate 210 is disposed on the first sealing member 231 and configures the front surface of the solar cell panel 200. The front substrate 210 may be formed of a light-transmitting material capable of transmitting light and may have a strength required to protect the solar cells 101 and 102 from external shocks, etc. In one example, the front substrate 210 may be configured as a glass substrate. At this time, the front substrate 210 may be configured as a tempered glass substrate in order to increase the strength thereof. Various other alterations of the front substrate 210 are possible. For example, the front substrate 210 may additionally include various materials capable of improving various properties. Alternatively, the front substrate 210 may be a sheet or a film formed of, for example, a resin. That is, the present invention is not limited as to the material of the front substrate 210, and the front substrate 210 may be formed of any of various materials.

The back substrate 220 may be disposed on the second sealing material 232 and may serve as a layer that is disposed on the back surface of the solar cells 101 and 102 so as to protect the solar cells 101 and 102. The back substrate 220 may have waterproofing, insulation, and ultraviolet blocking functions.

The back substrate 220 may have a strength required to protect the solar cells 101 and 102 from external shocks, etc., and may transmit or reflect light depending on the structure of the solar cell panel 200. In one example, in the structure of introducing light through the back substrate 220, the back substrate 220 may be formed of a light-transmitting material. In the structure of reflecting light from the back substrate 220, the back substrate 220 may be formed of a light-reflecting material, or a material that does not transmit light. In one example, the back substrate 220 may be configured as a glass substrate, or may be configured as a film or sheet. For example, the back substrate 220 may be of a Tedlar/PET/Tedlar (TPT) type, or may be formed of a polyvinylidene fluoride (PVDF) resin formed on at least one surface of polyethylene terephthalate (PET). Polyvinylidene is a polymer having the structure of $(CH_2CF_2)n$, which is a double fluorine molecular structure, and thus has excellent mechanical, weather-proofing, and ultraviolet-resistant properties. The present invention is not limited as to the material of the back substrate 220.

As is apparent from the above description, according to an embodiment of the present invention, even if a foreign substance thermally diffuses into a semiconductor layer by laser irradiation, damage to a thin protective-film layer formed below the semiconductor layer may be prevented.

In addition, in an embodiment of the present invention, a semiconductor layer, which forms an emitter and a back-surface field (BSF), is re-crystallized when it is irradiated with a laser. As such, each of the emitter and the BSF may include a second crystalline area having improved crystallinity, which may increase the efficiency of a solar cell.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:

1. A solar cell comprising:
    a semiconductor substrate;
    a protective-film layer formed on a surface of the semiconductor substrate;
    a polycrystalline semiconductor layer formed over the protective-film layer and having a first conductive area;
    an insulation layer formed on the polycrystalline semiconductor layer; and
    a first electrode connected to the first conductive area and penetrating through the insulation layer;
    wherein the first conductive area includes:
        a first polycrystalline area having a first conductive type dopant and directly disposed on the protective-film, wherein the first polycrystalline area has a first grain size;
        a second polycrystalline area having the first conductive type dopant and disposed on the first polycrystalline area, wherein the second polycrystalline area has a second grain size that is greater than the first grain size; and
        a third polycrystalline area having the first conductive type dopant and disposed between the second polycrystalline area and the first electrode and is locally formed at a portion where the first electrode is disposed, wherein the third polycrystalline area has a third grain size that is lesser than the first and second grain sizes, and
    wherein the third polycrystalline area includes a surface convex-concave portion being in direct contact with the first electrode.

2. The solar cell according to claim 1, wherein the polycrystalline semiconductor layer has a second conductive area, and
    wherein the second conductive area includes a fourth polycrystalline area, and the second polycrystalline area of the first conductive area and the fourth polycrystalline area of the second conductive area have different depths in the polycrystalline semiconductor layer.

3. The solar cell according to claim 2, wherein the depth of the second polycrystalline area is less than the depth of the fourth polycrystalline area.

4. The solar cell according to claim 1, wherein the third polycrystalline area is formed via re-crystallization of an interface between the second polycrystalline area and the first electrode.

5. The solar cell according to claim 1, wherein the first electrode has a multilayered structure including two or more layers, and includes an electrode convex-concave portion formed on a surface thereof that comes into contact with the third polycrystalline area so as to correspond to the surface convex-concave portion of the third polycrystalline area.

6. The solar cell according to claim 1, wherein the polycrystalline semiconductor layer has a second conductive area, and
    wherein a second electrode connected to the second conductive area is further provided, and
    wherein the insulation layer includes a first opening for allowing the first electrode and the first conductive area to be electrically connected to each other, and a second opening for allowing the second electrode and the second conductive area to be electrically connected to each other.

7. The solar cell according to claim 6, wherein each of the first electrode and the second electrode has a protrusion protruding into the first opening and the second opening, respectively.

8. The solar cell according to claim 6, wherein a size of the third polycrystalline area matches a size of the first opening.

9. The solar cell according to claim 1, wherein the polycrystalline semiconductor layer has a second conductive area, and
    wherein the first conductive area is an emitter, and the second conductive area is a back-surface field area.

10. The solar cell according to claim 1, wherein the second polycrystalline area has a greater cross-sectional area than the first polycrystalline area in the first conductive area.

11. The solar cell according to claim 1, wherein the polycrystalline semiconductor layer has a second conductive area, and wherein the first conductive area and the second conductive area have different thicknesses.

12. The solar cell according to claim 1, wherein the polycrystalline semiconductor layer has a second conductive area, and a second electrode connected to the second conductive area penetrating through the insulation layer.

13. The solar cell according to claim 12, wherein the second conductive area includes:
   a fourth polycrystalline area disposed on the protective-film and having the first grain size;
   a fifth polycrystalline area disposed on the fourth polycrystalline area and having the second grain size that is greater than the first grain size; and
   a sixth polycrystalline area disposed between the fifth polycrystalline area and the second electrode and having the third grain size that is lesser than the first and second grain sizes.

14. The solar cell according to claim 12, further comprising a barrier area provided between the first conductive area and the second conductive area.

15. The solar cell according to claim 14, wherein the barrier area is formed of an undoped polycrystalline semiconductor layer.

16. The solar cell according to claim 14, wherein the barrier area has the first grain size.

17. The solar cell according to claim 1, wherein the second polycrystalline area directly contacts the insulation layer.

* * * * *